(12) United States Patent
Yamazaki

(10) Patent No.: US 9,214,632 B2
(45) Date of Patent: Dec. 15, 2015

(54) MANUFACTURING APPARATUS AND MANUFACTURING METHOD OF LIGHTING DEVICE

(75) Inventor: Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 744 days.

(21) Appl. No.: 12/721,110

(22) Filed: Mar. 10, 2010

(65) Prior Publication Data

US 2010/0236691 A1 Sep. 23, 2010

(30) Foreign Application Priority Data

Mar. 18, 2009 (JP) .................................. 2009-067048

(51) Int. Cl.
*B44F 1/00* (2006.01)
*C09K 11/00* (2006.01)
(Continued)

(52) U.S. Cl.
CPC .............. *H01L 51/001* (2013.01); *C23C 14/12* (2013.01); *C23C 14/228* (2013.01);
(Continued)

(58) Field of Classification Search
CPC ..... H01L 51/56; H01L 27/32; H01L 27/3206; H01L 27/3211; H05B 33/10; C23C 16/44; C23C 16/458; C23C 16/4582; C23C 16/4583; C23C 16/4584; C23C 14/12; C23C 14/24; C23C 14/243; C23C 14/50; C23C 14/505; B05D 1/60; B05D 3/0493; B29C 65/02; B29C 65/7841; B29C 65/7844; B29C 65/7879; B29C 66/00145; B29C 66/452
USPC .......... 156/60, 67, 150, 278, 285, 286, 307.1, 156/307.3, 307.7, 308.2, 309.6, 390; 427/58, 64, 66, 69, 70, 96.1, 96.2, 427/96.6, 96.8, 108, 109, 123, 124, 248.1, 427/250, 255.11, 255.14, 255.15, 255.18, 427/255.19, 255.6, 255.7, 294; 445/46, 53, 445/58, 73

See application file for complete search history.

(56) References Cited

U.S. PATENT DOCUMENTS 5,965,981 A 10/1999 Inoguchi et al.
6,158,868 A * 12/2000 Chien .............................. 362/84
(Continued)

FOREIGN PATENT DOCUMENTS

CN 001369573 A 9/2002
CN 001498049 A 5/2004
(Continued)

OTHER PUBLICATIONS

Search Report re European application No. EP 10155769.2, dated Mar. 29, 2012.
(Continued)

*Primary Examiner* — Philip Tucker
*Assistant Examiner* — Brian R Slawski
(74) *Attorney, Agent, or Firm* — Husch Blackwell LLP

(57) ABSTRACT

A manufacturing apparatus of a lighting device, including a vacuum chamber, an exhaust system by which the vacuum chamber is set to a reduced-pressure state, and a transfer chamber from which a substrate is transferred to the vacuum chamber is provided. The vacuum chamber of the manufacturing apparatus includes a plurality of deposition chambers in which a first electrode, a first light-emitting unit including at least a light-emitting layer, an intermediate layer, a second light-emitting unit including at least a light-emitting layer, a second electrode, a sealing film are formed, and a substrate transfer means by which the substrate is sequentially transferred to the deposition chambers.

10 Claims, 27 Drawing Sheets

(51) Int. Cl.
| | |
|---|---|
| H01J 9/227 | (2006.01) |
| B28B 19/00 | (2006.01) |
| E04D 15/06 | (2006.01) |
| B05D 5/06 | (2006.01) |
| B05D 5/12 | (2006.01) |
| C23C 16/00 | (2006.01) |
| B05D 3/00 | (2006.01) |
| H01J 9/00 | (2006.01) |
| H01J 9/38 | (2006.01) |
| H01J 9/46 | (2006.01) |
| H01J 9/48 | (2006.01) |
| H01L 51/00 | (2006.01) |
| C23C 14/12 | (2006.01) |
| C23C 14/22 | (2006.01) |
| C23C 14/24 | (2006.01) |
| C23C 14/56 | (2006.01) |
| H01L 51/56 | (2006.01) |
| B29C 65/78 | (2006.01) |
| B29C 65/00 | (2006.01) |
| H01L 51/50 | (2006.01) |

(52) U.S. Cl.
CPC .......... *C23C 14/246* (2013.01); *C23C 14/566* (2013.01); *C23C 14/568* (2013.01); *H01L 51/56* (2013.01); *B29C 65/7844* (2013.01); *B29C 65/7879* (2013.01); *B29C 66/00145* (2013.01); *B29C 66/452* (2013.01); *H01L 51/5036* (2013.01)

(56) References Cited

U.S. PATENT DOCUMENTS

| | | | |
|---|---|---|---|
| 6,280,809 B1* | 8/2001 | Wang et al. | 428/64.1 |
| 6,664,137 B2 | 12/2003 | Weaver | |
| 6,776,847 B2 | 8/2004 | Yamazaki et al. | |
| 6,776,880 B1 | 8/2004 | Yamazaki | |
| 6,781,746 B2 | 8/2004 | Yamazaki et al. | |
| 6,940,223 B2 | 9/2005 | Yamazaki | |
| 7,271,537 B2 | 9/2007 | Matsuda et al. | |
| 7,316,983 B2 | 1/2008 | Yamazaki et al. | |
| 7,378,133 B2 | 5/2008 | Yamazaki et al. | |
| 7,517,551 B2 | 4/2009 | Arai | |
| 7,629,025 B2 | 12/2009 | Yamazaki et al. | |
| 7,763,320 B2 | 7/2010 | Yamazaki et al. | |
| 7,943,443 B2 | 5/2011 | Yamazaki et al. | |
| 8,168,483 B2 | 5/2012 | Yamazaki et al. | |
| 8,354,786 B2 | 1/2013 | Yamazaki et al. | |
| 2002/0139303 A1 | 10/2002 | Yamazaki et al. | |
| 2002/0179013 A1 | 12/2002 | Kido et al. | |
| 2003/0203638 A1* | 10/2003 | Van Slyke | 438/709 |
| 2004/0031442 A1 | 2/2004 | Yamazaki et al. | |
| 2004/0062856 A1* | 4/2004 | Marcus et al. | 427/66 |
| 2004/0227460 A1 | 11/2004 | Liao et al. | |
| 2005/0005857 A1 | 1/2005 | Kido et al. | |
| 2005/0016462 A1* | 1/2005 | Yamazaki | 118/726 |
| 2005/0106322 A1* | 5/2005 | Yamazaki et al. | 427/294 |
| 2006/0087647 A1* | 4/2006 | Bagley et al. | 356/237.2 |
| 2006/0273713 A1* | 12/2006 | Mehta et al. | 313/504 |
| 2007/0001590 A1 | 1/2007 | Tateishi et al. | |
| 2007/0087130 A1 | 4/2007 | Arai | |
| 2008/0029023 A1 | 2/2008 | Ikeda et al. | |
| 2008/0057183 A1* | 3/2008 | Spindler et al. | 427/64 |
| 2008/0085652 A1 | 4/2008 | Winters | |
| 2008/0156267 A1 | 7/2008 | Kido et al. | |
| 2008/0251376 A1 | 10/2008 | Takizawa et al. | |
| 2009/0074952 A1 | 3/2009 | Yamazaki et al. | |
| 2009/0269486 A1 | 10/2009 | Yamazaki et al. | |
| 2009/0293808 A1 | 12/2009 | Yamazaki | |
| 2010/0237774 A1 | 9/2010 | Yamazaki et al. | |
| 2012/0214263 A1 | 8/2012 | Yamazaki et al. | |
| 2013/0119364 A1 | 5/2013 | Yamazaki et al. | |

FOREIGN PATENT DOCUMENTS

| | | | | |
|---|---|---|---|---|
| CN | 001575349 A | 2/2005 | | |
| CN | 001848447 A | 10/2006 | | |
| EP | 1 319 732 A1 | 6/2003 | | |
| EP | 1 457 582 A1 | 9/2004 | | |
| JP | 04-120270 A | 4/1992 | | |
| JP | 04-120271 A | 4/1992 | | |
| JP | 2000-313959 | 11/2000 | | |
| JP | 2001-102170 | 4/2001 | | |
| JP | 2002-256432 A | 9/2002 | | |
| JP | 2002256432 A * | 9/2002 | | C23C 14/56 |
| JP | 2002-302757 A | 10/2002 | | |
| JP | 2003-129231 A | 5/2003 | | |
| JP | 2003-231963 A | 8/2003 | | |
| JP | 2003-293121 A | 10/2003 | | |
| JP | 2003-313654 A | 11/2003 | | |
| JP | 2003-338366 A | 11/2003 | | |
| JP | 2005-325428 | 11/2005 | | |
| JP | 2005-325433 | 11/2005 | | |
| JP | 2006-324016 A | 11/2006 | | |
| JP | 2007-43080 A | 2/2007 | | |
| JP | 2007-63590 | 3/2007 | | |
| JP | 2007-107047 A | 4/2007 | | |
| JP | 2007-173424 | 7/2007 | | |
| JP | 2008-218306 A | 9/2008 | | |
| WO | WO 03043067 A1 * | 5/2003 | | H01L 21/20 |

OTHER PUBLICATIONS

Chinese Office Action re Application No. CN 201010145558.0, dated Jun. 3, 2014.

Chinese Office Action re Application No. CN 201010145558.0, dated Dec. 22, 2014.

* cited by examiner

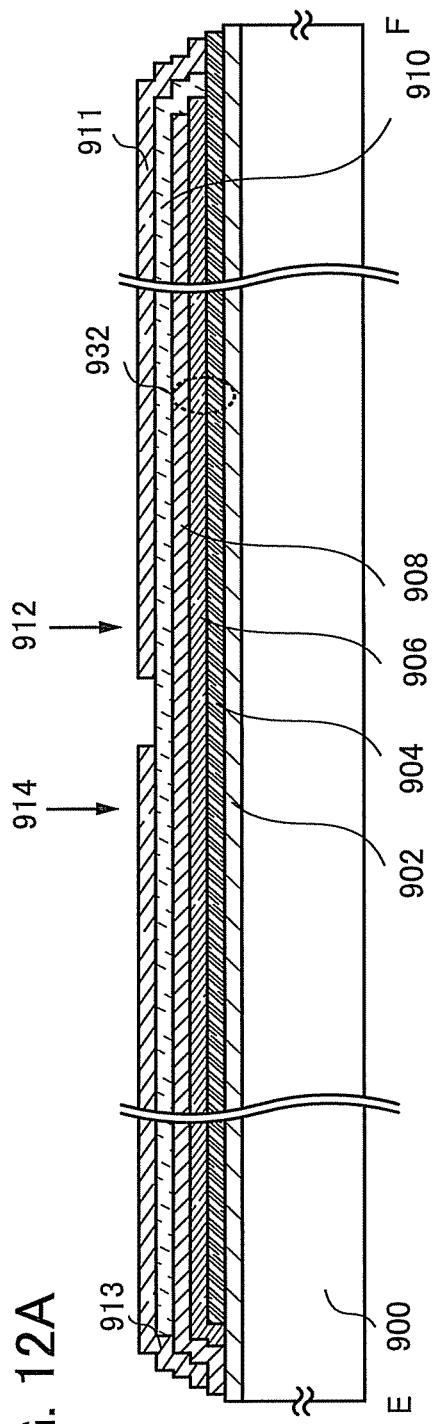
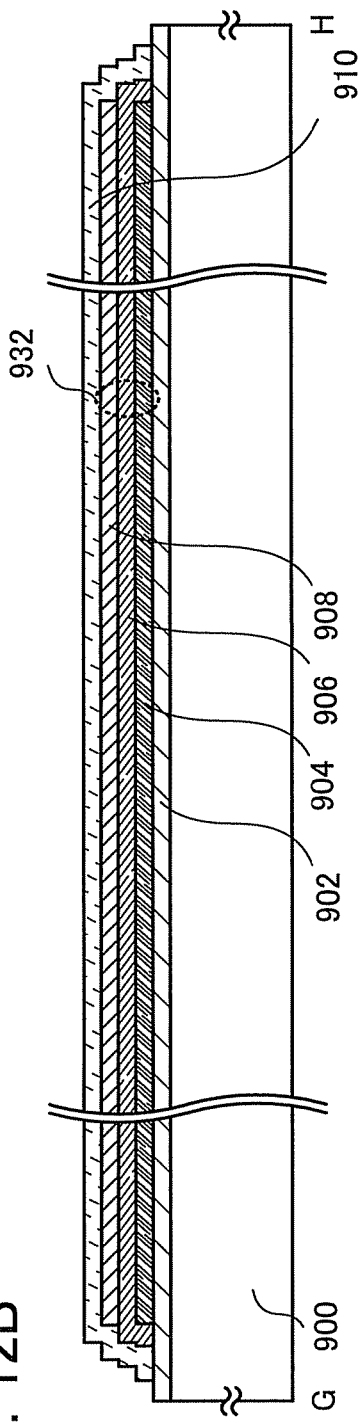
FIG. 12A
FIG. 12B

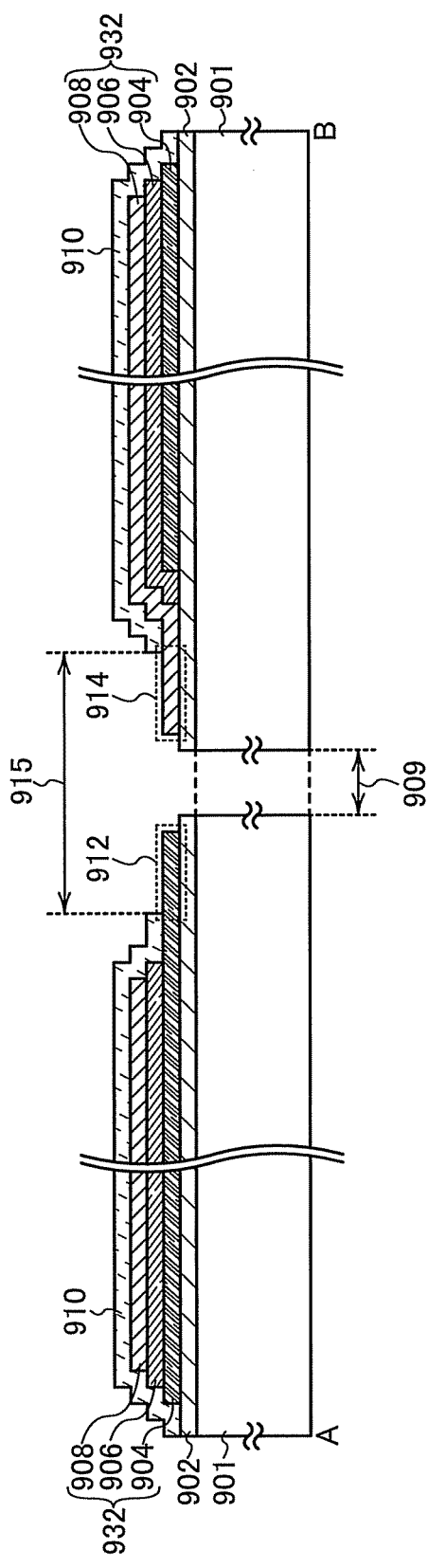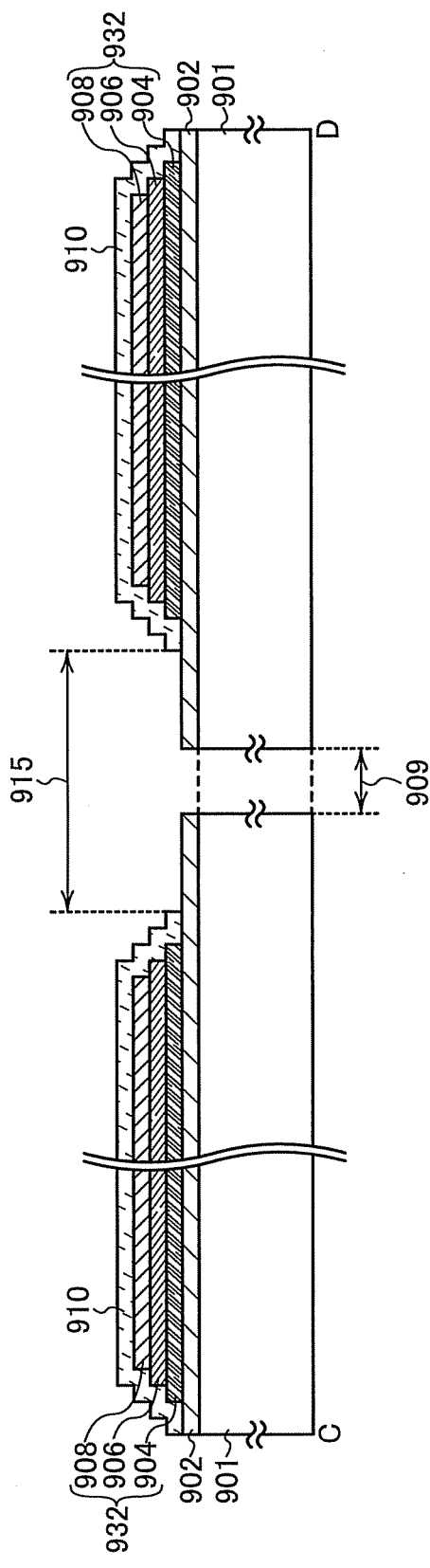

MANUFACTURING APPARATUS AND MANUFACTURING METHOD OF LIGHTING DEVICE

BACKGROUND OF THE INVENTION

1. Field of the Invention

The present invention relates to a manufacturing apparatus of a lighting device, and particularly relates to a manufacturing apparatus provided with a deposition chamber which is used for formation of a light-emitting element, and a manufacturing method in which the manufacturing apparatus is used.

2. Description of the Related Art

In recent years, the development of elements in which thin films containing a compound that exhibits electroluminescence (EL) are used as light-emitting layers has advanced, and light-emitting elements using a variety of compounds have been proposed. These light-emitting elements cause a light emission phenomenon called electroluminescence (EL), in which holes and electrons are recombined in a light-emitting layer provided between an electrode (anode) for injecting holes and an electrode (cathode) for injecting electrons.

A light-emitting element utilizing EL light emission is expected to be applied mainly to a display and a lighting device. When application of a lighting device is considered, as a conventional lighting device, a filament lamp has a point light source and a fluorescent lamp has a linear light source. On the other hand, a light-emitting element can provide a surface light emission; therefore, it is thought that a lighting device with a nonconventional shape, such as sheet-like lighting device, can be manufactured. In addition, light which is closer to natural light can be obtained easily since the light-emitting element has a surface light source.

A light-emitting layer (particularly a light-emitting layer including an organic compound) of these light-emitting elements is extremely vulnerable to oxygen and moisture and easily deteriorates. Therefore, a technique by which after formation of an anode (or a cathode), a process of forming a light-emitting layer or the like, forming a cathode (or an anode), and sealing (sealing a light-emitting element closely) is consecutively performed without exposure to the atmosphere is required. With a conventional manufacturing apparatus, a light-emitting element is provided in such a manner that deposition chambers and sealing chambers are multi-chambered (see Patent Document 1, for example).

In the case where a light-emitting element utilizing EL light emission is used for a lighting device, the size of the element is equivalent to the size for emitting light as a lighting device, so that, as compared to a light-emitting element utilizing EL light emission used for a display, a larger area is required while high definition is not required. Accordingly, in order that a lighting device utilizing EL light emission comes on the market, mass production and cost reduction are desired, and it is necessary to further improve productivity of a manufacturing apparatus.

REFERENCE

[Patent Document 1] Japanese Published Patent Application No. 2001-102170

SUMMARY OF THE INVENTION

In view of the aforementioned problems, it is an object of one embodiment of the present invention to provide a manufacturing apparatus which can manufacture a lighting device utilizing EL light emission with high throughput.

A manufacturing apparatus of one embodiment of the present invention includes a vacuum chamber, an exhaust system by which the vacuum chamber is set to a reduced-pressure state or a high vacuum state, and a transfer chamber from which a substrate is transferred to the vacuum chamber. Further, the vacuum chamber includes a deposition chamber in which a first electrode is formed over the substrate transferred from the transfer chamber, a deposition chamber in which a first light-emitting unit including at least a light-emitting layer is formed over the first electrode, a deposition chamber in which an intermediate layer is formed over the first light-emitting unit, a deposition chamber in which a second light-emitting unit including at least a light-emitting layer is formed over the intermediate layer, a deposition chamber in which a second electrode is formed over the second light-emitting unit, a deposition chamber in which a sealing film is formed over the substrate provided with the second electrode, and a substrate transfer means by which the substrate is sequentially transferred to each deposition chamber.

A manufacturing apparatus of another embodiment of the present invention includes a vacuum chamber, an exhaust system by which the vacuum chamber is set to a reduced-pressure state or a high vacuum state, and a transfer chamber from which a substrate is transferred to the vacuum chamber. Further, the vacuum chamber includes a deposition chamber in which a first electrode is formed over the substrate transferred from the transfer chamber, a deposition chamber in which a first light-emitting unit including at least a light-emitting layer is formed over the first electrode, a deposition chamber in which an intermediate layer is formed over the first light-emitting unit, a deposition chamber in which a second light-emitting unit including at least a light-emitting layer is formed over the intermediate layer, a deposition chamber in which a second electrode is formed over the second light-emitting unit, a sealing chamber in which the substrate provided with the second electrode is sealed with a sealing member, and a substrate transfer means by which the substrate is sequentially transferred to each deposition chamber and the sealing chamber.

A manufacturing apparatus of another embodiment of the present invention includes a vacuum chamber, an exhaust system by which the vacuum chamber is set to a reduced-pressure state or a high vacuum state, a transfer chamber from which a substrate is transferred to the vacuum chamber, and a sealing chamber which is connected to the vacuum chamber through a gate valve. Further, the vacuum chamber includes a deposition chamber in which a first electrode is formed over the substrate transferred from the transfer chamber, a deposition chamber in which a first light-emitting unit including at least a light-emitting layer is formed over the first electrode, a deposition chamber in which an intermediate layer is formed over the first light-emitting unit, a deposition chamber in which a second light-emitting unit including at least a light-emitting layer is formed over the intermediate layer, a deposition chamber in which a second electrode is formed over the second light-emitting unit, and a substrate transfer means by which the substrate is sequentially transferred to the deposition chambers, and in the sealing chamber, the substrate which is transferred from the vacuum chamber is sealed with a sealing member.

Another embodiment of the present invention is a method for manufacturing a lighting device, including the steps of transferring a substrate to a vacuum chamber, forming a light-emitting element including a first electrode, a first light-emitting unit, an intermediate layer, a second light-emitting unit, and a second electrode over the substrate in a plurality of deposition chambers which is placed in the vacuum chamber and has the same degree of vacuum, transferring the substrate provided with the light-emitting element to a sealing chamber which is placed in the vacuum chamber and has the same degree of vacuum as the plurality of the deposition chambers, and sealing the substrate provided with the light-emitting element, which is transferred from the vacuum chamber, with a sealing member in the sealing chamber.

Another embodiment of the present invention is a method for manufacturing a lighting device, including the steps of transferring a substrate to a vacuum chamber, forming a light-emitting element including a first electrode, a first light-emitting unit, an intermediate layer, a second light-emitting unit, and a second electrode over the substrate in a plurality of deposition chambers which is placed in the vacuum chamber and has the same degree of vacuum, transferring the substrate provided with the light-emitting element to a sealing chamber connected to the vacuum chamber through a gate valve, and sealing the substrate provided with the light-emitting element, which is transferred from the vacuum chamber, with a sealing member in the sealing chamber.

With the use of the manufacturing apparatus of one embodiment of the present invention, film formation at high speed or successive film formation can be performed. Further, with the use of the manufacturing apparatus of another embodiment of the present invention, improvement in use efficiency of materials and reduction in manufacturing cost can be realized.

BRIEF DESCRIPTION OF THE DRAWINGS

In the accompanying drawings:

FIGS. 12A and 12B are examples of the lighting device;

FIGS. 18A and 18B are examples of the lighting device;

DETAILED DESCRIPTION OF THE INVENTION

Figure 1:
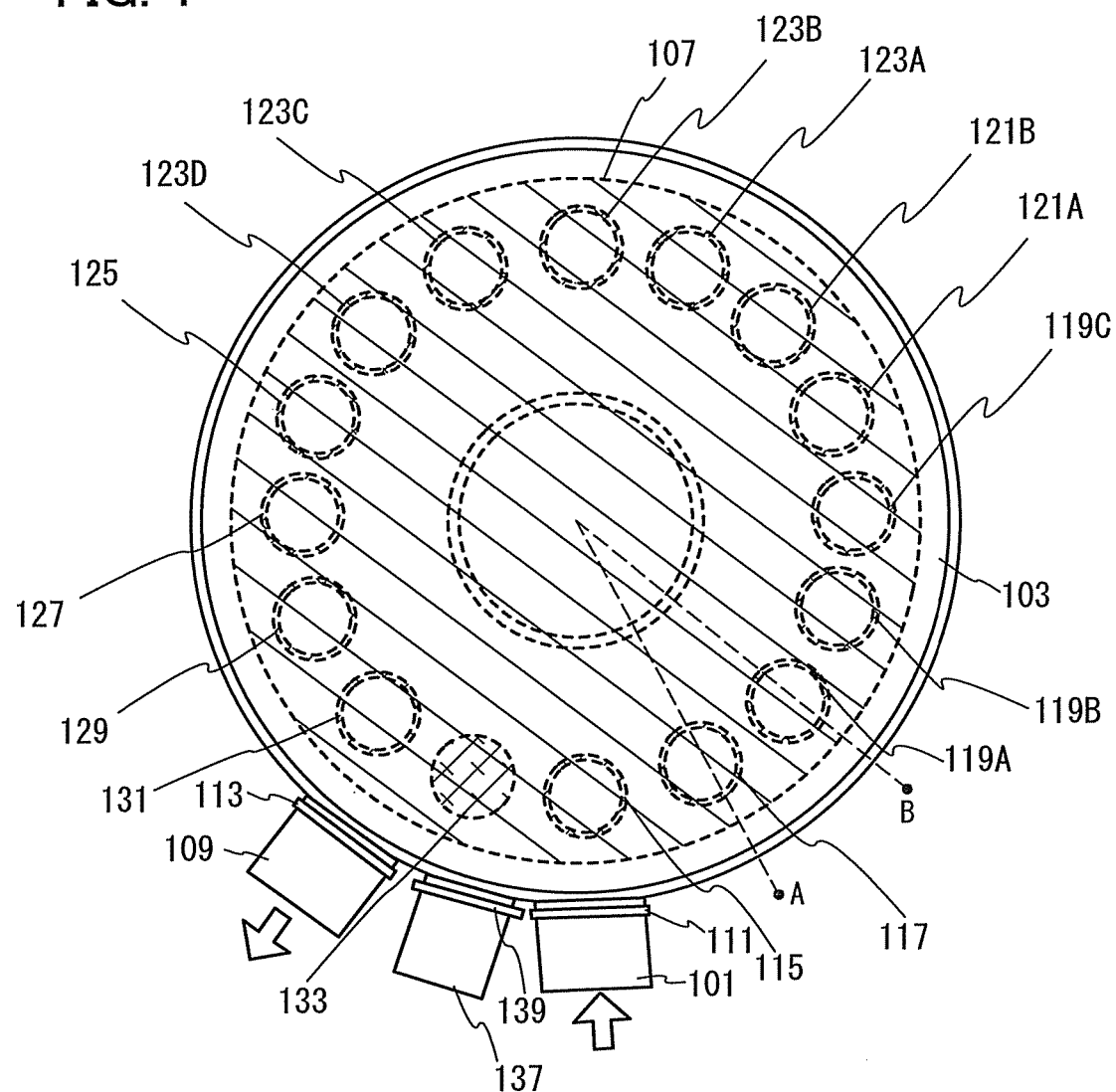
FIG. 1 illustrates an example of a manufacturing apparatus of one embodiment of the present invention.

Hereinafter, embodiments are described in detail with reference to the accompanying drawings. Note that the invention disclosed in this specification is not limited to the following description, and it is easily understood by those skilled in the art that modes and details can be variously changed without departing from the spirit and scope of the present invention. Therefore, the present invention disclosed should not be construed as being limited to the description of embodiments and examples in this specification. In the drawings for describing the embodiments, the same parts or parts having a similar function are denoted by the same reference numerals, and description of such parts is not repeated.

Embodiment 1

In Embodiment 1, an example of a manufacturing apparatus provided with a deposition chamber is described with reference to drawings.

Figure 2A:
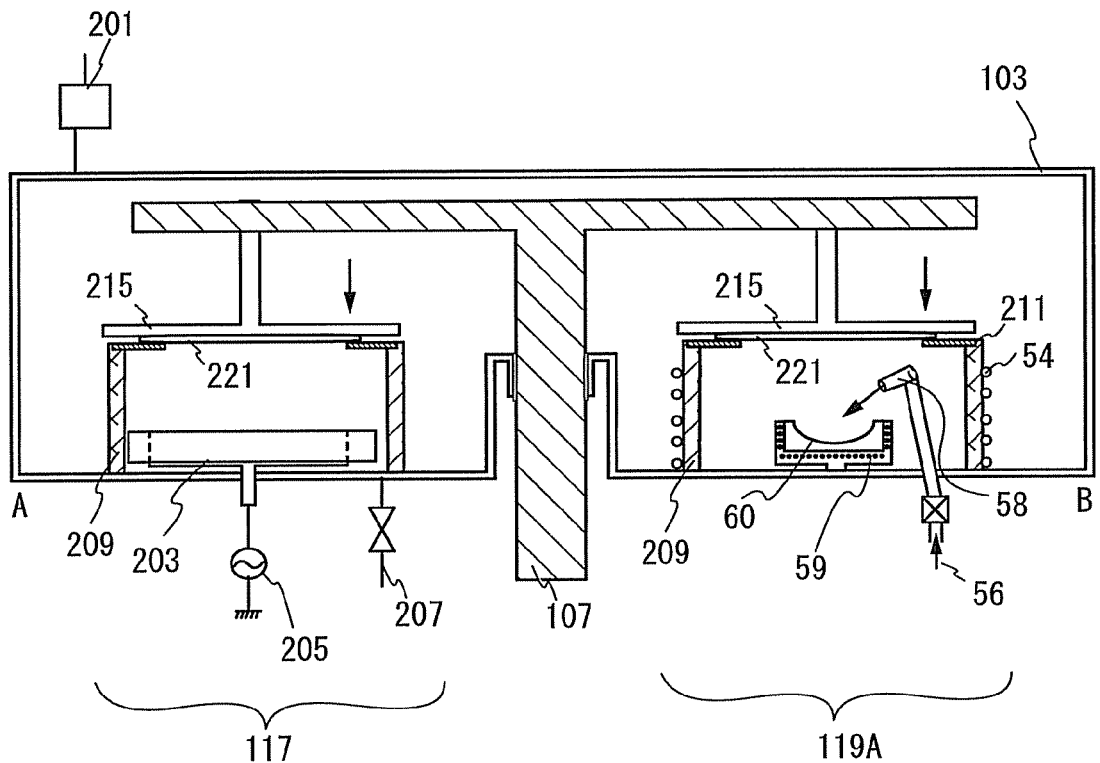
FIGS. 2A and 2B illustrate an example of a manufacturing apparatus of one embodiment of the present invention.
Figure 2B:
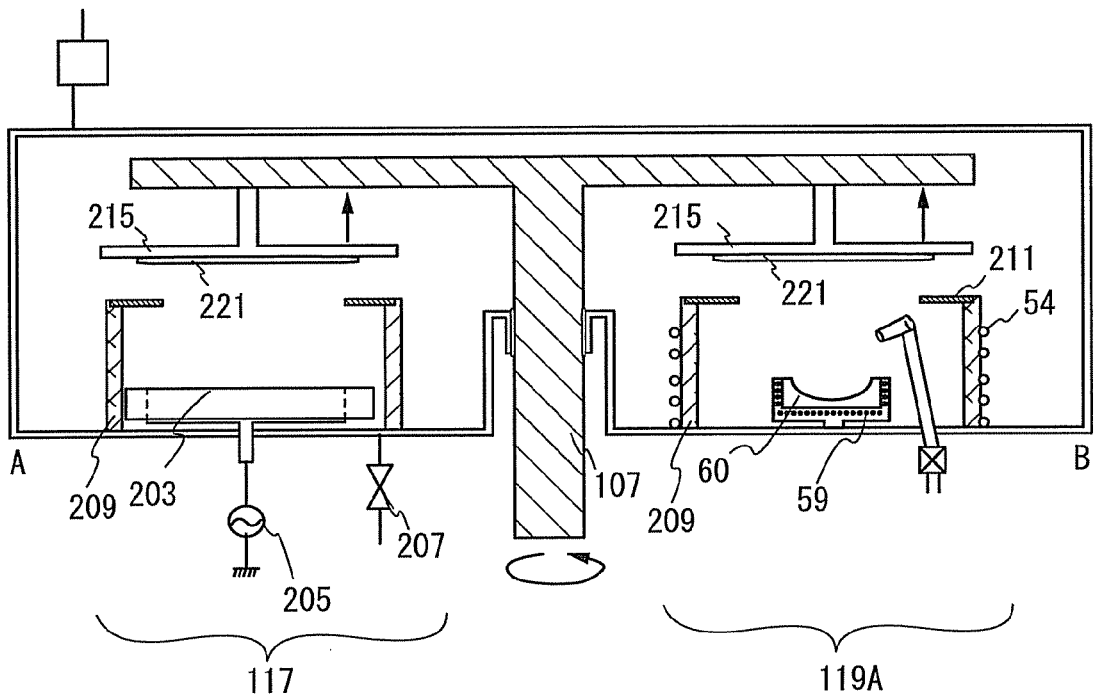

FIG. 1 is a schematic top view of the manufacturing apparatus of Embodiment 1. FIGS. 2A and 2B are cross-sectional views taken along line A-B in FIG. 1.

The manufacturing apparatus illustrated in FIG. 1 includes a first transfer chamber 101, a vacuum chamber 103, a second transfer chamber 109, and a third transfer chamber 137. In addition, in the vacuum chamber 103, deposition chambers 115, 117, 119A, 119B, 119C, 121A, 121B, 123A, 123B, 123C, 123D, 125, 127, 129, and 131, each of which is provided with a cylindrical protection plate, a sealing chamber 133, and a substrate transfer means 107 are provided. In FIG. 1, a substrate is transferred using the first transfer chamber 101 and the second transfer chamber 109. A sealing member of a light-emitting element is carried in using the third transfer chamber 137.

In this specification, a substrate means a member with which a thin film can be formed or a member over which a thin film is formed, and a substrate having a disk shape (also referred to as a circular shape or a saucer shape) is preferably used. In particular, a plastic substrate formed of polycarbonate, polyarylate, polyethersulfone, or the like, a glass substrate, a quartz substrate, or the like can be used. Alternatively, a flexible substrate may be used. A flexible substrate means a substrate which can be bent (is flexible). For example, a plastic substrate, a film (formed from polypropylene, polyester, vinyl, polyvinyl fluoride, vinyl chloride, or the like), an inorganic deposition film, and the like can be given. Alternatively, another material may be used as long as it functions as a support in a manufacturing process of the light-emitting element. Further, a size of the substrate can be set as appropriate in accordance with use application of a lighting device. Note that in terms of productivity and handling of a lighting device, it is preferable that the substrate have the size similar to that of an optical disk device such as a CD-R (for example, a circular shape with a diameter of 10 cm to 14 cm, preferably a circular shape with a diameter of 12 cm). Furthermore, a substrate having an opening portion in a central portion may be used.

The substrate for forming the light-emitting element is transferred from the first transfer chamber 101 to the vacuum chamber 103 by a transfer arm (not illustrated). In the vacuum chamber 103, the substrate is sequentially transferred to the deposition chambers by the substrate transfer means 107. An EL layer, an electrode, and the like, which form the light-emitting element are formed in different deposition chambers, and then the substrate is sealed with a sealing film or a sealing member. After that, the substrate is transferred to the second transfer chamber 109 by the transfer arm (not illustrated). Note that a cassette which stores a plurality of substrates may be set in the transfer chamber.

The first transfer chamber 101 and the second transfer chamber 109 each includes an exhaust system (not illustrated), by which the first transfer chamber 101 and the second transfer chamber 109 is set to a reduced-pressure state or a high vacuum state. The first transfer chamber 101 is separated from the vacuum chamber 103 by a gate valve 111 and the second transfer chamber 109 is separated from the vacuum chamber 103 by a gate valve 113. When the substrate is transferred to the first transfer chamber 101, the gate valve 111 is closed, and when the substrate is transferred from the second transfer chamber 109, the gate valve 113 is closed. After completion of transfer of the substrate, the exhaust system operates and the gate valve on a boundary with the vacuum chamber 103 is opened when the pressure in each transfer chamber reaches a predetermined pressure.

With the use of the manufacturing apparatus described in Embodiment 1, a lighting device including a light-emitting element (so-called a tandem element) having a structure in which a plurality of light-emitting units is stacked between a pair of electrodes can be manufactured. In FIG. 1, a lighting device including a tandem element in which two light-emitting units are stacked between a first electrode and a second electrode can be manufactured. Note that the manufacturing apparatus described in Embodiment 1 is not limited thereto and the number of layers of the light-emitting unit can be decided in accordance with the number of deposition chambers as appropriate.

The substrate transferred from the first transfer chamber 101 to the vacuum chamber 103 is transferred to the deposition chamber 115 first to form a base protective film in the deposition chamber 115. The base protective film is formed with an inorganic compound in a single layer or multilayer, for example. As a typical example of an inorganic compound, silicon oxide, silicon nitride, silicon oxynitride, silicon nitride oxide, or the like can be given. Further, as the base protective film, a film containing zinc sulfide and silicon oxide may be formed. A sputtering method is preferably used in film formation. The base protection film can prevent moisture or gas such as oxygen from entering the light-emitting element from outside.

Next, the substrate provided with the base protective film is transferred to the deposition chamber 117. In addition, another substrate is transferred from the first transfer chamber 101 to the deposition chamber 115. In the deposition chamber 117, a first electrode is formed over the base protective film. The first electrode is an electrode that is used as an anode or a cathode of the light-emitting element. A sputtering method can be preferably used in formation of the first electrode.

After formation of the first electrode, the substrate is transferred to the deposition chamber 119A. In addition, another substrate provided with the base protective film in the deposition chamber 115 is transferred to the deposition chamber 117. In the deposition chambers 119A, 119B and 119C, a first light-emitting unit (also referred to as an EL layer) of the light-emitting element is formed. In Embodiment 1, the substrate provided with the first electrode is sequentially transferred to the deposition chamber 119A, 119B, and 119C, so that the first light-emitting unit (EL layer) is formed in which three layers of a layer including a substance having a high hole-injecting property, a light-emitting layer, and a layer including a substance having a high electron-injecting property are stacked.

The structure of the light-emitting unit is not limited thereto as long as a light-emitting layer is included. The light-emitting unit may have a single layer structure of a light-emitting layer or a stacked layer structure including layers having different functions by appropriate adjustment of the number of the deposition chambers. For example, functional layers such as a hole-injecting layer, a hole-transporting layer, a carrier-blocking layer, an electron-transporting layer, an electron-injecting layer, and the like can be combined as appropriate in addition to the light-emitting layer. Note that a layer having two or more functions of the layers may be included. Alternatively, a plurality of light-emitting layers may be stacked. An evaporation method is preferably used in formation of layers of the light-emitting unit.

Next, the substrate provided with the first light-emitting unit is transferred to the deposition chamber 121A. In addition, the substrate provided with the first electrode is transferred to the deposition chamber 119A. An intermediate layer of the light-emitting element is formed in the deposition chambers 121A and 121B. The intermediate layer has functions of injecting electrons to one of stacked light-emitting units and of injecting holes to the other of the light-emitting units, when voltage is applied to the first electrode and the second electrode. In Embodiment 1, the substrate provided with the first light-emitting unit is sequentially transferred to the deposition chambers 121A and 121B to form films, whereby a layer including an organic compound having a high hole-transporting property and an electron acceptor (acceptor) and a layer including an organic compound having a high electron-transporting property and an electron donor (donor) are stacked to form the intermediate layer. An evaporation method is preferably used in formation of the layers of the intermediate layer.

Note that the structure of the intermediate layer is not limited thereto. A single layer structure of either a layer including an organic compound having a high hole-transporting property and an electron acceptor (acceptor) or a layer including an organic compound having a high electron-transporting property and an electron donor (donor) may be used.

Next, the substrate provided with the intermediate layer is transferred to the deposition chamber 123A, while the substrate provided with the first light-emitting unit is transferred to the deposition chamber 121A. A second light-emitting unit (EL layer) of the light-emitting element is formed in the deposition chambers 123A, 123B, 123C and 123D. In Embodiment 1, the substrate provided with the intermediate layer is sequentially transferred to the deposition chambers 123A, 123B, 123C and 123D, so that the second light-emitting unit (EL layer) is formed in which four layers of a hole-injecting layer, a light-emitting layer, an electron-transporting layer, and an electron-injecting layer are stacked. Similarly to the first light-emitting unit as long as the second light-emitting unit includes at least a light-emitting layer, and the structure is not limited thereto. The number of the deposition chambers can be set as appropriate. Further, two or more layers may be formed in one deposition chamber. Furthermore, the first light-emitting unit and the second light-emitting unit may have the same structure or different structures. Layers of the light-emitting unit are preferably formed by an evaporation method.

When light emission from the first light-emitting unit and light emission from the second light-emitting unit have complementary colors to each other, light emission extracted outside exhibits white color. Alternatively, the first light-emitting unit and the second light-emitting unit each may have a plurality of light-emitting layers, and in each of the plurality of the light-emitting layers, emission colors that are complementary colors are combined to obtain white light emission from each light-emitting unit. As a complementary relation, blue and yellow, blue green and red, and the like can be given.

Next, the substrate provided with the second light-emitting unit is transferred to the deposition chamber 125. In addition, the substrate over which the intermediate layer is formed is transferred to the deposition chamber 123A. The second electrode is formed over the second light-emitting unit in the deposition chamber 125. Note that one of the first electrode and the second electrode is used as an anode, and the other is used as a cathode. A sputtering method can be preferably used to form the second electrode.

Through the above steps, a light-emitting element in which a plurality of light-emitting units is stacked between a pair of electrodes can be formed over a substrate.

Next, the substrate provided with the second electrode is transferred to the deposition chamber 127. In addition, the substrate provided with the second light-emitting unit is transferred to the deposition chamber 125. A drying agent layer is provided over the second electrode in the deposition chamber 127. The drying agent layer can prevent the light-emitting element form deteriorating. A drying agent used for the drying agent layer may be a substance which absorbs moisture by chemical adsorption, such as an oxide of an alkaline earth metal typified by calcium oxide or barium oxide. Alternatively, a substance which adsorbs moisture by physical adsorption, such as zeolite or silica gel, may be used. The drying agent layer is preferably provided over the second electrode by a sputtering method. Note that the drying agent layer is not necessarily provided.

Next, the substrate provided with the drying agent layer is transferred to the deposition chamber 129. In addition, the substrate over which the second electrode is formed is transferred to the deposition chamber 127. A sealing film is formed over the drying agent layer in the deposition chamber 129. The sealing film can be formed using a material similar to that of the base protective film and is preferably formed by a sputtering method. The sealing film makes it possible to prevent moisture, impurities, or the like from entering from outside.

Next, the substrate provided with the sealing film is transferred to the deposition chamber 131. In addition, the substrate provided with the drying agent layer is transferred to the deposition chamber 129. A sealant is formed over the substrate provided with the light-emitting element in the deposition chamber 131. The sealant is provided to attach the substrate provided with the light-emitting element and a sealing member. As the sealant, for example, a thermosetting resin, an ultraviolet curing resin, or the like can be used.

Next, the substrate provided with the light-emitting element is transferred to the sealing chamber 133. In addition, the substrate over which the sealing film is formed is transferred to the deposition chamber 131. In the sealing chamber 133, the substrate provided with the light-emitting element is superposed on the sealing member, and the sealant is cured by ultraviolet ray irradiation or heat, so that the substrate provided with the light-emitting element is pressure-bonded to the sealing member. The sealing member is transferred to the vacuum chamber 103 from the third transfer chamber 137 which is separated from the vacuum chamber 103 by a gate valve 139. The sealing chamber 133 preferably includes a cassette which stores the sealing member. Alternatively, an additional chamber to store the sealing member may be provided in addition to the sealing chamber 133. Note that when the sealant is cured by ultraviolet ray irradiation in the sealing chamber 133, mask is used in order that the light-emitting element is not irradiated with ultraviolet ray.

As the sealing member, plastic (a flexible substrate), glass, quartz, or the like can be used. As an example of plastic, a member made from polycarbonate, polyarylate, polyethersulfone, or the like can be given. Alternatively, a film (made of polypropylene, polyester, vinyl, polyvinyl fluoride, vinyl chloride, or the like), an inorganic deposition film, or the like can be used. Note that other materials can be used as long as it functions as a sealing member. Similarly to the substrate provided with the light-emitting element, the sealing member preferably has a circular shape with a diameter of 10 cm to 14 cm, more preferably a circular shape with a diameter of 12 CM.

Note that the sealing member is not necessarily provided. The substrate may be transferred from the manufacturing apparatus after the light-emitting element is sealed with the sealing film. Further, the sealing film is not necessarily provided when the sealing member is provided. Furthermore, the sealant is not necessarily provided on a side of the substrate which is provided with the light-emitting element. The sealant may be provided on a sealing member side. Further, a sealing member provided with a sealant in advance may be transferred from a sealing member transport portion to the vacuum chamber.

Through the above steps, formation of layers included in the light-emitting element and sealing of the light emitting element is successively performed in the vacuum chamber 103; and thus, a lighting device can be obtained.

An example of a specific deposition step is illustrated in FIGS. 2A and 2B. FIGS. 2A and 2B are cross-sectional views of the manufacturing apparatus taken along line A-B in FIG. 1. In FIGS. 2A and 2B, as an example of a deposition step, film formation in the deposition chamber 117 by a sputtering method and film formation in the deposition chamber 119A by an evaporation method are illustrated. Each deposition chamber includes a cylindrical protection plate 209. Note that film formation similar to that illustrated in FIGS. 2A and 2B is performed in other deposition chambers which are not illustrated in FIGS. 2A and 2B.

FIG. 2A illustrates a deposition step in the vacuum chamber 103. The vacuum chamber 103 has a sealed structure and can be set to a reduced-pressure state or a high pressure state by an exhaust system 201. In addition, pressure in the plurality of deposition chambers and the sealing chamber, which are provided in the vacuum chamber, is reduced by the exhaust system 201 and has the same degree of vacuum. As the exhaust system 201, a magnetic floating turbo molecular pump, a cryopump, or a dry pump is used. Ultimate degree of vacuum of the vacuum chamber 103 can be set to $10^{-5}$ Pa to $10^{-6}$ Pa by a vacuum evacuation means. Note that a plurality of the exhaust systems 201 may be provided.

The substrate transfer means 107 has a plurality of substrate holders 215, and a substrate 221 is held by the substrate holder 215. The substrate holder 215 holds a substrate by an attachment means such as an electrostatic chuck or a fixing jig such as a clamp. Further, when the substrate 221 has an opening portion in the central portion, a pawl may be provided for the substrate holder 215 to hold the substrate through the opening portion.

The substrate holders 215 can be lifted or lowered by a vertical driving mechanism which is not illustrated. In addition, a rotating mechanism which rotates the substrate holders 215 is preferably provided. When deposition treatment is performed, the substrate holder 215 is lowered and the substrate 221 is placed over a deposition mask 211 provided over the cylindrical attachment protection plate 209 in each deposition chamber. The mask 211 preferably has an alignment marker. Note that throughput can be further improved when a plurality of substrates is processed at once in each deposition chamber.

In Embodiment 1, the first electrode is formed by a sputtering method in the deposition chamber 117. A sputtering target 203, a high-frequency power source 205, and a gas introduction means 207 are provided inside the attachment protection plate 209 provided for the deposition chamber 117. The substrate holder 215 is preferably rotated in film formation so that a film is uniformly formed over the substrate.

A sputtering method may be either a DC (direct current) sputtering method or an RF (radio frequency) sputtering method. When a DC sputtering method is performed, a negative voltage is applied to the sputtering target 203 and the substrate 221 is a ground potential. When an RF sputtering method is performed, the substrate 221 is placed in an electrically floating (floating from the ground potential) state. Note that when an electrode is formed using a metal thin film in the deposition chambers 117 and 125, DC sputtering is preferably used. When film formation is performed using an inorganic material as a target in the deposition chambers 115, 127, and 129, RF sputtering is preferably used.

A layer including a substance having a high hole-injecting property is formed by an evaporation method in the deposition chamber 119A. A container 60 and a heater 59 for heating the container are provided inside the attachment protection plate 209 provided in the deposition chamber 119A. The container 60 is made from a substance having small heat capacity, which can endure high temperature, high pressure, and reduced pressure. Further, a material mixed gas 56 is supplied inside the container 60 from a nozzle 58 provided in an end of a supply tube. The material mixed gas 56 is supplied through a cylinder bottle, a valve, a flowmeter, or the like.

As a material of the attachment protection plate 209, metal such as iron, aluminum, or stainless steel can be preferably used. A small tube heater 54 is provided in the periphery of the attachment protection plate 209. When the substrate 221 has a circular shape, a film in which unevenness in thickness is suppressed can be formed. In evaporation, the substrate holder 215 is preferably rotated.

After film formation is completed in each deposition chamber, the substrate holder 215 is lifted as illustrated in FIG. 2B, the substrate transfer means 107 is rotated in a direction indicated by an arrow by a certain angle, and the substrate 221 is transferred over the next deposition chamber. Note that the substrate transfer means 107 may be provided with a vertical driving mechanism instead of the substrate holder 215. In FIG. 2B, the substrate transfer means 107 is rotated counterclockwise, so that the substrate over which the first electrode is formed in the deposition chamber 117 is transferred over the deposition chamber 119A and the substrate which has undergone evaporation in the deposition chamber 119A is transferred over the deposition chamber 119B. Further, from the deposition chamber 115, the substrate over which formation of the base protective film is completed is transferred over the deposition chamber 117. Note that a rotation angle of the substrate transfer means can be set as appropriate in accordance with the number of deposition chambers or the like. In addition, a rotation direction of the substrate transfer means is not limited to that illustrated in FIG. 2B.

The manufacturing apparatus described in Embodiment 1 includes the deposition chambers 115, 117, 119A, 119B, 119C, 121A, 121B, 123A, 123B, 123C, 123D, 125, 127, 129, and 131 and the sealing chamber 133, which have the same degree of vacuum in the vacuum chamber 103. Accordingly, as compared to the case where a plurality of deposition chambers is provided with gate valves therebetween, a transfer means is simplified, and transfer time and transfer distance are shortened, whereby throughput can be remarkably improved. In addition, the plurality of deposition chambers, and the sealing chamber are placed in the vacuum chamber, so that the number of exhaust systems can be reduced as compared to the case where each of the deposition chambers and the sealing chamber is provided with an exhaust system. Further, the number of inert gas introduction means which introduces an inert gas to the vacuum chamber can be reduced, whereby the manufacturing apparatus can be simplified. Therefore, productivity of a lighting device is improved. Furthermore, a gate valve is not provided between the deposition chambers, so that cost reduction as a whole apparatus can be achieved while maintenance can be simplified.

Further, when a substrate has an opening portion in the central portion, a pawl may be provided for the substrate holder 215 to hold the substrate from an inner side of the opening portion. Furthermore, the pawl can be used as a mask. A transfer example in this case is described with reference to FIGS. 3A and 3B.

Figure 3A:
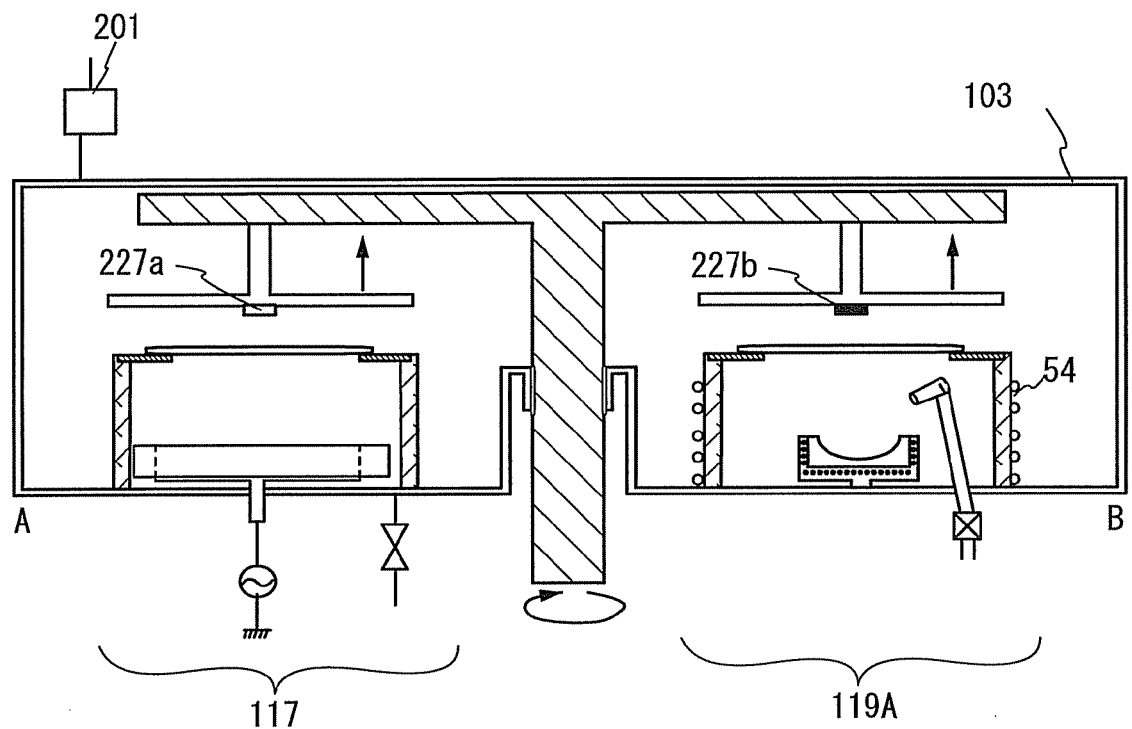
FIGS. 3A and 3B illustrate an example of a manufacturing apparatus of one embodiment of the present invention.
Figure 3B:
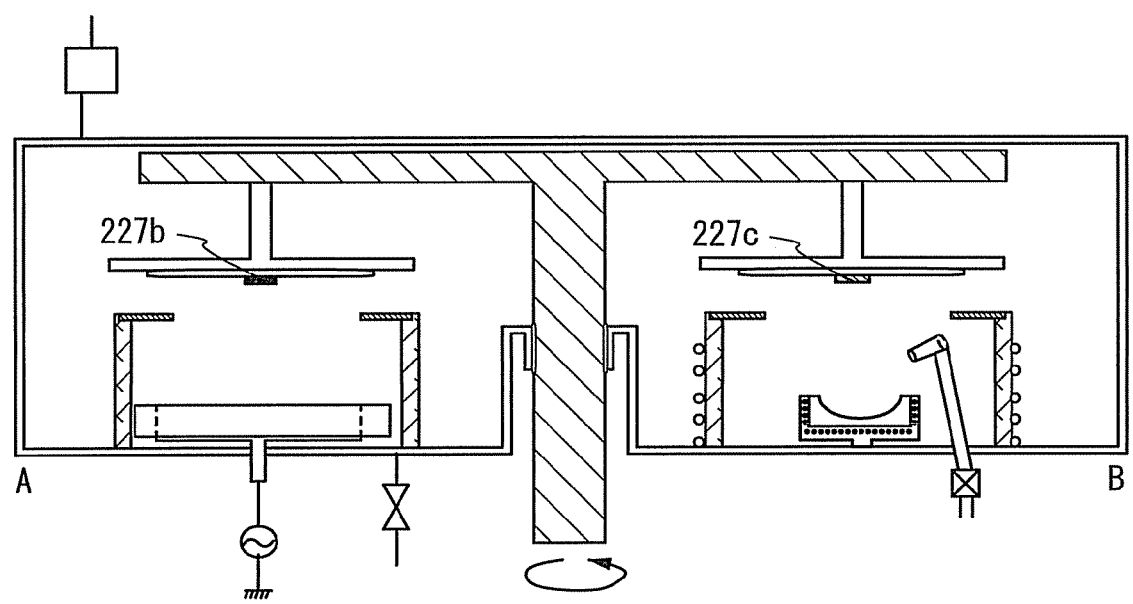

The substrate holders 215 each are provided with a pawl 227 having different size (diameter) corresponding to respective deposition chambers. In FIGS. 3A and 3B, a pawl 227*a* has a size corresponding to the deposition chamber 117, a pawl 227*b* has a size corresponding to the deposition chamber 119A, and a pawl 227*c* has a size corresponding to the deposition chamber 119B (not illustrated).

As illustrated in FIG. 3A, after film formation is completed in each deposition chamber, the substrate 221 is placed over the mask 211 and the substrate holder 215 is lifted. Then, the substrate transfer means 107 is rotated in a direction (clockwise) opposite to that in transferring the substrate by a certain angle, and the substrate holder 215 is placed over the adjacent prior deposition chamber. For example, the substrate holder having the pawl 227*a* is placed over the deposition chamber 115 (not illustrated), the substrate holder having the pawl 227*b* is placed over the deposition chamber 117, and the substrate holder having the pawl 227*c* is place over the deposition chamber 119A.

Then, after the substrate holders 215 are lowered and hold the substrate 221 provided over the attachment protection plate 209 in each deposition chamber, the substrate transfer means is rotated in a direction (counterclockwise) opposite to that illustrated in FIG. 3A by a certain angle to transfer the substrate over the deposition chambers each corresponding to the size of the respective pawls. After that, the substrate holder is lowered and film formation is performed, whereby film formation in which a pawl corresponding to each deposition chamber is used as a mask can be performed; thus, patterning of an extraction terminal around an opening portion of the circular substrate or the like can be performed.

In the manufacturing apparatus of Embodiment 1, materials attached to the mask 211 and the attachment protection plate 209 may be washed with an organic solvent or the like and collected to be reused. When a material such as iridium included in the light-emitting layer is collected from the cleaning solution and reused, waste of resources can be eliminated and a relatively expensive EL material can be efficiently used or reused. Accordingly, cost reduction of a lighting device can be realized.

Figure 4:
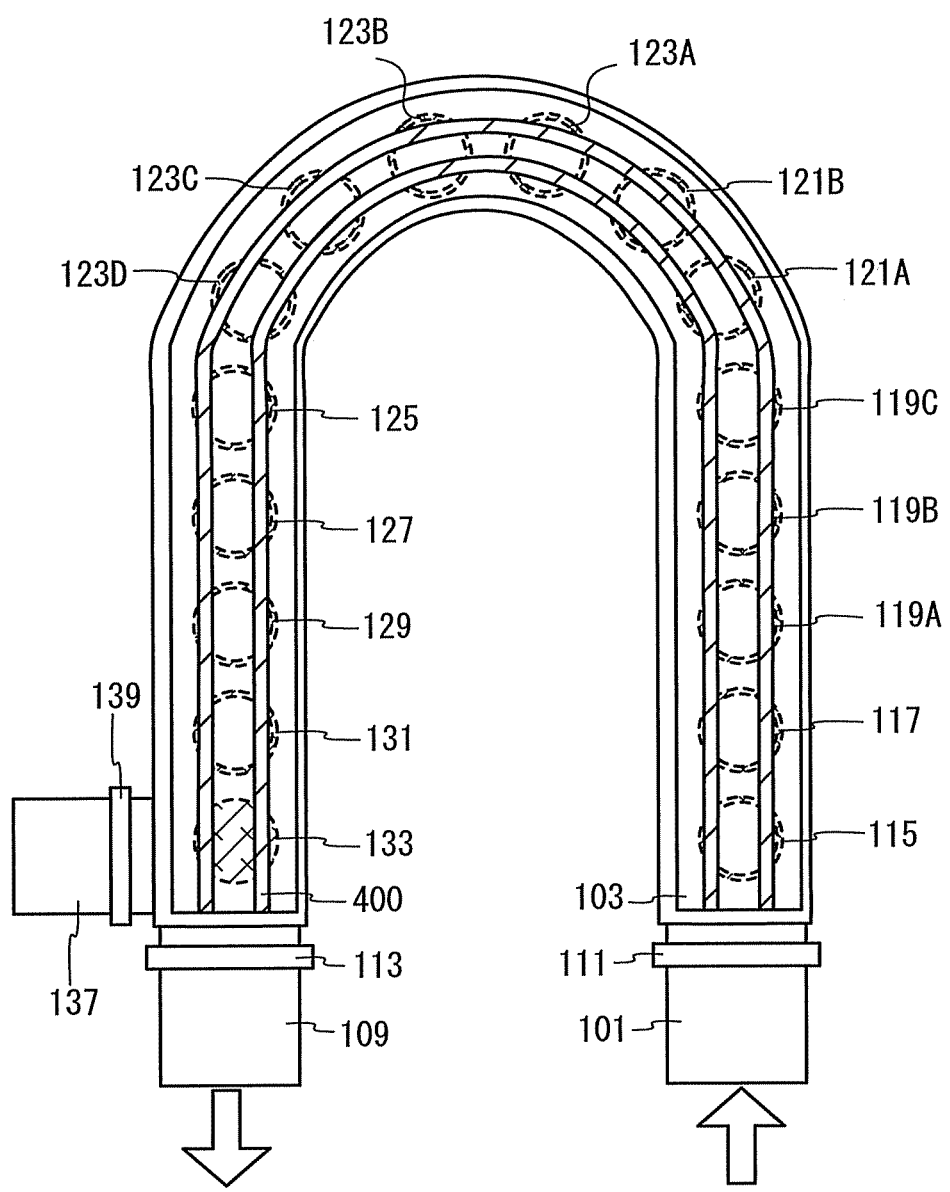
FIG. 4 illustrates an example of a manufacturing apparatus of one embodiment of the present invention.

In Embodiment 1, the structure in which the plurality of deposition chambers is placed along the circumference of the circle is described; however, the structure of the manufacturing apparatus is not limited thereto and can be changed as appropriate according to a layout of a clean room or the like. For example, the vacuum chamber 103 may have a rectangular cuboid shape and the plurality of deposition chambers may be placed along a straight line. Alternatively, the deposition chambers may be placed along the U-shaped line as illustrated in FIG. 4. Note that the manufacturing apparatus illustrated in FIG. 4 includes the first transfer chamber 101, the vacuum chamber 103, and the second transfer chamber 109. Further, in a manner similar to that of the manufacturing apparatus illustrated in FIG. 1, film formation of layers of a light-emitting element included in a lighting device and sealing of the light-emitting element are successively performed in the vacuum chamber 103. When the manufacturing apparatus has a U shape, for example, a substrate can be successively transferred to each deposition chamber using a rail 400 or the like placed over the deposition chambers.

Note that in FIG. 4, the deposition chamber 131 and the sealing chamber 133 are provided to seal the light-emitting element with a sealing member; therefore, when the light-emitting element is sealed with a sealing film, the deposition chamber 131 and the sealing chamber 133 are not necessarily provided. Further, when the light-emitting element is sealed with a sealing member, the deposition chamber 131 where a sealant is formed over the substrate provided with the light-emitting element or a sealing member and the sealing chamber 133 may be provided separately from the vacuum chamber 103. Alternatively, instead of the deposition chamber 131, an additional chamber to store a sealing member provided with a sealant may be provided.

Figure 5:
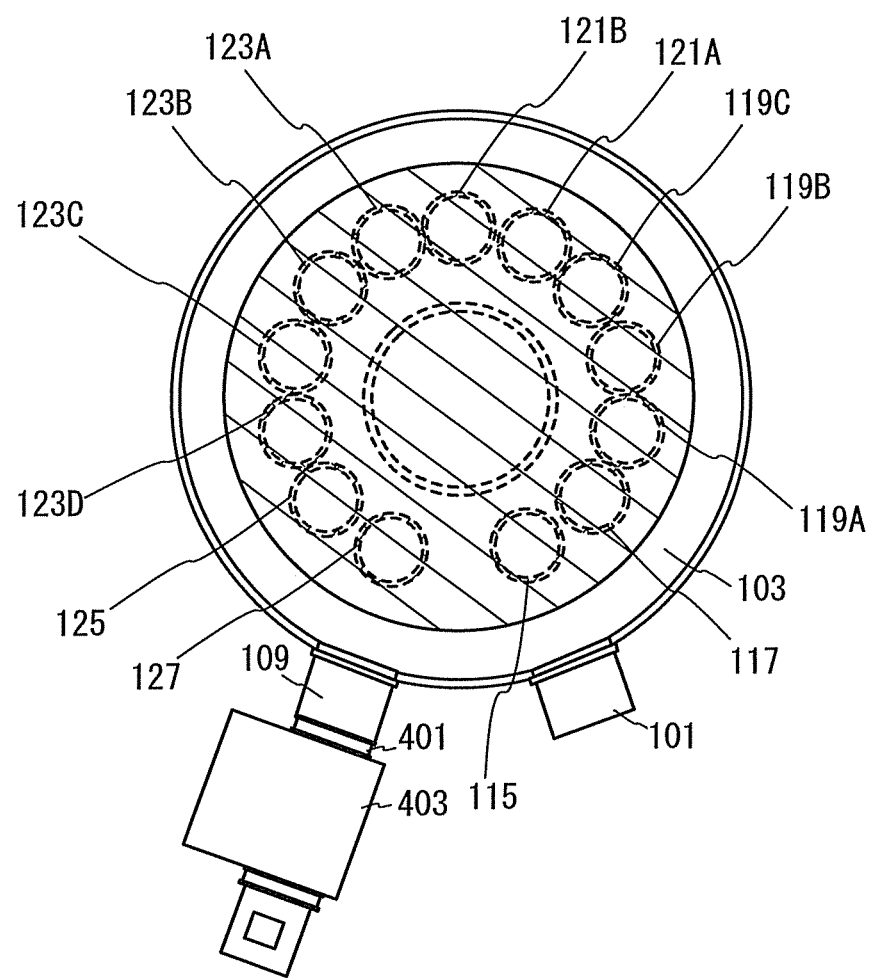
FIG. 5 illustrates an example of a manufacturing apparatus of one embodiment of the present invention.

In Embodiment 1, an example in which a lighting device is sealed in the vacuum chamber 103 is shown; however, an embodiment of the manufacturing apparatus is not limited thereto. For example, as illustrated in FIG. 5, a manufacturing apparatus may be provided with a sealing chamber in addition to the vacuum chamber 103. In FIG. 5, a sealing chamber 403 which is separated from the second transfer chamber 109 by a gate valve 401 is provided.

With the use of the manufacturing apparatus illustrated in FIG. 5, the base protective layer, the first electrode, the first light-emitting unit, the intermediate layer, the second light-emitting unit, the second electrode, and the drying agent layer are successively formed over a substrate in the deposition chambers 115, 117, 119A, 119B, 119C, 121A, 121B, 123A, 123B, 123C, 123D, 125, and 127 in the vacuum chamber 103, and then sealing is performed using a sealing member in the sealing chamber 403 without exposure to the air. Note that a deposition chamber to form a sealing film may be additionally provided in the vacuum chamber 103 and the light-emitting element sealed with the sealing film may be transferred to the sealing chamber 403. The sealing chamber 403 may be under a nitrogen atmosphere, and space between the sealing member and an element substrate may be filled with an inert gas such as dried nitrogen.

As the sealing member, glass, ceramic, plastic, metal or the like can be used. Alternatively, an organic resin material such as polyimide, polyethylene terephthalate (PET), polyethylene naphthalate (PEN), polyether sulfone (PES), aramid, or prepreg may be used. Note that in the case where light is emitted through the sealing member, a sealing member having a light transmitting property is used. The sealing member is attached to the substrate over which the light-emitting element is formed, using a sealant such as a heat-curing resin or an ultraviolet curing resin, and a hermetically sealed space is formed by curing the resin through thermal treatment or ultraviolet irradiation treatment. It is also effective to provide a drying agent such as barium oxide in the hermetically sealed space.

Further, a space between the sealing member and the substrate over which the light-emitting element is formed can also be filled with a sealant such as a thermosetting resin or an ultraviolet curable resin. In this case, a drying agent may be added to a thermosetting resin or an ultraviolet curing resin.

The manufacturing apparatus of Embodiment 1 described above can reduce the size of the manufacturing apparatus and to save a space for a footprint. In addition, a lighting device is manufactured using the manufacturing apparatus, whereby improvement in productivity and reduction in manufacturing cost can be achieved. Further, with the use of the manufacturing apparatus, waste of resources can be eliminated and a manufacturing method which is suitable for global environments can be provided.

Further, the manufacturing apparatus described in Embodiment 1 is a coupled apparatus capable of in-line treatment; accordingly, high-speed film formation and a successive film formation can be performed. Furthermore, use efficiency of a material can be increased; thus, manufacturing cost of a lighting device can be reduced.

Note that Embodiment 1 can be combined with the other embodiments as appropriate.

Embodiment 2

Figure 6:
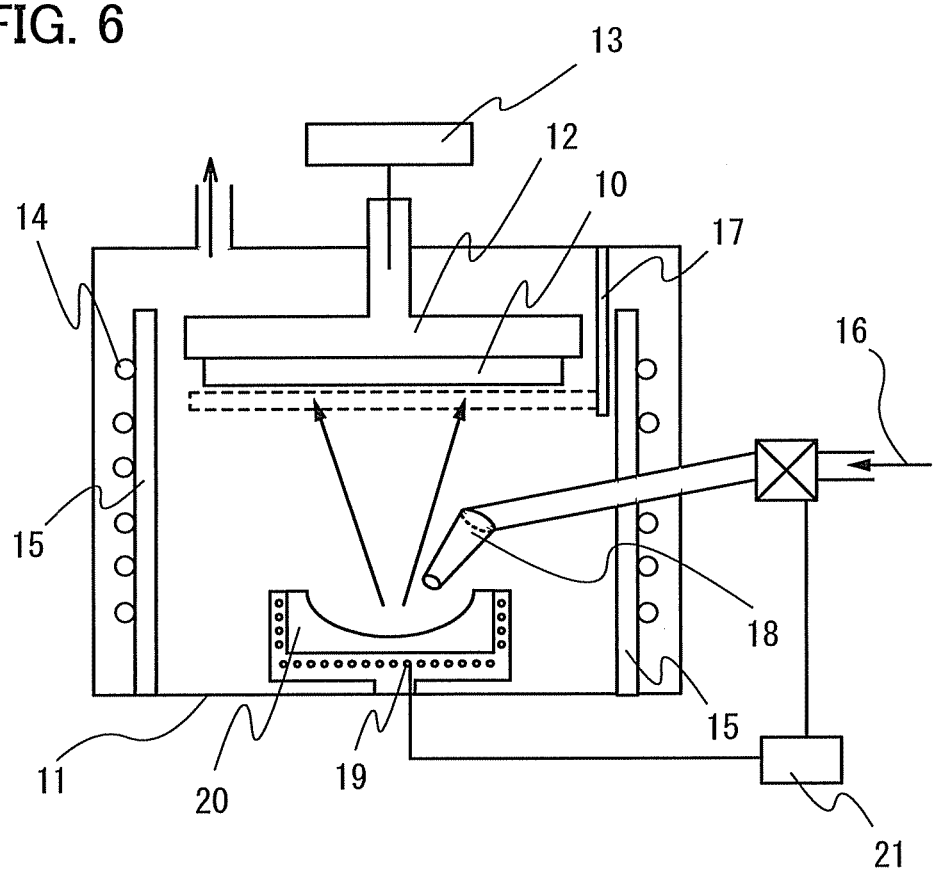
FIG. 6 is a cross-sectional view of a deposition chamber of one embodiment of the present invention.

In Embodiment 2, an example of a deposition chamber provided in a manufacturing apparatus is described. Specifically, an example of a deposition chamber in which an organic material is formed by an evaporation method and a light-emitting unit or an intermediate layer of a light-emitting element is formed is described. FIG. 6 is a cross section of a schematic configuration diagram.

A deposition chamber 11 is placed in a vacuum chamber provided with a vacuum evacuation means, and is provided with an inert gas introduction means. For the vacuum evacuation means, a magnetic floating turbo molecular pump, a cryopump, or a dry pump is used. Ultimate degree of vacuum of the deposition chamber 11 can be set to $10^{-5}$ Pa to $10^{-6}$ Pa by the vacuum evacuation means. Further, an inert gas such as nitrogen or a rare gas is used as a gas to be introduced in order to prevent impurities from being introduced into the deposition chamber 11. A gas which is introduced into the deposition chamber 11 is highly purified by a gas refiner before introducing into the apparatus. Accordingly, a gas refiner needs to be provided so that a gas is introduced into the manufacturing apparatus after it is highly purified. Accordingly, oxygen, moisture, or other impurities in the gas can be removed in advance; therefore, these impurities can be prevented from being introduced into the apparatus.

The deposition chamber 11 is provided with a substrate holding means (a substrate holder) 12 to fix a substrate 10. The substrate holding means 12 fixes a substrate by an electrostatic chuck or the like. Part of the substrate holding means 12 is provided with a transparent window portion, so that a position of the substrate 10 can be checked by an imaging means (a CCD camera or the like) provided in a place overlapping with the transparent window portion of the substrate holding means 12. Note that when a position of the substrate 10 is not required to be checked, the transparent window portion and the imaging means are not necessarily provided.

Further, the substrate holding means 12 is provided with a substrate rotation controlling portion 13 in order to improve uniformity of films. The substrate 10 is rotated in film formation, so that uniformity of a film thickness can be improved. Alternatively, the substrate rotation controlling portion 13 may have a mechanism which enables a substrate to be transferred before and after film deposition; in this case, the substrate rotation controlling portion can also be referred to as a substrate transfer controlling portion. For example, a substrate may be introduced to the deposition chamber 11 from another treatment chamber before film formation while the vacuum is kept; alternatively, a substrate may be transferred to another treatment chamber from the deposition chamber 11 after film formation while the vacuum is kept.

Further, an attachment protection plate 15 is provided in order to prevent an organic material typified by an organic compound from attaching to an inner wall of the deposition chamber 11 in film formation. By providing the attachment protection plate 15, an organic compound which is not deposited over the substrate can be attached. Further, in the periphery of the attachment protection plate 15, a small tube heater 14 such as a heating wire is provided in contact with the attachment protection plate 15, which can heat the entire attachment protection plate 15. During film formation, it is preferable that a temperature ($T_B$) of the attachment protection plate 15 be controlled to be 10° C. or higher than a temperature ($T_S$) of the substrate.

A container 20 and a heater 19 for heating the container are provided under the substrate 10 so as to overlap with the substrate 10. The container 20 is made from a substance having small heat capacity, which can endure high temperature, high pressure, and reduced pressure. Further, a material mixed gas 16 is supplied inside the container 20 from a nozzle 18 provided in an end of a supply tube. The material mixed gas 16 is supplied through a cylinder bottle, a valve, a flowmeter, and the like. Note that a position of the nozzle 18 is not limited to that in FIG. 6; for example, a gas may be introduced from a lower portion of a deposition chamber as illustrated in FIGS. 2A and 2B.

Further, in order to control a temperature of the container precisely, a cooling mechanism which is controllable by a controlling portion may be provided in addition to the heat. As the cooling mechanism, for example, a Peltier element can be used. Alternatively, a narrow pipe may be provided in the periphery of the container and cooling water may be introduced to the narrow pipe to cool the container. By provision of the cooling mechanism, temperature can be controlled more precisely. For example, the temperature of the container can be prevented from far exceeding a desired temperature due to rapid heating by the heat, and the temperature of the container can be controlled to be constant by the cooling mechanism. Since the container has small heat capacity, the temperature of the container, which is controlled by both the heater and the cooling mechanism, can be rapidly reflected to a temperature of the organic material.

The material mixed gas 16 is a mixed gas of at least powder of an organic material and a carrier gas. It is preferable that the material mixed gas 16 be preheated when supplied inside the container from the nozzle 18. By the preheating of the organic material, length of time taken before evaporation on the substrate can be started can be shortened. As a method for preheating, the following methods can be given: a method in which a carrier gas which is heated by a heater is mixed with powder of an organic material and thus the material mixed gas 16 is preheated; or a method in which a material mixed gas 16 is preheated by a heater or the like provided outside the supply tube.

Further, as the carrier gas, an inert gas such as nitrogen or a rare gas is used for prevention of introduction of impurities into the material mixed gas 16. The carrier gas is highly purified by a gas refiner before supplied to the deposition chamber 11 or before mixed with the organic material. Thus, the gas refiner is preferably provided so that the gas is introduced into the manufacturing apparatus after it is highly purified. Accordingly, oxygen, moisture, and other impurities in the carrier gas can be removed in advance, whereby these impurities can be prevented from being attached the inside of the supply tube and the inside of the nozzle.

Further, a flow rate of the material mixed gas 16 can be controlled by opening and closing of the valve, a flowmeter, pressure of the cylinder bottle, or the like and a control portion 21 controls both the flow rate of the material mixed gas 16 and the temperature of the heater 19. Note that FIG. 6 illustrates an example in which the flow rate of the material mixed gas 16 is adjusted by controlling the opening and closing of the valve by the control portion 21. Note that a method for adjusting the flow rate of the material mixed gas 16 by the control portion 21 is not limited to the structure illustrated in FIG. 6.

As the container 20, a crucible or a plate made of a substance having small heat capacity (tungsten, molybdenum, or the like) is used. The control portion 21 adjusts both the temperature of the heater 19 which controls the temperature of the organic material supplied to the container and the flow rate of the material mixed gas 16, whereby a stable evaporation of the organic material can be performed. Note that a crucible means a cylindrical container having an opening portion.

Further, a shutter or a gate, which is indicated by a dashed line in FIG. 6, is provided between the heater 19 and the substrate 10. The shutter covers the substrate 10 in order to control evaporation of vaporized organic material until sublimation rate from an evaporation source is stabilized. FIG. 6 illustrates an example in which a shutter shaft 17 rotates to perform the opening and closing of the shutter. Note that a method for opening and closing the shutter is not limited to the structure illustrated in FIG. 6.

Moreover, FIG. 6 illustrates an example in which the substrate 10 is set in a face-down manner. A face-down manner refers to a manner in which a deposition surface of a substrate faces downward during film formation, and attachment of dust or the like can be suppressed by this system.

Figure 7A:
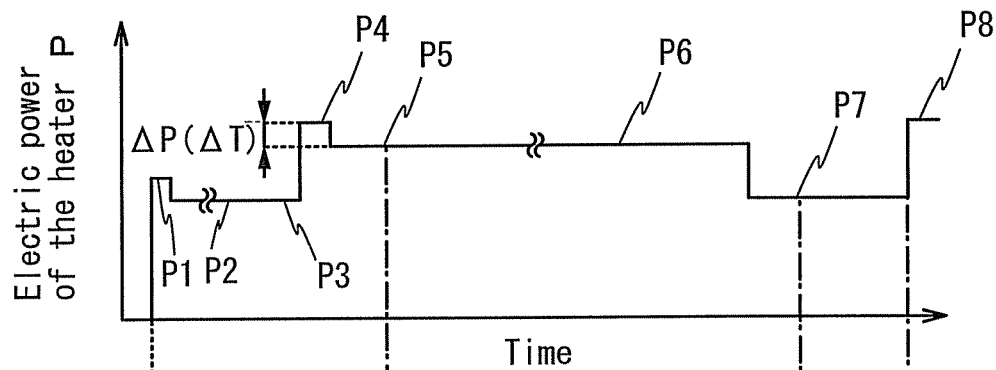
FIGS. 7A, 7B, and 7C are timing charts of a manufacturing apparatus of one embodiment of the present invention.
Figure 7B:
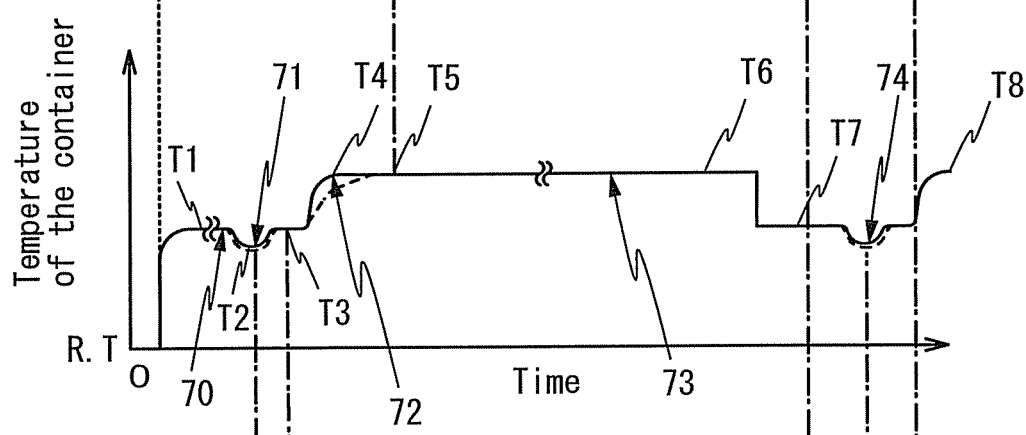
Figure 7C:
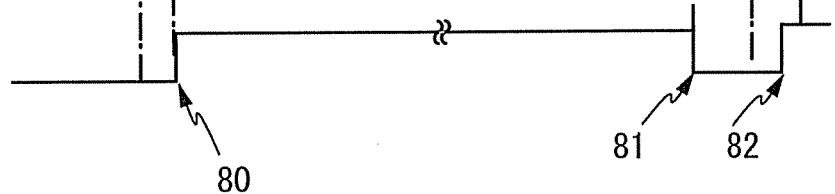

FIGS. 7A to 7C are timing charts each showing a procedure before and after evaporation on the substrate 10 and a procedure in which evaporation on a second substrate is started. In FIG. 7A, the vertical axis represents electric power of the heater and the horizontal axis represents time. In FIG. 7B, the vertical axis represents a temperature of the container and the horizontal axis represents time. FIG. 7C shows a timing when the substrate is introduced into the deposition chamber 11 and a timing when the substrate is transferred to another treatment chamber (including a transfer chamber).

A procedure for forming an organic thin film is described below with reference to FIG. 6 and FIGS. 7A to 7C. FIGS. 7A to 7C show stages including a stage before the substrate is transferred to a reaction chamber, and treatment after that is shown in a chronological order.

First, vacuum evacuation is performed so that the pressure in the deposition chamber 11 before the substrate is introduced therein is lower than $1 \times 10^{-4}$ Pa. Note that the procedure is not limited to performing vacuum evacuation starting from atmospheric pressure, and it is preferable to maintain the vacuum chamber under a certain degree of vacuum at all times in terms of mass production as well as in terms of reducing the ultimate vacuum in a short time.

Then, the heater 19 is turned on and set to a first electric power P1 to heat the container (crucible) 20. A temperature of the container is a first temperature T1. The power source of the heater 19 is set to the first electric power P1 which is temporally high in order to shorten the length of time until the temperature of the container reaches the first temperature T1.

After the temperature of the container 20 reaches the first temperature T1, the power source of the heater 19 is set to a second electric power P2 which is lower than the first electric power P1 and heating is continued. This point of a standby state is represented by a point 70.

Then, the material mixed gas 16 is introduced into the container 20 from the nozzle 18. When the material mixed gas 16 is introduced, the temperature of the container 20 is temporally decreased to be a second temperature T2, though the amount of decrease depends on an amount of the material supplied to the container. This point represents a temperature change point 71 after the material mixed gas 16 is supplied. Note that the temperature of the material mixed gas 16 is preferably similar to the first temperature T1.

Then, heating of the container 20 is continued. When the temperature of the container 20 returns to a third temperature T3 which is the same temperature as the first temperature T1, the substrate 10 is introduced into the deposition chamber 11. A point 80 represents a point when the substrate 10 is introduced. When the temperature of the container returns to the third temperature T3, the power source of the heater 19 is set to a third electric power P3 which is the same as the second electric power P2.

Next, the power source of the heater 19 is set to a fourth electric power P4 which is temporally high so that the temperature of the container 20 is increased to a fourth temperature T4 in a short time. Electric power ΔP is added for rising in this time, so that the temperature is stabilized the fourth temperature T4 in a short time. Here, electric power is applied so that temperature rising rate is accelerated in order to fit an approximate expression of linear least squares. Note that evaporation is automatically started when the temperature of the container 20 reaches the fourth temperature T4. A point 72 represents a point when the temperature of the container 20 reaches the fourth temperature T4. After this point, the shutter is opened and evaporation on the substrate is started. A curved line illustrated by a dotted line in FIG. 7B indicates a temperature change of the container in the case where the electric power ΔP is not added.

Next, at a stage when the temperature of the container 20 is stabilized at the fourth temperature T4, the power source of the heater 19 is set to a fifth electric power P5 which is lower than the fourth electric power P4 and heating is continued. The temperature of the container 20 at this point is a fifth temperature T5, which is the same specified temperature as the fourth temperature T4 to start evaporation. Note that the fifth temperature T5, the third temperature T3, and the first temperature T1 vary depending on an organic material supplied, so that these temperatures are set by a practitioner as appropriate.

Next, predetermined heating is performed and the substrate shutter is shut to terminate film formation on the substrate. The power source of the heater 19 is set to a sixth electric power P6 just before the termination of film formation. Note that the sixth electric power P6 is the same as the fifth electric power P5. Further, the temperature of the container 20 is a sixth temperature T6 just before the termination of evaporation, which is the same temperature as the fifth temperature T5.

Then, the substrate is carried out, the power source of the heater 19 is set to a seventh electric power P7 which is lower than the sixth electric power P6, and evaporation of an organic material is terminated. Note that the substrate shutter is shut before the seventh electric power P7 is set.

At a substrate transfer point 81, the power source of the heater 19 is set to the seventh electric power P7 which is lower than the sixth electric power P6, whereby heating is continued and the manufacturing apparatus can be in a standby state (the same state as that of the point 70 of a standby state) again. The substrate transfer point 81 is a standby state, and the seventh temperature T7 is a temperature just before evaporation is started. Note that the seventh electric power P7 is the same as the third electric power P3.

Through the above procedure, film formation on the first substrate 10 can be performed. The substrate which has been subjected to film formation is transferred to the next deposition chamber.

The above procedure is an example in which evaporation is performed by rising the temperature of the container by the heater 19 after an organic material is supplied to the container from the nozzle. With the use of the manufacturing apparatus illustrated in FIG. 6, evaporation can be performed with the minimum amount of the organic material supplied to the container from the nozzle and minimum electric power for heating, which are required for one substrate, whereby manufacturing cost can be reduced. Further, it is preferable to precisely adjust the amount of the organic material supplied to the container from the nozzle, the electric power of the heater 19, and timings of electric application by the control portion 21. If necessary, a thickness monitor is provided in the deposition chamber, and the control portion 21 monitors and adjusts the amount of the organic material supplied, the electric power of the heater 19, and the timing of electric application.

Further, when film formation is performed on a second substrate in the deposition chamber, the first substrate is transferred from the deposition chamber at the substrate transfer point 81 after film formation on the first substrate is completed, a second supply of the material to the container is performed, the manufacturing apparatus is set in a standby state, and then the second substrate is introduced into the deposition chamber to be subjected to film formation.

A point of the second supply of the material represents a temperature change point 74 after the material mixed gas 16 is supplied. Film formation on the second substrate is started when the temperature of the container 20 reaches an eighth temperature T8 after supply of the material mixed gas 16. The electric power of the heater 19 is set to an eighth electric power P8 which is temporally high so that the temperature of the container 20 is increased to the eighth temperature T8 in a short time. Note that the eighth electric power P8 has the same value as the fourth electric power P4.

FIG. 6 illustrates an example in which the attachment protection plate is in contact with the supply tube. If a deposition film is formed on an outer wall of the supply tube, heat is diffused and decrease in the temperature of the supply tube might be caused; therefore, the supply tube is preferably heated. When the heated material mixed gas flows into the supply tube, the supply tube is also heated by the heated material mixed gas. It is preferable that the temperature of the supply tube be the same as the temperature $T_S$ of the attachment protection plate; accordingly, the attachment protection plate and the supply tube are welded and fixed to each other and the supply tube can also be heated utilizing heat from the small tube heater provided with the attachment protection plate. At least a portion of the supply tube provided in the deposition chamber is heated utilizing heat from the small tube heater provided with the attachment protection plate, so that clogging of the tube due to material attaching to an inner wall of the supply tube and material attachment to the outer wall of the supply tube can be prevented. In addition, clogging of the tube due to material attaching to the inner wall of the supply tube is preferably prevented by providing an additional heater with the supply tube provided outside the deposition chamber. Note that a structure is not limited to the one in FIG. 6 in which the attachment protection plate is in contact with the supply tube. The supply tube may be provided in such a manner that the supply tube penetrates either a top face or a bottom face of the deposition chamber as long as a heating means such as a small tube heater is twisted around a portion of the supply tube provided in the deposition chamber.

In addition, for prevention of heat diffusion, it is preferable to provide a thermal insulating material for a portion of the supply tube in contact with a wall of the deposition chamber so that the supply tube is surrounded, and to maintain the temperature of the supply tube. By provision of the thermal insulating material between the supply tube and the wall of the deposition chamber, heat of the supply tube is connected to a stainless steel member (or an aluminum member), so that local cooling of the supply tube can be prevented.

Further, cleaning is performed to remove a film or powder attached to the inner wall of the deposition chamber or the attachment protection plate. In addition, a film or powder attached to the inner wall of the deposition chamber or the attachment protection plate can be collected and reused.

Embodiment 2 can be freely combined with any of the other embodiments.

Embodiment 3

A procedure in which one substrate is processed is described in Embodiment 2. In Embodiment 3, a procedure in which a plurality of substrates is successively subjected to evaporation and an organic material is intermittently supplied to a container is described. Note that the same reference numerals are used for portions in common with those illustrated in Embodiments 1 and 2.

Figure 8A:
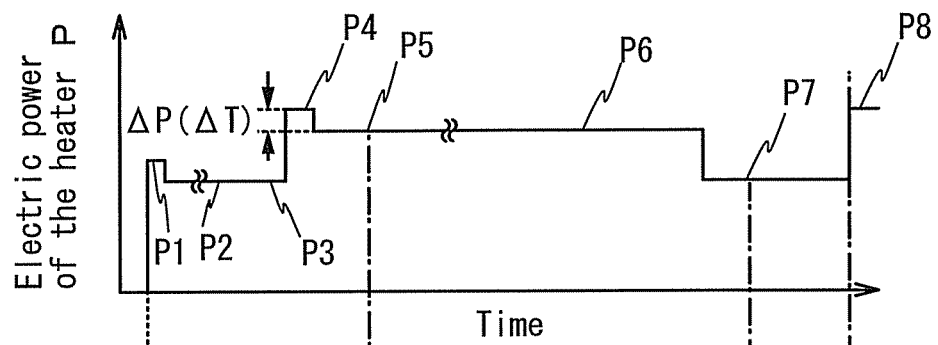
FIGS. 8A, 8B, and 8C are timing charts of a manufacturing apparatus of one embodiment of the present invention.
Figure 8B:
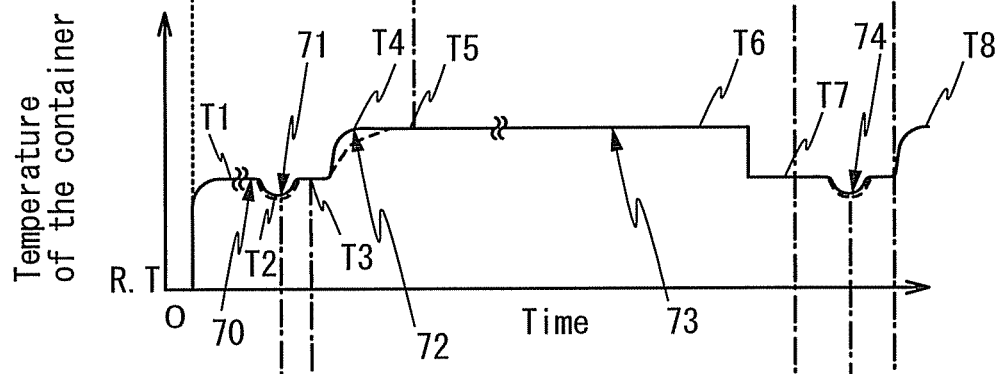
Figure 8C:
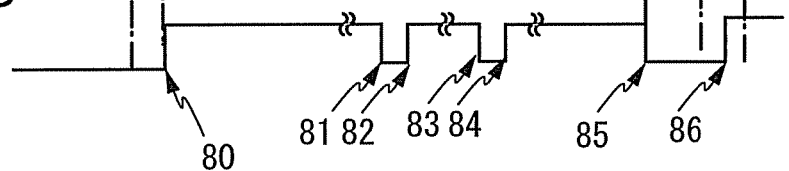

FIGS. 8A to 8C are timing charts each showing a procedure before and after evaporation on the substrate 10 and a procedure in which evaporation on a plurality of substrates is started. In FIG. 8A, the vertical axis represents electric power of the heater and the horizontal axis represents time. In FIG. 8B, the vertical axis represents a temperature of the container and the horizontal axis represents time. FIG. 8C shows a timing when the substrate is introduced into the deposition chamber 11 and a timing when the substrate is transferred to another treatment chamber (including a transfer chamber).

Embodiment 3 describes an example in which a first substrate is transferred from the deposition chamber after completion of film formation of the first substrate, in which a second supply of a material to a container is performed, and in which a second substrate is introduced into the deposition chamber after a standby state. Note that an additional chamber in which a substrate is made to stand by may be provided in the vacuum chamber.

In Embodiment 3, with the use of the manufacturing apparatus illustrated in FIG. 6, an amount of the material required for the plurality of the substrates is supplied at once to the container from the nozzle. The temperature change point 71 represents a state after supply of the material mixed gas 16.

A procedure up to which evaporation on the first substrate is performed, the power source of the heater 19 is set to the fifth electric power P5, and the temperature of the container reaches the fifth temperature T5 is the same as that in Embodiment 2; therefore, a procedure after that is described.

After the film formation of the first substrate is completed, a second substrate and a third substrate are intermittently introduced into the deposition chamber in sequence. In FIG. 8C, a second substrate introduction point 82, a second substrate transfer point 83, a third substrate introduction, point 84, and a third substrate transfer point 85 are shown. Although film formation is performed on three substrates for one supply of material in Embodiment 3, there is no limitation. Film formation may be performed on three or more substrates for one supply of material.

After that, a fourth substrate is introduced after second supply of material. A temperature change point 74 in FIG. 8B represents a state after the second supply. Further, a fourth substrate introduction point 86 is shown in FIG. 8C. Film formation on the fourth substrate is started from a point when the temperature of the container 20 reaches the eighth temperature T8 after the material mixed gas 16 is supplied. The power source of the heater 19 is set to the eighth electric power P8 which is temporally high so that the temperature of the container 20 is increased to the eighth temperature T8 in a short time. Note that the eighth electric power P8 is the same as the fourth electric power P4.

In the case where film formation treatment is subsequently performed on a fifth and following substrates after completion of the evaporation of the fourth substrate, the material supply and introduction and transfer of substrates are repeated. Embodiment 3 is suitable for mass production; thus, film formation can be performed on a plurality of the substrates with a high yield and throughput can also be improved.

Further, the procedure is not limited to that described above; a plurality of substrates may stand by in the deposition chamber in advance, film formation may be successively performed, and the plurality of the substrates may be transferred to the next deposition chamber after film formation on all substrates is completed. Here, "successive film formation" means that film formation is sequentially performed on the plurality of the substrates while the deposition chamber is kept under vacuum.

Although the size of the deposition chamber is increased, film deposition can be performed on a plurality of substrates at the same time in a short time in such a manner that a structure in which the plurality of substrates can be set in the deposition chamber is used, a plurality of containers which overlap with the respective substrates is placed, and a material gas is supplied from a plurality of nozzles.

Embodiment 3 can be freely combined with any of the other embodiments.

Embodiment 4

In Embodiment 4, an example of a container in which co-evaporation is performed is described with reference to FIGS. 9A to 9C.

Figure 9A:
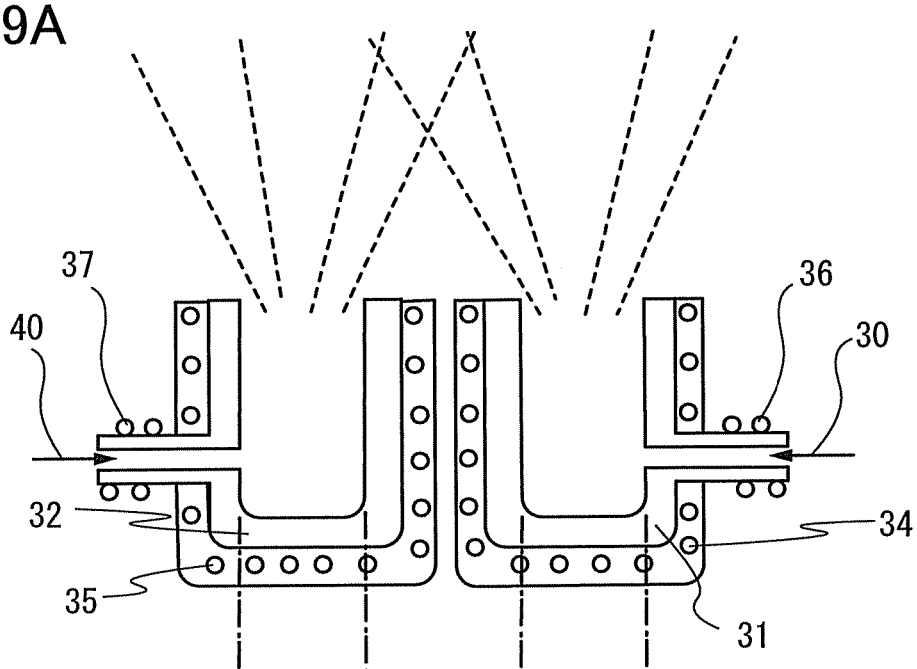
FIGS. 9A, 9B, and 9C are a cross-sectional view and top views of part of a deposition chamber of one embodiment of the present invention.

FIG. 9A is a cross-sectional view of a first container 31, a heater 34 surrounding the first container, a first supply tube 38 connected to the first container, and a small tube heater 36 surrounding the first supply tube 38. A material mixed gas 30 supplied from the first supply tube 38 is introduced into the first container 31, sublimed by heat from the heater 34, and scattered.

The cross-sectional view in FIG. 9A also illustrates a second container 32, a heater 35 surrounding the second container, a second supply tube 39 coupled with the second container, and a small tube heater 37 surrounding the second supply tube 39.

A material mixed gas 40 supplied from the second supply tube 39 is introduced into the second container 32, sublimed by heat from the heater 35, and scattered.

Further, the material mixed gas 30 supplied from the first supply tube 38 is different from the material mixed gas 40 supplied from the second supply tube 39, whereby co-evaporation can be performed. A first organic compound material scattered from an opening of the second container 32 is mixed with a second organic material compound scattered from an opening of the first container 31 by the time the two organic compound materials reach a substrate, whereby co-evaporation is performed on the substrate.

Further, the small tube heater 36 surrounding the first supply tube 38 and the small tube heater 37 surrounding the second supply tube 39 heat the material mixed gas 30 supplied from the first supply tube 38 and the material mixed gas 40 supplied from the second supply tube 39 so that the temperature of each supply tube reaches the third temperature T3 shown in Embodiment 2.

As the material mixed gas 30 supplied from the first supply tube 38, an organic material is sent by an air gun which supplies a carrier gas such as nitrogen, argon, or helium. Further, in consideration of a heat capacity of each container, the small tube heater 36 surrounding the first supply tube 38 and the small tube heater 37 surrounding the second supply tube 39 can also be set to the temperature in which the temperature of each supply tube reaches the fifth temperature T5 described in Embodiment 2 or a temperature close thereto.

Electric power of the heater 34 surrounding the first container and the heater 35 surrounding the second container is controlled and the temperature of the first container 31 and that of the second container 32 are adjusted to the first temperature T1 to the seventh temperature T7 described in Embodiment 2, as appropriate, to perform evaporation.

Further, the heater 34 surrounding the first container and the heater 35 surrounding the second container are preferably set to the fifth temperature T5 or above so that an evaporated material is not attached around the opening of the first container and the opening of the second container.

Figure 9B:
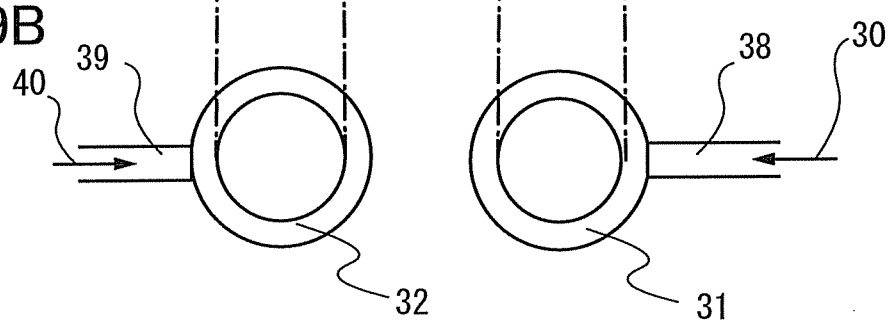

FIG. 9B is a top view of FIG. 9A. FIG. 9B illustrates the first container 31, the first supply tube 38 coupled with the first container, the second container 32, and the second supply tube 39 coupled with the second container.

The manufacturing apparatus can be manufactured by replacing the containers, the supply tubes, and the heaters illustrated in FIGS. 9A and 9B with the nozzle 18, the container 20, and the heater 19 in Embodiment 2.

Figure 9C:
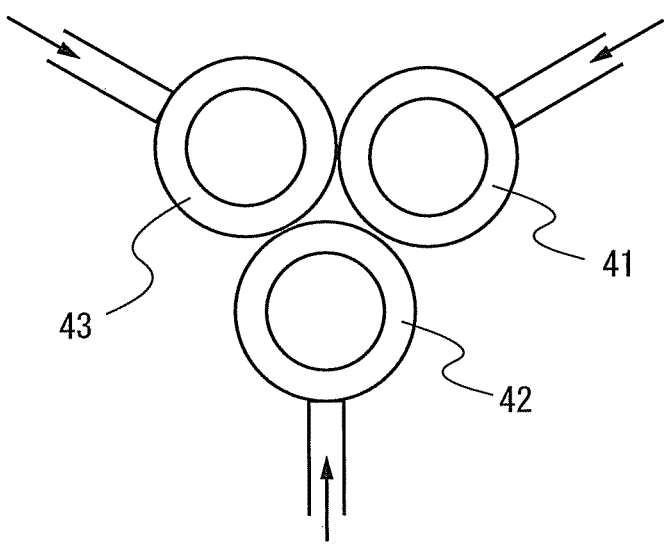

When co-evaporation is performed using three containers, a first container 41, a second container 42, and a third container 43 may be placed as illustrated in FIG. 9C. FIG. 9C is a top view. Heaters and a supply tube provided for each of the three containers may be the same as those illustrated in FIG. 9A. A different material is supplied from each of the three containers illustrated in FIG. 9C, so that a film including three kinds of organic compounds can be formed.

Further, the manufacturing apparatus can be manufactured by replacing the containers, the supply tubes, and the heaters illustrated in FIG. 9C with the nozzle 18, the container 20, and the heater 19 in Embodiment 2.

Embodiment 4 can be freely combined with any of the other embodiments.

Embodiment 5

Figure 10:
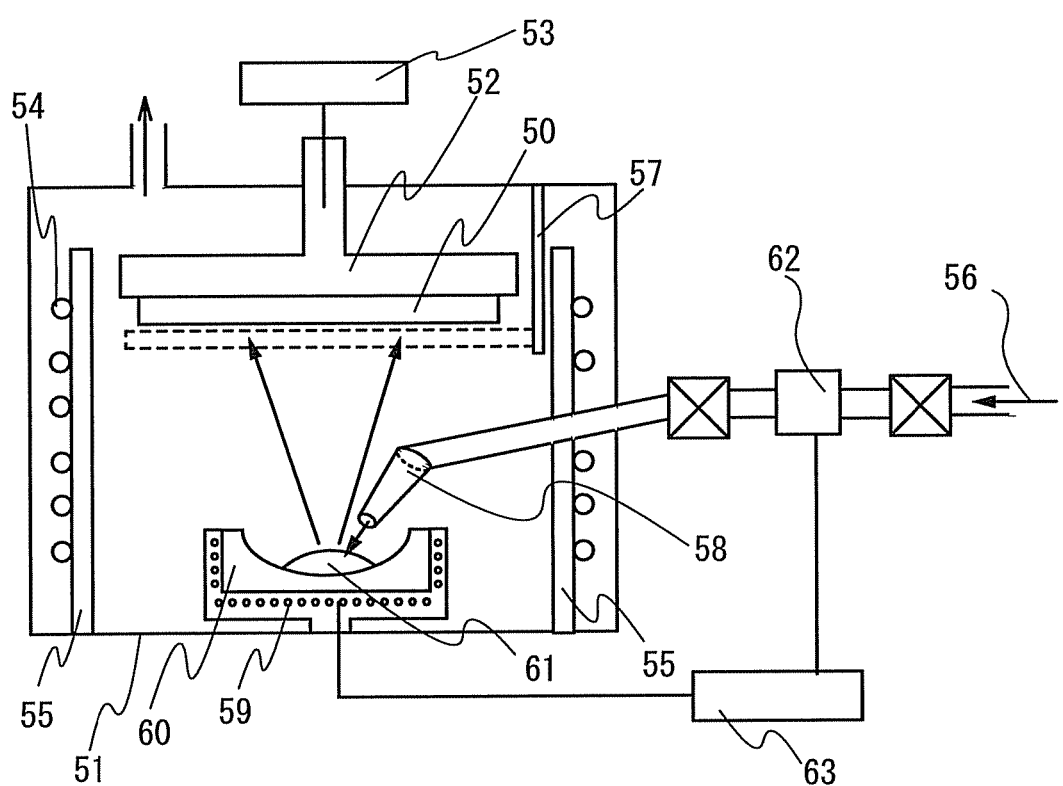
FIG. 10 is a cross-sectional view of a deposition chamber of another embodiment of the present invention.

In Embodiment 5, another example of the deposition chamber where evaporation of an organic material is performed is described. FIG. 10 is a cross section of a schematic configuration view.

In FIG. 10, a deposition chamber 51 is provided in a vacuum chamber provided with a vacuum evacuation means and is provided with an inert gas introduction means. Note that the inert gas introduction means is used when the deposition chamber 51 is filled with an inert gas after vacuum evacuation is performed. Further, the deposition chamber 51 is provided with a substrate holding means 52 to fix a substrate 50 and further provided with a substrate rotation control portion 53 for increase in uniformity of a film thickness. Further, small tube heater 54 such as a heating wire is provided in contact with an attachment protection plate 55 which prevents attachment to an inner wall of the deposition chamber 51. Moreover, opening and closing of a shutter is performed by rotation of a shutter shaft 57.

In Embodiment 5, a heater 59 which heats a container 60 performs preheating of an organic material 61, and the organic material 61 is heated to a temperature lower than a sublimation temperature of the organic material 61 by the heater 59. In addition, a heated gas 56 is introduced toward the organic material 61 from a nozzle 58, whereby the organic material 61 is heated to its sublimation temperature or higher. Note that a temperature of the heated gas supplied from the nozzle is higher than the temperature of the container ($T_C$), and the organic material 61 in the container 60 is heated to the sublimation temperature of the organic material 61 or higher.

In Embodiment 5, a method for supplying the organic material 61 to the container 60 is not limited to a method for supplying by airflow. A method for supplying the organic material 61 in a rod form, in a wire form, in a powdery form, or in a state of being attached to a flexible film by a mechanical mechanism (mechanism to rotate a screw provided in the supply tube or the like) may be used. Further, a nozzle which supplies an organic material to the container by airflow may be provided in addition to the nozzle 58 supplying the heated gas 56.

Moreover, a control portion 63 adjusts a flow rate of a flowmeter 62 provided between two valves and a temperature of the heater 59. In addition, the control portion 63 may have a function of monitoring a temperature sensor provided in the supply tube so that a temperature of the gas flowing into the supply tube can be adjusted.

In the case where an inert gas supplied from an exhaust port of the nozzle 58 is not heated, the nozzle 58 can function as an inert gas introduction means when the deposition chamber is filled with an inert gas after vacuum evacuation in the vacuum chamber is performed, whereby the number of a supply system can be reduced by one.

Note that Embodiment 5 can be freely combined with any of the other embodiments.

Embodiment 6

In Embodiment 6, one embodiment of a lighting device which is manufactured using the manufacturing apparatus described in any one of above embodiments is described with reference to FIG. 11 and FIGS. 12A and 12B.

Figure 11:
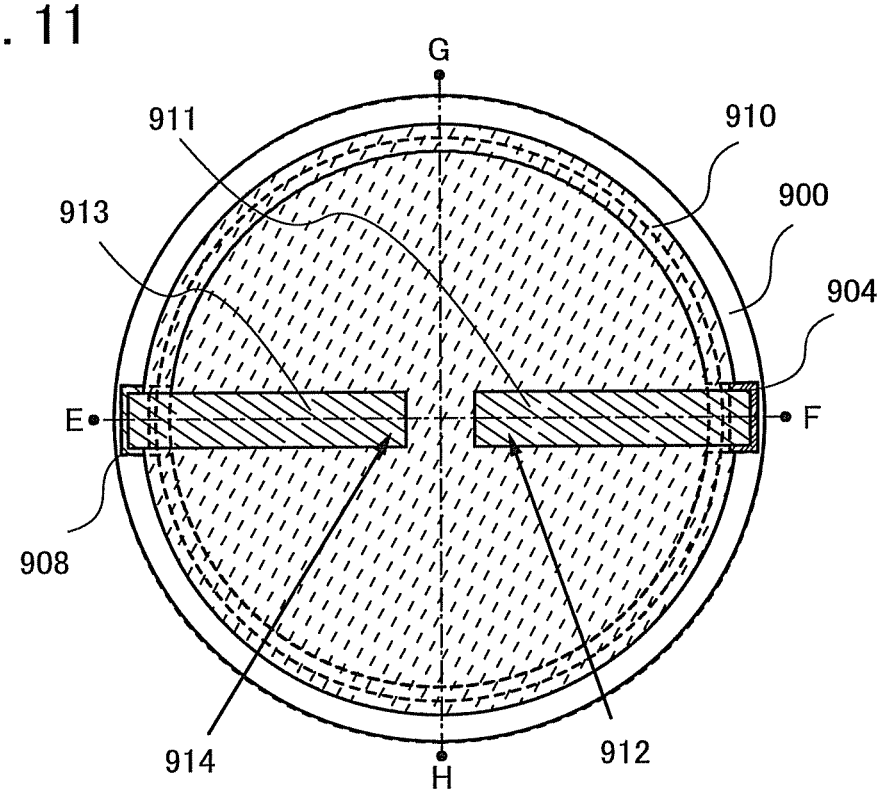
FIG. 11 is an example of a lighting device.

FIG. 11 is a plan view of a lighting device. FIG. 12A is a cross-sectional view taken along line E-F in FIG. 11, and FIG. 12B is a cross-sectional view taken along line G-H in FIG. 11.

A light-emitting element 932 including a first electrode layer 904, an EL layer 906, and a second electrode layer 908 is formed over a substrate 900 over which an insulating film 902 is provided as a base protective film (a barrier layer), and the light-emitting element 932 is covered with an insulating film 910 except for part of the first electrode layer 904 and part of the second electrode layer 908. The insulating film 910 serves as a protective layer or a sealing film, which protects the EL layer 906 of the light-emitting element from an external contaminant such as moisture. The substrate 900 has a round shape (a disk shape, a saucer shape, or a circular shape), and a member over which a thin film used for forming the light-emitting element 932 can be formed is used.

Since the substrate 900 has a round shape, shapes of the insulating film 902, the first electrode layer 904, the EL layer 906, the second electrode layer 908, and the insulating film 910, which are stacked over the substrate 900, reflect the shape of the substrate 900 and are formed to have substantially a round shape.

The first electrode layer 904 and the second electrode layer 908 are extended to a peripheral portion of the substrate 900 in order to be connected to a first auxiliary wiring 911 and a second auxiliary wiring 913, respectively, which are formed over the insulating film 910. The first electrode layer 904 and the second electrode layer 908 are exposed in the extended region without being covered by the insulating film 910. The exposed region of the first electrode layer 904 and the exposed region of the second electrode layer 908 become a connection portion between the first electrode layer 904 and the first auxiliary wiring 911 and a connection portion between the second electrode layer 908 and the second auxiliary wiring 913, respectively.

The first auxiliary wiring 911 is formed in contact with the exposed region in which the first electrode layer 904 is extended, and similarly, the second auxiliary wiring 913 is formed in contact with the exposed region in which the second electrode layer 908 is extended. The first auxiliary wiring 911 and the second auxiliary wiring 913 serve as terminals on a lighting device side for being connected to a terminal of an external power source, and respectively include a first connection portion 912 (also referred to as a first terminal portion of the lighting device) and a second connection portion 914 (also referred to as a second terminal portion of the lighting device), which are connected to the terminal of the external power source. The first auxiliary wiring 911 and the second auxiliary wiring 913 enable the first connection portion 912 serving as a connection portion of the first electrode layer 904 and the second connection portion 914 serving as a connection portion of the second electrode layer 908 to be provided in the central portion of the circular-shaped substrate on the same plane as the light-emitting element 932. Note that in this specification, a central portion of the substrate or the lighting device means the center and a region including the vicinity of the center.

In the peripheral portion E of the substrate 900, the first electrode layer 904 is formed over the insulating film 902, the EL layer 906 is stacked over the first electrode layer 904 so as to cover an end portion of the first electrode layer 904, and the second electrode layer 908 is formed over the EL layer 906 so as to cover an end portion of the EL layer 906 and to be extended to the peripheral portion E side of the substrate 900. The region to which the second electrode layer 908 is extended is exposed without formation of the insulating film 910 stacked over the second electrode layer 908. The second auxiliary wiring 913 is formed in contact with the exposed region of the second electrode layer 908 over the insulating film 910 to the central portion of the substrate 900. Accordingly, the second connection portion 914 with the external power source can be formed in the central portion of the substrate 900 using the second auxiliary wiring 913 which is electrically connected to the second electrode layer 908.

In the peripheral portion F of the substrate 900, the first electrode layer 904 is formed over the insulating film 902 to be extended to the peripheral portion F side of the substrate 900. The EL layer 906 and the second electrode layer 908 are stacked over the first electrode layer 904, and the insulating film 910 is formed over the EL layer 906 and the second electrode layer 908 so as to cover end portions of the EL layer 906 and the second electrode layer 908. In the peripheral portion F, the region to which the first electrode layer 904 is extended is exposed without formation of the EL layer 906, the second electrode layer 908, and the insulating film 910 stacked over the first electrode layer 904. The first auxiliary wiring 911 is formed in contact with the exposed region of the first electrode layer 904 over the insulating film 910 to the central portion of the substrate 900. Accordingly, the first connection portion 912 with the external power source can be formed in the central portion of the substrate 900 using the first auxiliary wiring 911 which is electrically connected to the first electrode layer 904.

In the peripheral portions G and H of the substrate 900, the first electrode layer 904 is formed over the insulating film 902, the EL layer 906 is formed over the first electrode layer 904 so as to cover the first electrode layer 904, and the second electrode layer 908 is formed over the EL layer 906. The insulating film 910 is formed over the first electrode layer 904, the EL layer 906, and the second electrode layer 908 so as to cover the end portions of the EL layer 906 and the second electrode layer 908.

Thus, in the lighting device, the EL layer 906 is formed between the first electrode layer 904 and the second electrode layer 908 so that the first electrode layer 904 and the second electrode layer 908 are not in contact with each other. In addition, the end portion of the EL layer 906 is cover with either the insulating film 910 or the second electrode layer 908.

Thus, in the light-emitting element 932, stable light emission can be obtained from the light-emitting element 932 without short caused due to contact between the first electrode layer 904 and the second electrode layer 908. In addition, deterioration of the EL layer due to moisture or the like can be prevented; thus, reliability of the lighting device can be increased.

The lighting device of Embodiment 6 is a lighting device in which light from the EL layer 906 is extracted through the first electrode layer 904, the insulating film 902, and the substrate 900. Therefore, the first electrode layer 904, the insulating film 902, and the substrate 900 need to have a light-transmitting property so that light from the EL layer 906 is transmitted. Note that in this specification, a light-transmitting property means a property to transmit light at least of a wavelength region of visible light.

On the other hand, a light-transmitting property is not necessarily required for the second electrode layer 908, the insulating film 910, the first auxiliary wiring 911, and the second auxiliary wiring 913. When the second electrode layer 908 has reflectivity, light-extraction efficiency from the substrate 900 side can be increased.

As a specific example of a member used for the substrate 900, plastic (a flexible substrate), glass, quartz, or the like can be given. As an example of plastic, a member made from polycarbonate, polyarylate, polyethersulfone, or the like can be given. Alternatively, a film (made of polypropylene, polyester, vinyl, polyvinyl fluoride, vinyl chloride, or the like), an inorganic deposition film, or the like can be used. Alternatively, the substrate 900 may be formed using any other material as long as it can serve as a support in a manufacturing process of the light-emitting element.

The size of the substrate 900 can be set as appropriate in accordance with use application of the lighting device; however, the substrate 900 preferably has the size similar to that of an optical disk device such as a CD-R (for example, a saucer shape with a diameter of 10 cm to 14 cm, preferably a saucer shape with a diameter of 12 cm) in terms of productivity and handling.

Accordingly, the lighting device illustrated in FIG. 11 and FIGS. 12A and 12B has a saucer shape with a diameter of 10 cm to 14 cm, preferably with a diameter of 12 cm, and with a thickness of 1.2 mm to 1.5 mm.

The insulating film 902 serving as a base protective film is formed using an inorganic compound to be a single layer or a multilayer, for example. As a typical example of an inorganic compound, silicon oxide, silicon nitride, silicon oxynitride, silicon nitride oxide, or the like can be given. Alternatively, a film containing zinc sulfide and silicon oxide (a $ZnS.SiO_2$ film) may be used for the insulating film 902. Note that when silicon nitride, silicon nitride oxide, silicon oxynitride, or the like is used for the insulating film 902, moisture or gas such as oxygen can be prevented from entering the EL layer from outside.

As the insulating film 910 serving as a protective film or a sealing film, for example, an inorganic compound or an organic compound can be used to be a single layer or a multilayer. In Embodiment 6, the insulating film is formed with an inorganic compound in a single layer or a multilayer. As a typical example of the inorganic compound, silicon oxide, silicon nitride, silicon oxynitride, silicon nitride oxide, aluminum nitride, aluminum oxynitride, aluminum nitride oxide, aluminum oxide, diamond-like carbon (DLC), carbon containing nitrogen, or the like can be given. Alternatively, a film containing zinc sulfide and silicon oxide (a $ZnS.SiO_2$ film) can be used for the insulating film 910.

Alternatively, an organic material such as polyimide, acrylic, benzocyclobutene, polyamide, or epoxy can be used. Other than such organic materials, it is also possible to use a low-dielectric constant material (a low-k material), a siloxane-based resin, PSG (phosphosilicate glass), BPSG (borophosphosilicate glass), or the like.

Note that a siloxane-based resin corresponds to a resin including a Si—O—Si bond formed using a siloxane-based material as a starting material. A siloxane-based resin may include an organic group (e.g., an alkyl group or an aryl group) or a fluoro group as a substituent. In addition, the organic group may include a fluoro group.

The first auxiliary wiring 911 and the second auxiliary wiring 913 can be formed with a single layer or a stacked layer using a conductive material such as aluminum (Al), titanium (Ti), tantalum (Ta), tungsten (W), molybdenum (Mo), chromium (Cr), neodymium (Nd), scandium (Sc), nickel (Ni), or copper (Cu) or an alloy material including any of these materials as its main component. Alternatively, the first auxiliary wiring 911 and the second auxiliary wiring 913 may be formed using a conductive material such as indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added.

The lighting device of Embodiment 6 can be manufactured through a simple manufacturing process, so that mass production can be realized. Further, the lighting device of Embodiment 6 has a structure in which elements do not deteriorate easily, whereby a lighting device with long lifetime can be provided. Furthermore, the lighting device of Embodiment 6 can be electrically connected to the external power source easily while reduction in thickness and weight is realized, whereby the lighting device can be used for various applications.

Note that Embodiment 6 can be freely combined with any of the other embodiments.

Embodiment 7

In Embodiment 7, an example in which a connection member is provided for the lighting device so that the lighting device described in Embodiment 6 is connected to an external power source is described with reference to FIG. 13, FIGS. 14A and 14B, FIGS. 15A and 15B, and FIGS. 16A and 16B.

Figure 13:
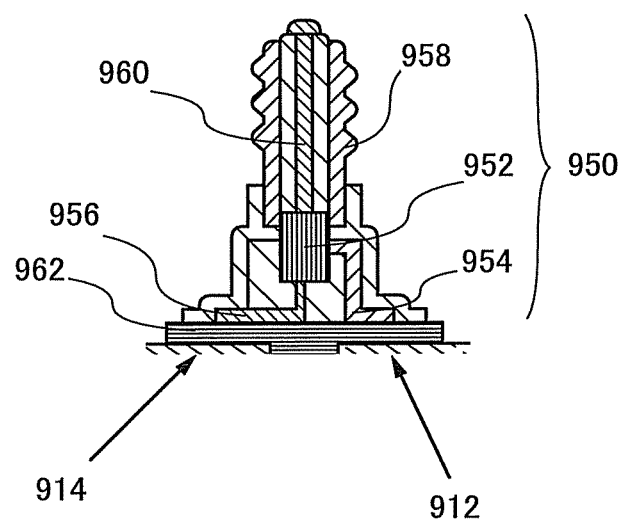
FIG. 13 is an example of a lighting device.
Figure 14A:
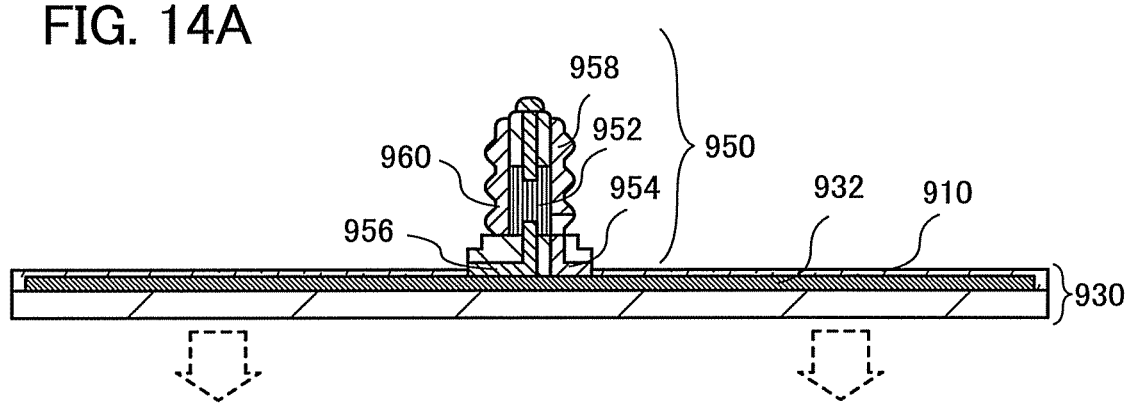
FIGS. 14A and 14B are examples of a lighting device.
Figure 14B:
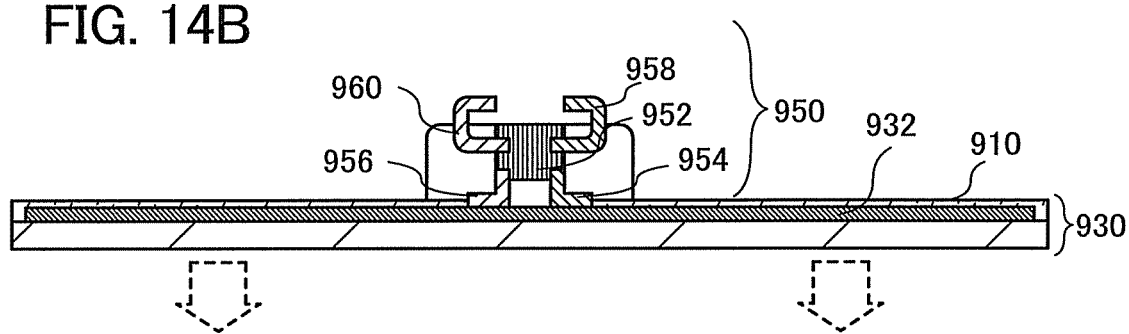

Each of FIGS. 14A and 14B is an example in which a connecting member is provided for the lighting device, and FIG. 13 illustrates a connection portion between the lighting device and the connection member in detail.

In FIGS. 14A and 14B, a connection member 950 (also referred to as a cap) is attached to a lighting device 930. The connection member 950 includes a control circuit 952, a first connection wiring 954, a second connection wiring 956, a first extraction wiring 958, and a second extraction wiring 960. The lighting device 930 includes the light-emitting element 932 and is sealed together with the insulating film 910 except for a connection portion. As the lighting device 930, the lighting device manufactured through a manufacturing process described in any of Embodiments 1 to 5 can be applied. The connection member 950 may have a diameter of 10 mm to 40 mm, typically a diameter of approximately 25 mm. In the lighting device manufactured through the manufacturing process shown in any of Embodiments 1 to 5, a connection portion with the connection member can be provided in a central portion, so that the connection member can be provided in the central portion of the lighting device.

As illustrated in FIG. 13, in the lighting device 930, the connection member 950 is electrically connected to the first connection portion 912 which is connected to the first electrode layer of the light-emitting element 932 and the second connection portion 914 which is connected to the second electrode layer of the light-emitting element 932 with an anisotropic conductive film 962 interposed therebetween. The first connection portion 912 is electrically connected to the first extraction wiring 958 through the first connection wiring 954 and the control circuit 952, and the second connection portion 914 is electrically connected to the second extraction wiring 960 through the second connection wiring 956 and the control circuit 952. The connection member 950 is connected to an external power source, whereby electric power is supplied from the external power source and the lighting device can be turned on.

The control circuit 952 is a circuit having a function of making the light-emitting element 932 light at a constant luminance using power source voltage supplied from the external power source, for example. The control circuit 952 includes a rectifying and smoothing circuit, a constant voltage circuit, and a constant current circuit, for example. A rectifying and smoothing circuit is a circuit for converting alternating voltage supplied from an external alternating power source into direct voltage. The rectifying and smoothing circuit may be formed by a combination of a diode bridge circuit, a smoothing capacitor, and the like, for example. A constant voltage circuit is a circuit for outputting a signal of stabilized constant voltage which is converted from direct voltage including a ripple output from the rectifying and smoothing circuit. The constant voltage circuit may be formed using a switching regulator, a series regulator, or the like. A constant current circuit is a circuit for outputting constant current to the light-emitting element 932 in accordance with voltage of the constant voltage circuit. The constant current circuit may be formed using a transistor or the like. Here, the case where a commercial alternating current power source is used as an external power source is assumed, and an example in which the rectifying and smoothing circuit is provided is described; however, in the case where a direct current power source is used as the external power source, the rectifying and smoothing circuit is not necessarily provided. Further, the control circuit 952 may include a circuit for controlling luminance, a protective circuit as a countermeasure against surge, or the like as necessary.

In FIG. 13, an example in which the anisotropic conductive film 962 is used for connecting the connection member 950 to the connection portions of the lighting device 930 is illustrated; however, a method and a structure are not limited thereto as long as the connection member 950 can be electrically connected to the connection portions of the lighting device 930. For example, a conductive film which is used for connecting the connection member 950 to the connection portions of the lighting device 930 is formed using a material which can be connected by a solder and solder may be used for connection.

The connection member 950 illustrated in FIG. 14A has a shape different from the connection member 950 illustrated in FIG. 14B. The connection member 950 can be in a variety of shapes as long as it includes a connection wiring which can be electrically connected to the lighting device 930 and an extraction wiring which can receive electric power from an external power source.

Figure 15A:
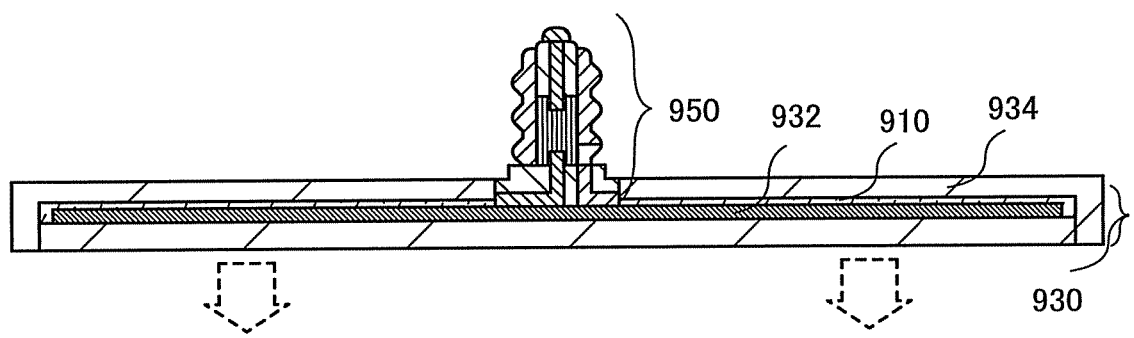
FIGS. 15A and 15B are examples of a lighting device.
Figure 15B:
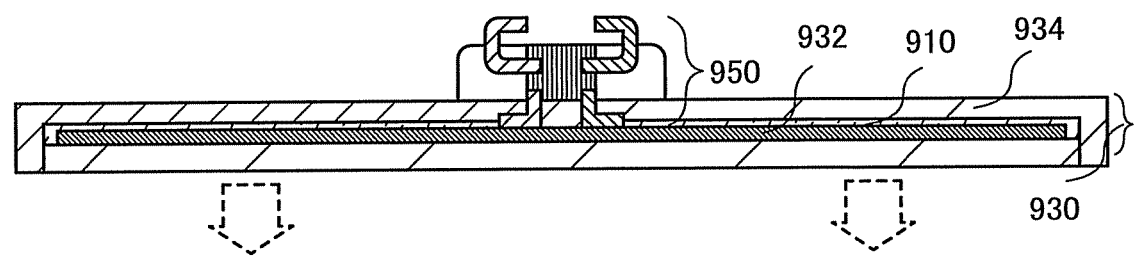

Each of FIGS. 15A and 15B is an example in which the connection member is provided for the lighting device, and a sealing substrate 934 is further provided over the insulating film 910 of the lighting device 930 illustrated in FIGS. 14A and 14B in order to seal the light-emitting element 932.

The light-emitting element 932 is sealed with the sealing substrate 934, so that the light-emitting element 932 is between the sealing substrate 934 and the substrate 900, whereby entry of moisture or substance which deteriorates the light-emitting element from outside can be further prevented. In addition, since physical impact from outside can be relieved, physical strength of the lighting device can be increased. Accordingly, reliability of the lighting device is improved, the environment where the lighting device can be used is widened, and the lighting device can be used for a variety of applications.

Figure 16A:
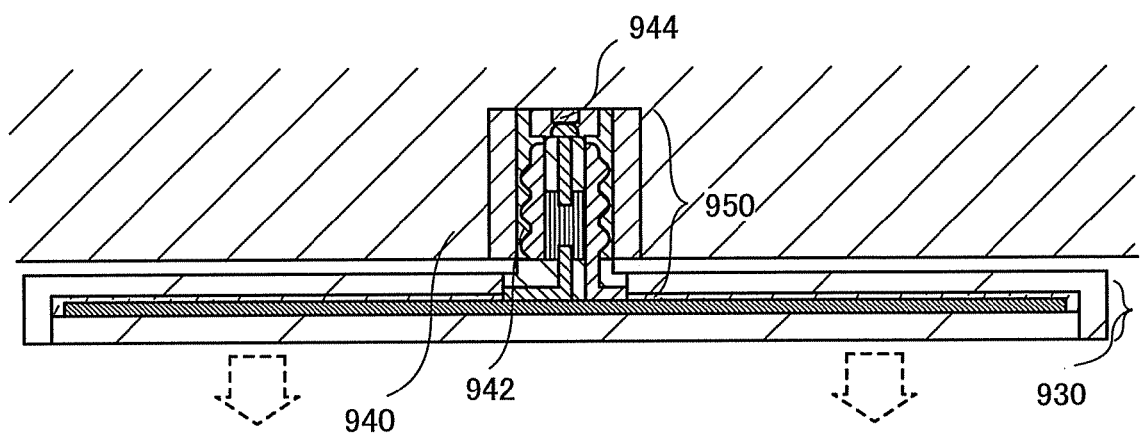
FIGS. 16A and 16B are examples of a lighting device.
Figure 16B:
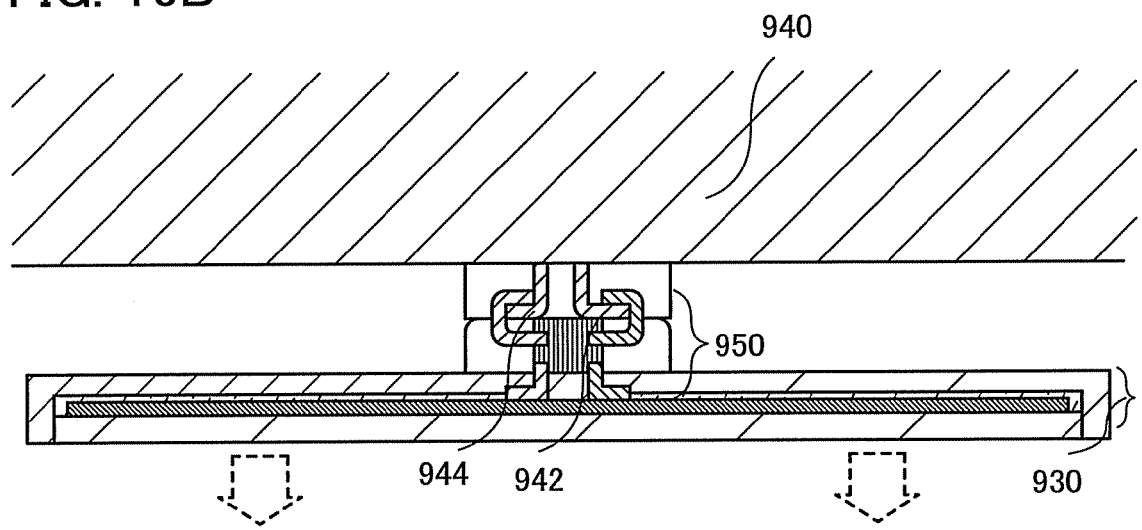

FIGS. 16A and 16B illustrate usage examples of the lighting device 930 provided with the connection members 950 of FIGS. 15A and 15B, respectively. FIG. 16A is an example in which the lighting device 930 is screwed into a ceiling 940 in accordance with a shape of the connection member 950, and FIG. 16B is an example in which the lighting device 930 is hung from the ceiling 940 (also referred to as a twist locking socket). In FIGS. 16A and 16B, the first extraction wiring and the second extraction wiring of the connection member 950 are connected to a first external electrode 942 and a second external electrode 944, respectively, to provide electricity for the lighting device 930.

It is preferable that the sealing substrate 934 have a shape similar to that of the substrate 900 which is opposite to the sealing substrate 934 with the light-emitting element 932 interposed therebetween, and a round shape (a disk shape, a saucer shape, or a circular shape) is preferable. Further, the sealing substrate 934 has an opening for attaching the connection member 950. It is preferable that the sealing substrate 934 have a concave cross-section and the lighting device 930 be engaged inside the sealing substrate 934 as illustrated in FIGS. 15A and 15B. A moisture-absorbing substance serving as a drying agent may be provided on a lighting device 930 side of the sealing substrate 934. For example, a film of moisture-absorbing substance such as barium oxide may be formed on the sealing substrate 934 by a sputtering method. Such a film functioning as a drying agent may be formed on the insulating film 910.

As a specific example of a member used for the sealing substrate 934, plastic (a flexible substrate), glass, quartz, ceramic, a metal, or the like can be given. As an example of plastic, a member made from polycarbonate, polyarylate, polyethersulfone, or the like can be given. Alternatively, a film (made of polypropylene, polyester, vinyl, polyvinyl fluoride, vinyl chloride, or the like), an inorganic deposition film, or the like can be used. Alternatively, any other material can be used as long as it can serve as a sealing substrate of a light-emitting element.

The lighting device of Embodiment 7 can be manufactured through a simple manufacturing process, so that mass production can be realized. Further, the lighting device of Embodiment 7 has a structure in which elements are less likely deteriorated, whereby a lighting device with long lifetime can be provided. Furthermore, the lighting device of Embodiment 7 makes electrical connection with the external power source easy while reduction in thickness and weight is realized, whereby the lighting device can be used for various applications.

Embodiment 7 can be implemented in appropriate combination with any of the structures described in the other embodiments.

Embodiment 8

In Embodiment 8, an example of a lighting device in which an electroluminescent (EL) material is formed over a substrate provided with an opening portion is described with reference to drawings.

In the lighting device shown in Embodiment 8, a first electrode layer, an EL layer, and a second electrode layer are stacked over a substrate having an opening portion in a central portion, and a first connection portion and a second connection portion are provided in the central portion of the substrate. Note that the lighting device of Embodiment 8 can be manufactured using the manufacturing apparatus described in the other embodiments.

Figure 17:
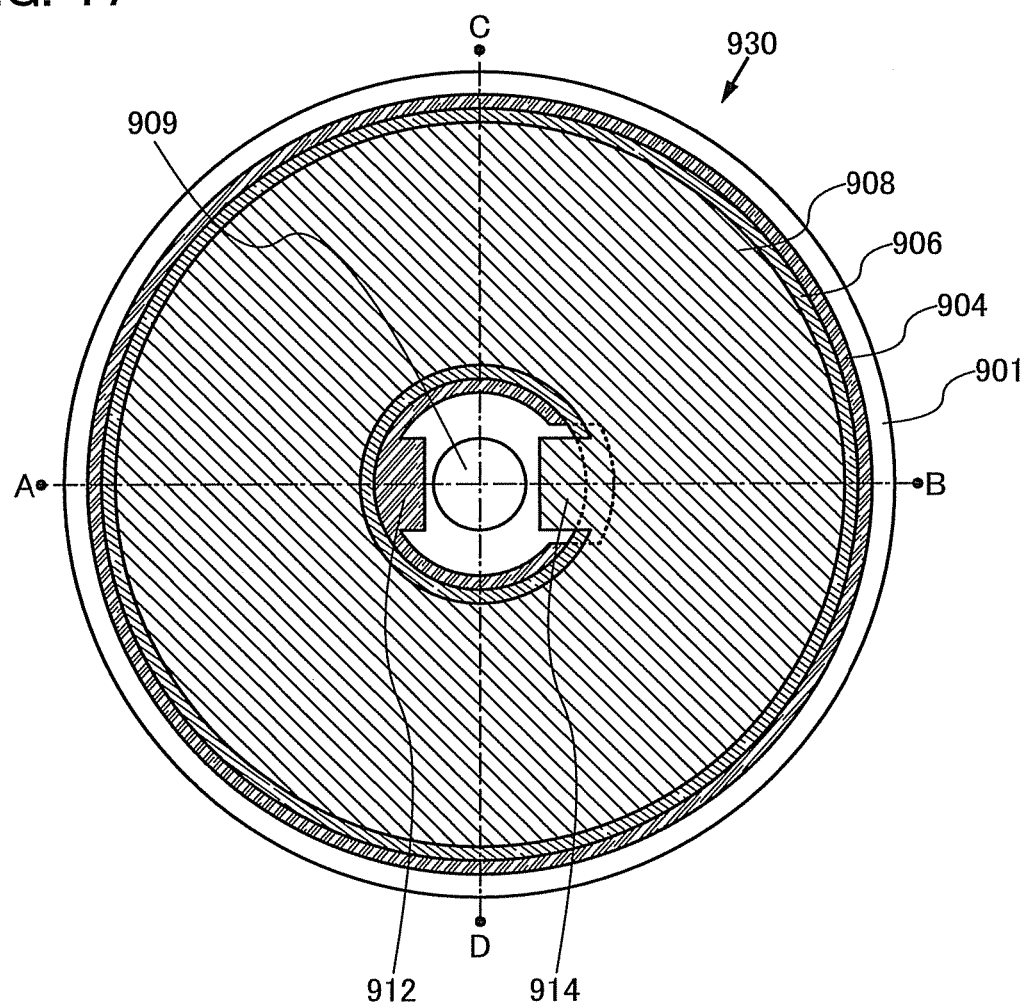
FIG. 17 is an example of a lighting device.

Hereinafter, a specific structure is described with reference to FIG. 17 and FIGS. 18A and 18B. FIG. 17 is a plan exemplary view of the lighting device. FIG. 18A is a cross-sectional exemplary view taken along line A-B in FIG. 17, and FIG. 18B is a cross-sectional exemplary view taken along line C-D in FIG. 17.

The lighting device 930 illustrated in FIG. 17 and FIGS. 18A and 18B includes a saucer-shape substrate 901 having an opening portion 909 in a central portion, the light-emitting element 932 formed over the substrate 901 with the insulating film 902 interposed therebetween, the insulating film 910 provided so as to cover the light-emitting element 932, and the first connection portion 912 and the second connection portion 914 provided over the substrate 901.

The light-emitting element 932 has a stacked structure of the first electrode layer 904, the EL layer 906, and the second electrode layer 908. Here, as an example, the first electrode layer 904 is formed over the substrate 901 with the insulating film 902 interposed therebetween, the EL layer 906 is formed over the first electrode layer 904, and the second electrode layer 908 is formed over the EL layer 906.

The insulating film 910 has an opening portion 915 in the central portion of the substrate 901, and the first connection portion 912 and the second connection portion 914 are provided in the opening portion 915. Note that the opening portion 915 of the insulating film 910 is formed so that the area of the opening portion 915 is larger than the size of the opening portion 909 formed in the substrate 901 (the size of the opening portions in a surface parallel to the surface of the substrate 901).

The first connection portion 912 is provided using the first electrode layer 904 which is extracted (extended) to the opening portion 915, and the second connection portion 914 is provided using the second electrode layer 908 which is extracted to the opening portion 915. That is, part of the first electrode layer 904 is extracted (extended) to the opening portion 915 of the insulating film 910 and the first connection portion 912 is formed, and part of the second electrode layer 908 is extracted to the opening portion 915 of the insulating film 910 and the second connection portion 914 is formed.

Thus, the first electrode layer 904 and the second electrode layer 908, which are formed over the substrate 901, are extracted and the first connection portion 912 and the second connection portion 914 are formed over the substrate 901, whereby the lighting device 930 can be reduced in thickness.

Further, the first electrode layer 904 and the second electrode layer 908, which are formed over the substrate 901, are used as the first connection portion 912 and the second connection portion 914, respectively, whereby the structure of the lighting device 930 can be simplified and cost reduction can be achieved.

Further, with the use of the substrate 901 having the opening portion 909, the first connection portion 912 and the second connection portion 914 are provided in the central portion (specifically, an adjacent region of the opening portion 909) of the substrate 901, so that electric power can be externally supplied through the opening portion 909 formed in the substrate 901. As a result, in the lighting device, electric power can be supplied to the light-emitting element 932 from one point (the central portion of the substrate).

Further, in the structure illustrated in FIG. 17 and FIGS. 18A and 18B, similarly to the insulating film 910, the first electrode layer 904, the EL layer 906, and the second electrode layer 908 each has an opening portion in the central portion of the substrate. Part of the second electrode layer 908 is extracted to the opening portion of the first electrode layer 904, the EL layer 906, and the insulating film 910, whereby the second connection portion 914 is formed over the substrate 901. In this case, in a portion where part of the second electrode layer 908 extends beyond (crosses) an end portion of the first electrode layer 904 and an end portion of the EL layer 906, the end portion of the first electrode layer 904 can be cover with the EL layer 906 so that the first electrode layer 904 is not in contact with the second electrode layer 908.

In the structure illustrated in FIG. 17 and FIGS. 18A and 18B, on a peripheral portion of the substrate 901, the EL layer 906 is formed more on the inside than the first electrode layer 904 and the second electrode layer 908 is formed more on the inside than the EL layer 906; however, the structure is not limited thereto. Any structure can be used as long as the first electrode layer 904 and the second electrode layer 908 are insulated from each other.

For example, on the peripheral portion of the substrate 901, the EL layer 906 may be formed so as to cover the end portion of the first electrode layer 904 and the second electrode layer 908 may be formed so as to cover the end portion of the EL layer 906. In this case, on the peripheral portion of the substrate 901, the EL layer 906 is formed more on the inside than the second electrode layer 908 and the first electrode layer 904 is formed more on the inside than the EL layer 906.

Alternatively, on the peripheral portion of the substrate 901, the EL layer 906 may be formed so as to cover an end portion of the first electrode layer 904 and the second electrode layer 908 may be formed so as not to extend beyond the end portion of the EL layer 906. In this case, on the peripheral portion of the substrate 901, the first electrode layer 904 and the second electrode layer 908 are formed more on the inside than the EL layer 906.

Note that in FIG. 17, a case where the first connection portion 912 formed using the first electrode layer 904 and the second connection portion 914 formed using the second electrode layer 908 are provided to face each other is illustrated; however, Embodiment 8 is not limited thereto. At least the first connection portion 912 and the second connection portion 914 may be formed in the opening portion 915 in the insulating film 910.

Further, a plurality of the first connection portions 912 and the second connection portions 914 may be provided. By providing the plurality of the first connection portions and the second connection portions, connection between the first connection portions or the second connection portions and a wiring or the like which is electrically connected thereto can be preferably performed.

Note that what is illustrated in the drawings in Embodiment 8 can be freely combined with or replaced with what is described in other embodiments, as appropriate.

Embodiment 9

In Embodiment 9, as a usage example of the lighting device, a structure in which the lighting device 930 shown in Embodiment 8 is provided with the connection member 950 is described with reference to FIGS. 19A to 19D, FIGS. 20A to 20D, and FIG. 21. Note that the connection member 950 is also referred to as a base in some cases. Further, the lighting device 930 and the connection member 950 may be collectively referred to as a lighting device.

The connection member 950 includes the control circuit 952, the first connection wiring 954 electrically connected to the control circuit 952, the second connection wiring 956, the first extraction wiring 958, and the second extraction wiring 960.

The control circuit 952 is a circuit having a function of making the light-emitting element 932 light at a constant luminance using power source voltage supplied from the external power source.

The first connection wiring 954 and the second connection wiring 956 serve as wirings which electrically connect the light-emitting element 932 provided for the lighting device 930 to the control circuit 952. In particular, the first connection wiring 954 is electrically connected to the first connection portion 912 provided over the substrate 901 and the second connection wiring 956 is electrically connected to the second connection portion 914 provided over the substrate 901 (see FIG. 21).

Figure 21:
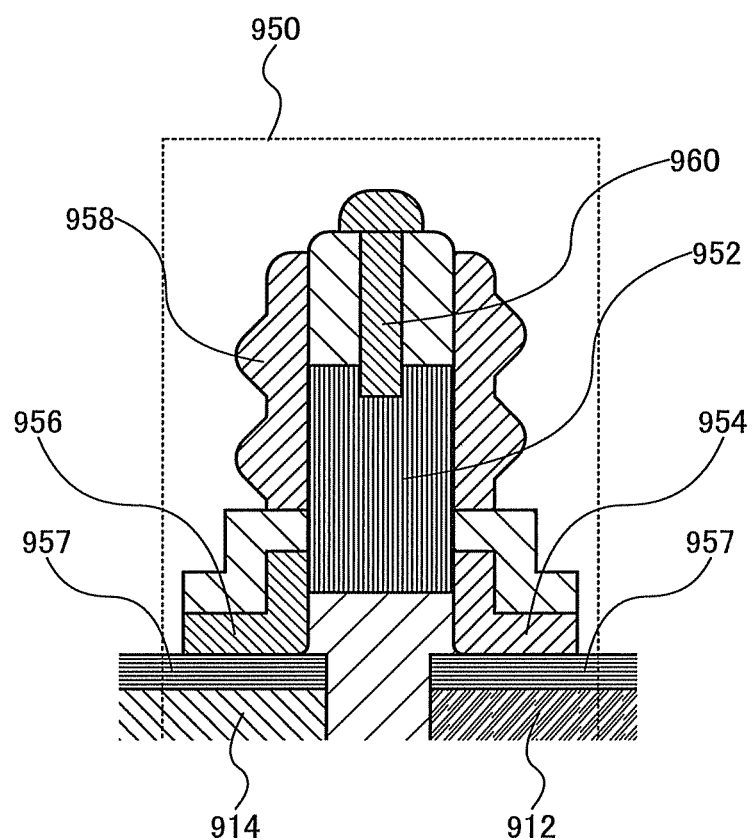
FIG. 21 is an example of a lighting device.

As illustrated in FIG. 21, an anisotropic conductive paste 957 can be used for electrical connection between the first connection wiring 954 and the first connection portion 912 and electrical connection between the second connection wiring 956 and the second connection portion 914. Note that electrical connection can be performed by pressure-bonding using an anisotropic conductive film (ACF) or the like as well as using an anisotropic conductive paste (ACP). Alternatively, connection can be performed using a conductive adhesive agent such as a silver paste, a copper paste, or a carbon paste, using solder bonding, or the like.

The first extraction wiring 958 and the second extraction wiring 960 are electrically connected to the control circuit 952 and serve as wirings for supplying power source for the lighting device 930 from outside.

Figure 19A:
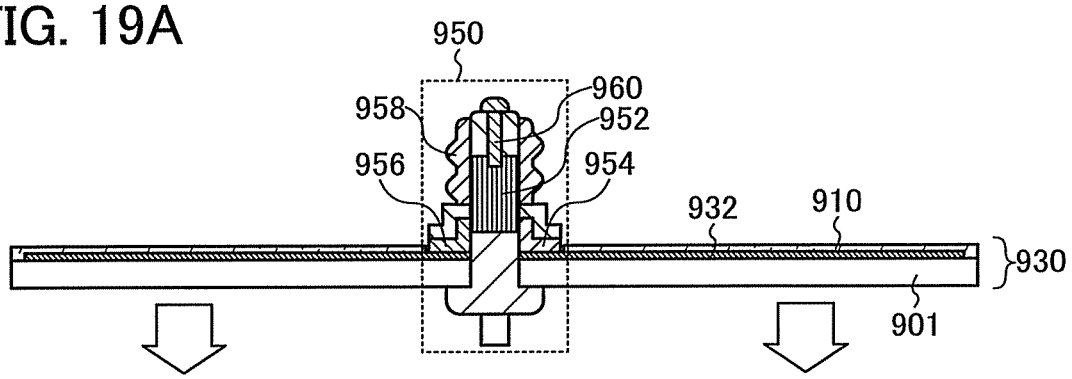
FIGS. 19A to 19D are examples of a lighting device.

FIG. 19A illustrates a structure (a bottom emission structure) in which light is extracted from a surface side provided with the substrate 901 (a surface opposite to a surface provided with the insulating film 910) through the substrate 901. In this case, the control circuit 952 of the connection member 950 can be provided above the insulating film 910.

Figure 19B:
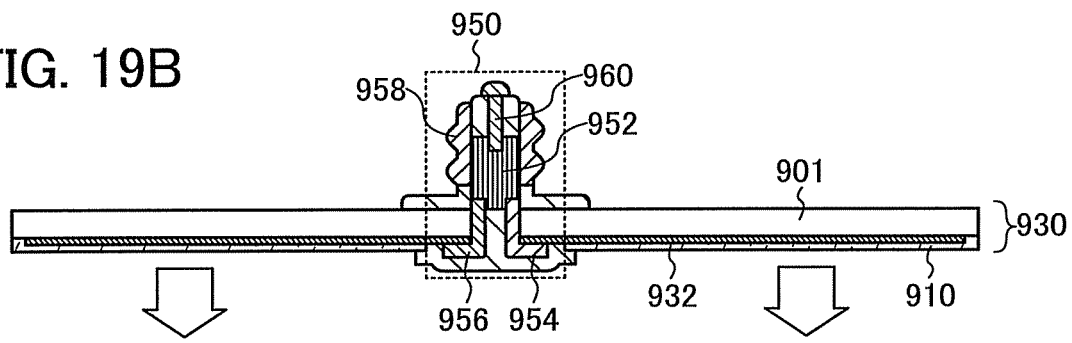

However, the structure of light extraction from the light-emitting element 932 is not limited to the one illustrated in FIG. 19A. As illustrated in FIG. 19B, a structure (a top emission structure) in which light is extracted from a surface side provided with the insulating film 910 (a surface opposite to the substrate 901) may be used. In this case, a rear surface side of the substrate 901 (a surface opposite to a surface provided with the light-emitting element 932) is provided with the control circuit 952, and the first connection wiring 954 and the second connection wiring 956 can be electrically connected to the light-emitting element 932 through the opening portion provided in the substrate 901.

In addition, in the structures illustrated in FIGS. 19A and 19B, a drying agent is preferably provided on a surface opposite to a surface through which light is extracted (that is, a surface over the insulating film 910 in FIG. 19A and a rear surface of the substrate 901 in FIG. 19B). The drying agent can be formed by sputtering or the like. In particular, when the drying agent is provided on the rear surface side of the substrate 901, the drying agent can be formed on the entire surface by sputtering.

Although a bonding portion of the connection member 950 serves also as the first extraction wiring 958 and a contact point of the connection member 950 is connected to the second extraction wiring 960 in FIGS. 19A and 19B, the structure is not limited thereto. For another example, as illustrated in FIGS. 19C and 19D, two connection portions of the connection member 950 may serve also as the first extraction wiring 958 and the second extraction wiring 960.

Figure 19C:
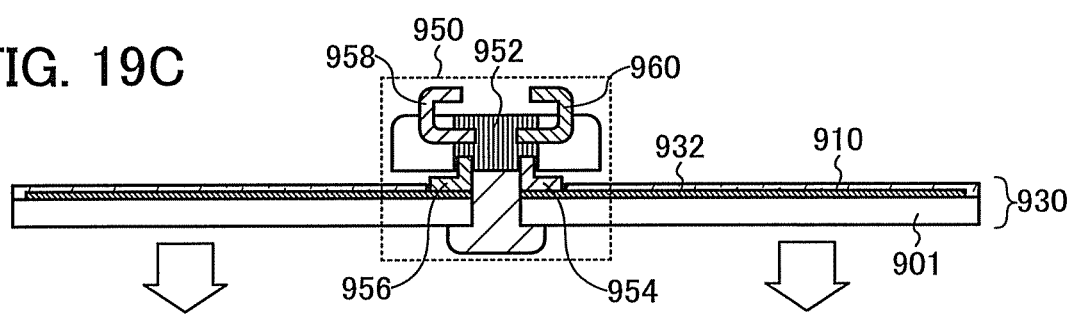
Figure 19D:
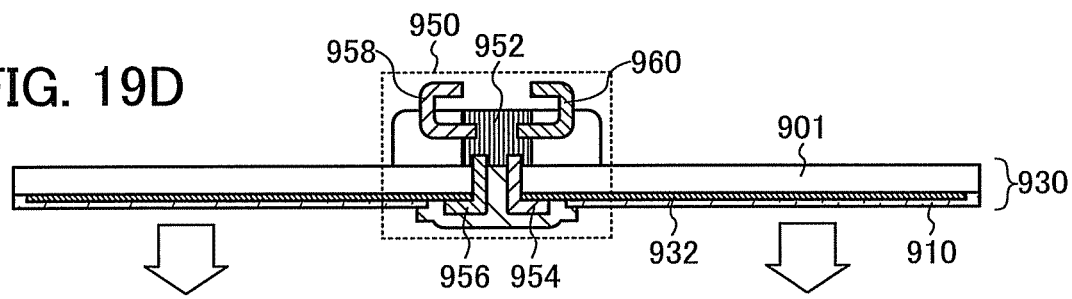

Note that FIG. 19C illustrates a structure in which the structure of the connection member 950 illustrated in FIG. 19A is replaced with another structure, and FIG. 19D illustrates a structure in which the structure of the connection member 950 illustrated in FIG. 19B is replaced with still another structure.

Further, the lighting device 930 may be provided with a sealing substrate 936 (see FIGS. 20A to 20D). The sealing substrate 936 is provided so as to face the substrate 901 with the light-emitting element 932 interposed therebetween, whereby moisture or the like can be prevented from entering the light-emitting element 932.

As the sealing substrate 936, a substrate of a disk shape (saucer shape) having an opening portion in a central portion can be used. Specifically, a glass substrate, a ceramic substrate, a quartz substrate, a metal substrate, or the like can be given. Alternatively, a plastic substrate made of polycarbonate, polyarylate, polyethersulfone, or the like can be used. Alternatively, a film (made of polypropylene, polyester, vinyl, polyvinyl fluoride, vinyl chloride, or the like), an inorganic deposition film, can be used.

Further alternatively, a flexible substrate may be used for the sealing substrate 936. A flexible substrate means a substrate which can be bent (is flexible). Alternatively, a conductive substrate such as a substrate made of a stainless steel alloy can be used; however, the sealing substrate 936 needs to be insulated from the first connection wiring 954, the second connection wiring 956, the first extraction wiring 958, and the second extraction wiring 960. Any other material may be also used as long as it serves as the sealing substrate.

Figure 20A:
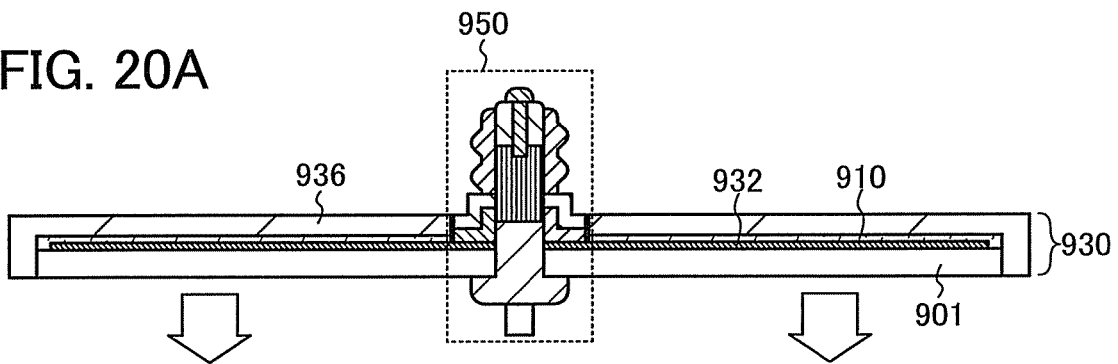
FIGS. 20A to 20D are examples of a lighting device.
Figure 20B:
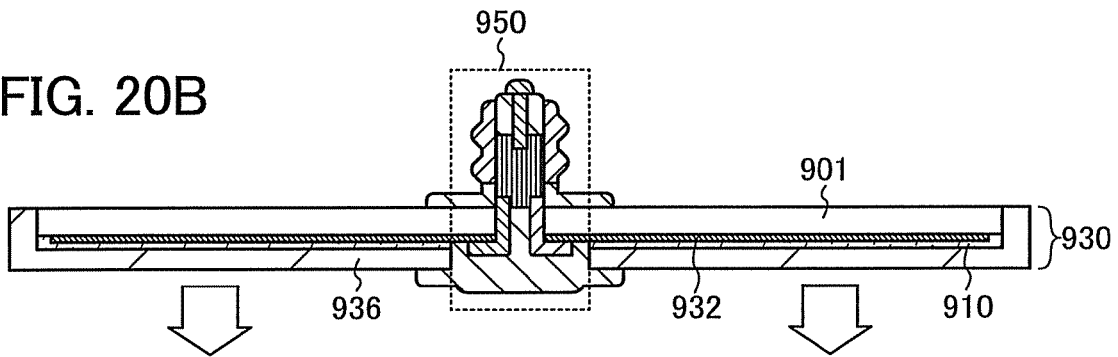
Figure 20C:
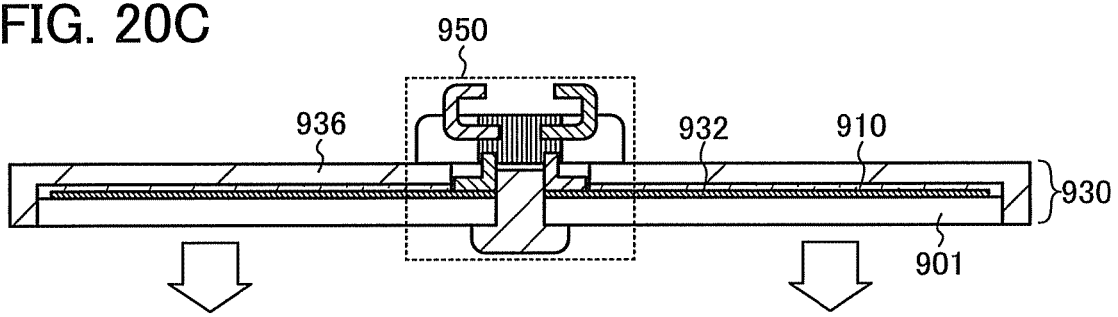
Figure 20D:
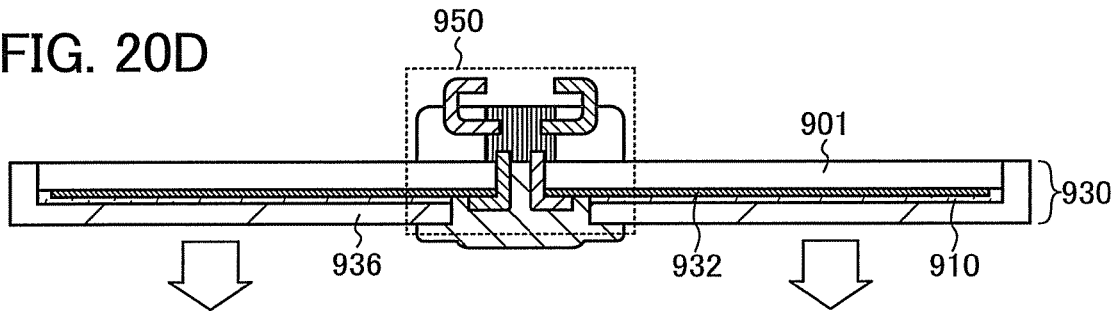

Each of FIGS. 20B and 20D illustrates a structure in which visible light passes through the sealing substrate 936.

The sealing substrate 936 may be provided on the insulating film 910, and the sealing substrate 936 can be attached to the insulating film 910, for example. Further, in each of FIGS. 20A to 20D, the sealing substrate 936 is provided so as to cover a side surface of the substrate 901; however, it is not limited thereto.

Note that FIGS. 20A to 20D correspond to structures in which the sealing substrate 936 is provided for structures in the FIGS. 19A to 19D, respectively.

Figure 22A:
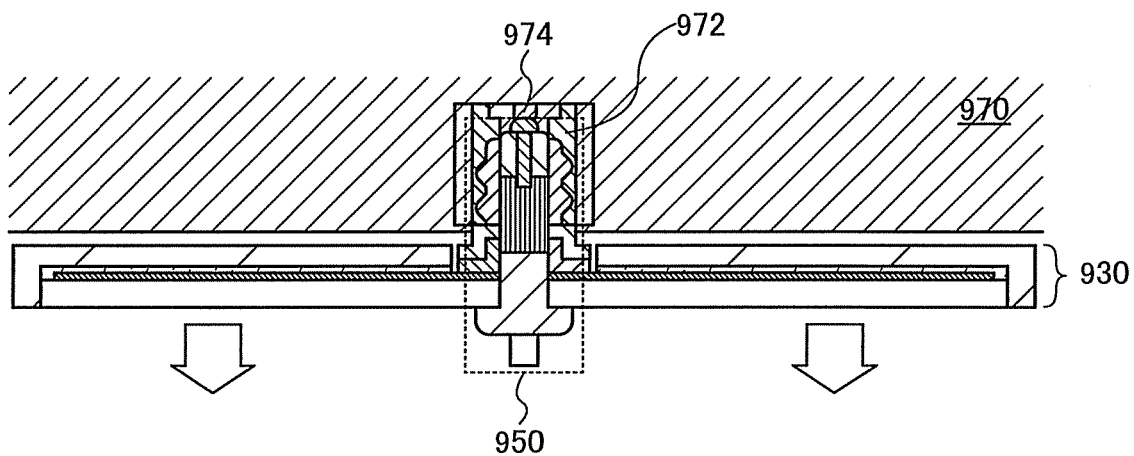
FIGS. 22A and 22B are examples of the lighting device.
Figure 22B:
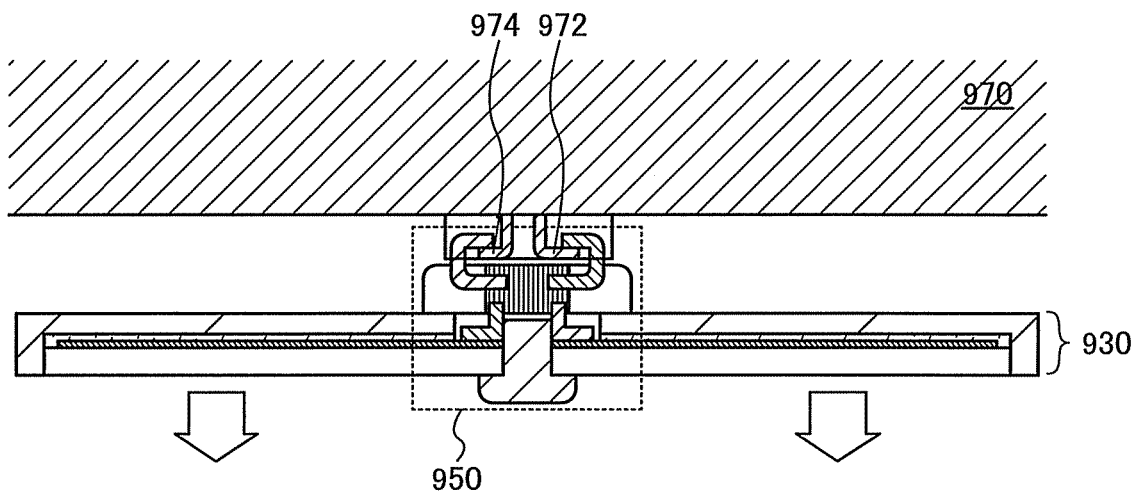

Next, a usage example of the lighting device 930 provided with the connection member 950 is described (see FIGS. 22A and 22B).

FIGS. 22A and 22B illustrate cases where the connection member 950 provided for the lighting device 930 is attached to a ceiling 970. The ceiling 970 is provided with a first external electrode 972 and a second external electrode 974. The first external electrode 972 is electrically connected to the first extraction wiring 958 provided with the connection member 950, and the second external electrode 974 is electrically connected to the second extraction wiring 960, whereby the light-emitting element 932 is externally supplied with electric power through the control circuit 952 and can be used as a lighting device.

Further, in the structure illustrated in FIG. 22A, a diameter (length in a direction parallel to a surface of the substrate 901) of the connection member 950 may be decided in accordance with the size of an attachment portion of the ceiling 970. A diameter may be set to 10 mm to 40 mm (for example, 26 mm).

The case where the structure illustrated in FIG. 20A is attached to the ceiling 970 is illustrated in FIG. 22A, and the case where the structure illustrated in FIG. 20C is attached to the ceiling 970 is illustrated in FIG. 22B; however, there is no limitation and other structures can be similarly attached to the ceiling.

Further, FIGS. 22A and 22B illustrate cases where the lighting device 930 is attached to the ceiling 970; however, the lighting device 930 described in Embodiment 9 is thin, so that it can be embedded to a wall surface or flooring as well as being attached to the ceiling 970.

Note that what is illustrated in the drawing in Embodiment 9 can be freely combined with or replaced with what is described in other embodiments, as appropriate.

Embodiment 10

In Embodiment 10, an example of an element structure of a light-emitting element which is used in a lighting device manufactured by the manufacturing apparatus of one embodiment of the present invention is described.

Figure 23A:
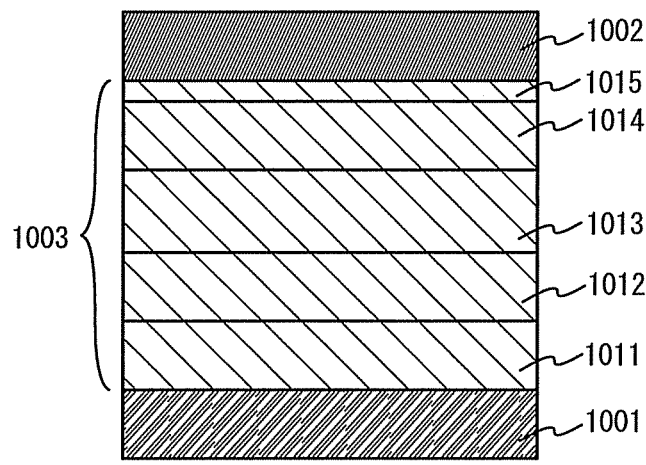
FIGS. 23A and 23B are each an example of a light-emitting element.

FIG. 23A illustrates an element structure in which an EL layer 1003 including a light-emitting region is sandwiched between a pair of electrodes (a first electrode 1001 and a second electrode 1002). Note that the first electrode 1001 is used as an anode and the second electrode 1002 is used as a cathode as an example in the following description of Embodiment 10.

The EL layer 1003 may include at least a light-emitting layer 1013, and may also have a structure in which the lighting layer 1013 and other functional layers are stacked. As the functional layer other than the light-emitting layer 1013, a layer including a substance having a high hole-injecting property, a substance having a high hole-transporting property, a substance having a high electron-transporting property, a substance having a high electron-injecting property, a bipolar substance (a substance having a high electron-transporting property and a high hole-transporting property), or the like can be used. Specifically, functional layers such as a hole-injecting layer 1011, a hole-transporting layer 1012, the light-emitting layer 1013, an electron-transporting layer 1014, and an electron-injecting layer 1015 can be used as appropriate in combination.

Next, materials that can be used for the above-described light-emitting element are specifically described.

The first electrode 1001 (an anode) is preferably formed using a metal, an alloy, an electrically conductive compound, a mixture of these materials, or the like having a high work function; specifically, a work function of 4.0 eV or higher is preferable. Specific examples are given below: indium tin oxide (ITO), indium tin oxide containing silicon or silicon oxide, indium zinc oxide (IZO), and indium oxide containing tungsten oxide and zinc oxide.

Films of these conductive metal oxides are usually formed by sputtering; however, a sol-gel method or the like may also be used. For example, indium zinc oxide (IZO) can be formed by a sputtering method using a target in which zing oxide is added to indium oxide at 1 wt % to 20 wt %. Indium oxide containing tungsten oxide and zinc oxide can be formed by a sputtering method using a target in which tungsten oxide and zinc oxide are added to indium oxide at 0.5 wt % to 5 wt % and 0.1 wt % to 1 wt %, respectively.

Besides, as the material for the first electrode 1001, the following can be given: gold (Au), platinum (Pt), nickel (Ni), tungsten (W), chromium (Cr), molybdenum (Mo), iron (Fe), cobalt (Co), copper (Cu), palladium (Pd), titanium (Ti), nitride of a metal material (e.g., titanium nitride), molybdenum oxide, vanadium oxide, ruthenium oxide, tungsten oxide, manganese oxide, titanium oxide, and the like.

The second electrode 1002 (a cathode) can be formed using a metal, an alloy, an electrically conductive compound, a mixture of these materials, or the like having a low work function; specifically, a work function of 3.8 eV or lower is preferable. As specific examples of such cathode materials, the following can be given: elements belonging to Group 1 and Group 2 of the periodic table, that is, alkali metals such as lithium (Li) and cesium (Cs), alkaline earth metals such as magnesium (Mg), calcium (Ca), and strontium (Sr), or alloys thereof (e.g., MgAg and AlLi), rare earth metals such as europium (Eu) and ytterbium (Yb), or alloys thereof, and the like. Note that a film of an alkali metal, an alkaline earth metal, or an alloy thereof can be formed by a vacuum evaporation method. In addition, a film of an alloy including an alkali metal or an alkaline earth metal can also be formed by a sputtering method. Further, a silver paste or the like can be formed by an ink-jet method or the like.

Alternatively, the second electrode 1002 can be formed using a stack of a thin film of an alkali metal compound, an alkaline earth metal compound, or a rare earth metal compound (e.g., lithium fluoride (LiF), lithium oxide, cesium fluoride (CsF), calcium fluoride ($CaF_2$), or erbium fluoride ($ErF_3$)) and a film of a metal such as aluminum.

Note that in the light-emitting element described in Embodiment 10, at least one of the first electrode 1001 and the second electrode 1002 may have a light-transmitting property.

Next, a material which is used for forming each of layers included in the EL layer 1003 is specifically described.

The hole-injecting layer 1011 is a layer including a substance having a high hole-injecting property. As the substance having a high hole-injecting property, for example, molybdenum oxide, vanadium oxide, ruthenium oxide, tungsten oxide, manganese oxide, or the like can be used. Alternatively, the hole-injecting layer 1011 can be formed using a phthalocyanine-based compound such as phthalocyanine (abbreviation: $H_2Pc$) or copper phthalocyanine (abbreviation: CuPc); an aromatic amine compound such as 4,4'-bis[N-(4-diphenylaminophenyl)-N-phenylamino]biphenyl (abbreviation: DPAB) or N,N'-bis[4-[bis(3-methylphenyl)amino]phenyl]-N,N'-diphenyl-[1,1'-biphenyl]-4,4'-diamine (abbreviation: DNTPD); a high molecule compound such as poly(3,4-ethylenedioxythiophene)/poly(styrenesulfonic acid) (PEDOT/PSS), or the like. Further, the hole-injecting layer 1011 can be formed using a tris(p-enamine-substituted-aminophenyl)amine compound, a 2,7-diamino-9-fluorenylidene compound, a tri(p-N-enamine-substituted-aminophenyl)benzene compound, a pyrene compound having one or two ethenyl groups having at least one aryl group, N,N'-di(biphenyl-4-yl)-N,N'-diphenylbiphenyl-4,4'-diamine, N,N,N',N'-tetra(biphenyl-4-yl)biphenyl-4,4'-diamine, N,N,N',N'-tetra(biphenyl-4-yl)-3,3'-diethylbiphenyl-4,4'-diamine, 2,2'-(methylenedi-4,1-phenylene)bis[4,5-bis(4-methoxyphenyl)-2H-1,2,3-triazole], 2,2'-(biphenyl-4,4'-diyl)bis(4,5-diphenyl-2H-1,2,3-triazole), 2,2'-(3,3'-dimethylbiphenyl-4,4'-diyl)bis(4,5-diphenyl-2H-1,2,3-triazole), bis[4-(4,5-diphenyl-2H-1,2,3-triazol-2-yl)phenyl](methyl)amine, or the like.

Further, a composite material including an organic compound and an inorganic compound can be used for the hole-injecting layer 1011. In particular, the composite material containing an organic compound and an inorganic compound showing an electron-accepting property to the organic compound has a high hole-injecting property and a high hole-transporting property, because electron transfer is conducted between the organic compound and the inorganic compound, so that carrier density is increased.

In the case of using a composite material formed by composing an organic compound and an inorganic compound for the hole-injecting layer 1011, the hole-injecting layer 1011 can be in ohmic contact with the first electrode 1001; therefore, a material of the first electrode 1001 can be selected regardless of work function.

As the inorganic compound used for the composite material, an oxide of a transition metal is preferably used. In addition, an oxide of metals belonging to Group 4 to Group 8 of the periodic table can be used. Specifically, vanadium oxide, niobium oxide, tantalum oxide, chromium oxide, molybdenum oxide, tungsten oxide, manganese oxide, and rhenium oxide are preferable since their electron-accepting property is high. Among them, molybdenum oxide is especially preferable since it is stable in the air, low in hygroscopicity, and easy to handle.

As the organic compound used for the composite material, various compounds such as an aromatic amine compound, carbazole derivatives, aromatic hydrocarbon, and a high molecular compound (such as oligomer, dendrimer, or polymer) can be used. The organic compound used for the composite material is preferably an organic compound having a high hole-transporting property. Specifically, a substance having a hole mobility of $10^{-6}$ cm$^2$/Vs or higher is preferably used. However, other substances may also be used as long as their hole-transporting properties are higher than their electron-transporting properties. The organic compounds which can be used for the composite material are specifically shown below.

As aromatic amine compounds, for example, there are N,N'-di(p-tolyl)-N,N-diphenyl-p-phenylenediamine (abbreviation: DTDPPA), 4,4'-bis[N-(4-diphenylaminophenyl)-N-phenylamino]biphenyl (abbreviation: DPAB), N,N'-bis[4-[bis(3-methylphenyl)amino]phenyl]-N,N'-diphenyl-[1'-biphenyl]-4,4'-diamine (abbreviation: DNTPD), 1,3,5-tris[N-(4-diphenylaminophenyl)-N-phenylamino]benzene (abbreviation: DPA3B), and the like.

As specific examples of carbazole derivatives which can be used for the composite material, the following can be given: 3-[N-(9-phenylcarbazol-3-yl)-N-phenylamino]-9-phenyl-carbazole (abbreviation: PCzPCA1); 3,6-bis[N-(9-phenyl-carbazol-3-yl)-N-phenylamino]-9-phenylcarbazole (abbreviation: PCzPCA2); 3-[N-(1-naphthyl)-N-(9-phenylcarbazol-3-yl)amino]-9-phenylcarbazole (abbreviation: PCzPCN1); and the like.

Moreover, 4,4'-di(N-carbazolyl)biphenyl (abbreviation: CBP); 1,3,5-tris[4-(N-carbazolyl)phenyl]benzene (abbreviation: TCPB); 9-[4-(N-carbazolyl)]phenyl-10-phenylanthracene (abbreviation: CzPA); 1,4-bis[4-(N-carbazolyl)phenyl]-2,3,5,6-tetraphenylbenzene; or the like can also be used.

Examples of aromatic hydrocarbon which can be used for the composite material include 2-tert-butyl-9,10-di(2-naphthyl)anthracene (abbreviation: t-BuDNA); 2-tert-butyl-9,10-di(1-naphthyl)anthracene; 9,10-bis(3,5-diphenylphenyl)anthracene (abbreviation: DPPA); 2-tert-butyl-9,10-bis(4-phenylphenyl)anthracene (abbreviation: t-BuDBA); 9,10-di (2-naphthyl)anthracene (abbreviation: DNA); 9,10-diphenylanthracene (abbreviation: DPAnth); 2-tert-butylanthracene (abbreviation: t-BuAnth); 9,10-bis(4-methyl-1-naphthyl)anthracene (abbreviation: DMNA); 2-tert-butyl-9,10-bis[2-(1-naphthyl)phenyl]anthracene; 9,10-bis[2-(1-naphthyl)phenyl]anthracene; 2,3,6,7-tetramethyl-9,10-di(1-naphthyl)anthracene; 2,3,6,7-tetramethyl-9,10-di(2-naphthyl)anthracene; 9,9'-bianthryl; 10,10'-diphenyl-9,9'-bianthryl; 10,10'-bis(2-phenylphenyl)-9,9'-bianthryl; 10,10'-bis[(2,3,4,5,6-pentaphenyl)phenyl]-9,9'-bianthryl; anthracene; tetracene; rubrene; perylene, and 2,5,8,11-tetra(tert-butyl)perylene. Besides those, pentacene, coronene, or the like can also be used. As described above, the aromatic hydrocarbon which has a hole mobility of $1 \times 10^{-6}$ cm$^2$/Vs or higher and which has 14 to 42 carbon atoms is particularly preferable.

The aromatic hydrocarbon which can be used for the composite material may have a vinyl skeleton. As the aromatic hydrocarbon having a vinyl group, the following are given for example: 4,4'-bis(2,2-diphenylvinyl)biphenyl (abbreviation: DPVBi); 9,10-bis[4-(2,2-diphenylvinyl)phenyl]anthracene (abbreviation: DPVPA); and the like.

Moreover, a high molecular compound such as poly(N-vinylcarbazole) (abbreviation: PVK) or poly(4-vinyltriphenylamine) (abbreviation: PVTPA) can also be used.

The hole-transporting layer 1012 includes a substance having a high hole-transporting property. As the substance having a high hole-transporting property, for example, an aromatic amine compound (that is, a compound having a benzene ring-nitrogen bond) is preferable. As examples of the material which is widely used, the following can be given: 4,4'-bis[N-(3-methylphenyl)-N-phenylamino]biphenyl; a derivative thereof such as 4,4'-bis[N-(1-napthyl)-N-phenylamino]biphenyl (hereinafter referred to as NPB); and a star-burst aromatic amine compound such as 4,4',4''-tris(N,N-diphenyl-amino)triphenylamine, 4,4',4''-tris[N-(3-methylphenyl)-N-phenylamino]triphenylamine, and the like. The substances mentioned here are mainly ones that have a hole mobility of $10^{-6}$ cm$^2$/Vs or higher. However, substances other than the above-described materials may also be used as long as their hole-transporting properties are higher than their electron-transporting properties. The hole-transporting layer 1012 is not limited to a single layer, and may be a mixed layer of the aforementioned substances or a stacked layer of two or more layers each including the aforementioned substance.

Alternatively, a material having a hole-transporting property may be added to a high molecular compound that is electrically inactive, such as PMMA.

Further alternatively, a high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl) methacrylamide] (abbreviation: PTPDMA), or poly[N,N'-bis (4-butylphenyl)-N,N'-bis(phenyl)benzidine (abbreviation: poly-TPD) may be used, and further, the material having a hole-transporting property may be added to the above high molecular compound as appropriate. Further, the hole-transporting layer 1012 can be formed using a tris(p-enamine-substituted-aminophenyl)amine compound, a 2,7-diamino-9-fluorenylidene compound, a tri(p-N-enamine-substituted-aminophenyl)benzene compound, a pyrene compound having one or two ethenyl groups having at least one aryl group, N,N'-di(biphenyl-4-yl)-N,N'-diphenylbiphenyl-4,4'-diamine, N,N,N',N'-tetra(biphenyl-4-yl)biphenyl-4,4'-diamine, N,N,N',N'-tetra(biphenyl-4-yl)-3,3'-diethylbiphenyl-4,4'-diamine, 2,2'-(methylenedi-4,1-phenylene)bis[4,5-bis (4-methoxyphenyl)-2H-1,2,3-triazole], 2,2'-(biphenyl-4,4'-diyl)bis(4,5-diphenyl-2H-1,2,3-triazole), 2,2'-(3,3'-dimethylbiphenyl-4,4'-diyl)bis(4,5-diphenyl-2H-1,2,3-triazole), bis[4-(4,5-diphenyl-2H-1,2,3-triazol-2-yl)phenyl] (methyl)amine, or the like.

The light-emitting layer 1013 is a layer including a light-emitting substance and can be formed using a variety of materials. For example, as a light-emitting substance, a fluorescent compound which emits fluorescence or a phosphorescent compound which emits phosphorescence can be used. Organic compound materials which can be used for the light-emitting layer are described below. Note that materials which can be used for the light-emitting element is not limited to these materials.

Blue to blue-green light emission can be obtained, for example, by using perylene, 2,5,8,11-tetra-t-butylperylene (abbreviation: TBP), 9,10-diphenylanthracene, or the like as a guest material, and dispersing the guest material in a suitable host material. Alternatively, blue to blue-green light emission can be obtained from a styrylarylene derivative such as 4,4'-bis(2,2-diphenylvinyl)biphenyl (abbreviation: DPVBi), or an anthracene derivative such as 9,10-di-2-naphthylanthracene (abbreviation: DNA) or 9,10-bis(2-naphthyl)-2-t-butylanthracene (abbreviation: t-BuDNA). Further alternatively, a polymer such as poly(9,9-dioctylfluorene) may be used. Further, as a guest material for blue light emission, a styrylamine derivative is preferable. Examples include N,N'-bis[4-(9H-carbazol-9-yl)phenyl]-N,N'-diphenylstilbene-4,4'-diamine (abbreviation: YGA2S), N,N'-diphenyl-N,N'-bis (9-phenyl-9H-carbazol-3-yl)stilbene-4,4'-diamine (abbreviation: PCA2S), and the like. In particular, YGA2S is preferable because it has a peak at around 450 nm. Further, as a host material, an anthracene derivative is preferable; 9,10- bis(2-naphthyl)-2-t-butylanthracene (abbreviation: t-BuDNA) and 9-[4-(10-phenyl-9-anthryl)phenyl]-9H-carbazole (abbreviation: CzPA) are suitable. In particular, CzPA is preferable because it is electrochemically stable.

Blue-green to green light emission can be obtained, for example, by using a coumarin dye such as coumarin 30 or coumarin 6, bis[2-(2,4-difluorophenyl)pyridinato]picolinatokidium (abbreviation: FIrpic), bis(2-phenylpyridinato)acetylacetonatoiridium (abbreviation: Ir(ppy)$_2$(acac)), or the like as a guest material and dispersing the guest material in a suitable host material. Further, blue-green to green light emission can be obtained by dispersing perylene or TBP, which are mentioned above, in a suitable host material at a high concentration of 5 wt % or more. Further alternatively, blue-green to green light emission can be obtained from a metal complex such as BAlq, Zn(BTZ)$_2$, or bis(2-methyl-8-quinolinolato)chlorogallium (Ga(mq)$_2$Cl). Further, a polymer such as poly(p-phenylenevinylene) may be used. Further, an anthracene derivative is preferable as a guest material of a blue-green to green light-emitting layer, as high light-emitting efficiency can be obtained when an anthracene derivative is used. For example, when 9,10-bis{4-[4N-(4-diphenylamino)phenyl-N-phenyl]aminophenyl}-2-tert-butylanthracene (abbreviation: DPABPA) is used, highly efficient blue-green light emission can be obtained. Further, an anthracene derivative in which an amino group has been substituted into position 2 is preferable, as highly efficient green light emission can be obtained. In particular, N-(9,10-diphenyl-2-anthryl)-N,9-diphenyl-9H-carbazol-3-amine (abbreviation: 2PCAPA) is suitable, as it has a long lifetime. As a host material for these materials, an anthracene derivative is preferable; CzPA, which is mentioned above, is preferable, as it is electrochemically stable. Further, in the case of manufacturing a light-emitting element in which green light emission and blue light emission are combined and which has two peaks in the blue to green wavelength range, an anthracene derivative having an electron-transporting property, such as CzPA is preferably used as a host material for a blue light-emitting layer, an aromatic amine compound having a hole-transporting property, such as NPB, is preferably used as a host material for a green light-emitting layer, and light emission can be obtained at an interface between the blue light-emitting layer and the green light-emitting layer. That is, in such a case, an aromatic amine compound like NPB is preferable as a host material of a green light-emitting material such as 2PCAPA.

Yellow to orange light emission can be obtained, for example, by using rubrene, 4-(dicyanomethylene)-2-[p-(dimethylamino)styryl]-6-methyl-4H-pyran (abbreviation: DCM1), 4-(dicyanomethylene)-2-methyl-6-(9-julolidyl)ethenyl-4H-pyran (abbreviation: DCM2), bis[2-(2-thienyl)pyridinato]acetylacetonatoiridium (abbreviation: Ir(thp)$_2$(acac)), bis(2-phenylquinolinato)acetylacetonatoiridium (abbreviation: Ir(pq)$_2$(acac)), or the like as a guest material and dispersing the guest material in a suitable host material. In particular, a tetracene derivative such as rubrene is preferable as a guest material because it is highly efficient and chemically stable. As a host material in this case, an aromatic amine compound such as NPB is preferable. Alternatively, a metal complex such as bis(8-quinolinolato)zinc (abbreviation: Znq$_2$), bis[2-cinnamoyl-8-quinolinolato]zinc (abbreviation: Znsq$_2$), or the like can be used as a host material. Further alternatively, a polymer, such as poly(2,5-dialkoxy-1,4-phenylenevinylene) may be used.

Orange to red light emission can be obtained, for example, by using 4-(dicyanomethylene)-2,6-bis[p-(dimethylamino)styryl]-4H-pyran (abbreviation: BisDCM), 4-(dicyanomethylene)-2,6-bis[2-(julolidin-9-yl)ethenyl]-4H-pyran (abbreviation: BisDCJ), 4-(dicyanomethylene)-2-methyl-6-(9-julolidyl)ethenyl-4H-pyran (abbreviation: DCM2), bis[2-(2-thienyl)pyridinato]acetylacetonatoiridium (Ir(thp)$_2$(acac)), or the like as a guest material, and dispersing the guest material in a suitable host material. Orange to red light emission can also be obtained by using a metal complex such as bis(8-quinolinolato)zinc (abbreviation: Znq$_2$), bis[2-cinnamoyl-8-quinolinolato]zinc (abbreviation: Znsq$_2$), or the like. Further, a polymer such as poly(3-alkylthiophene) may be used. As a guest material which exhibits red light emission, a 4H-pyran derivative such as 4-(dicyanomethylene)-2,6-bis[p-(dimethylamino)styryl]-4H-pyran (abbreviation: BisDCM), 4-(dicyanomethylene)-2,6-bis[2-(julolidin-9-yl)ethenyl]-4H-pyran (abbreviation: BisDCJ), 4-(dicyanomethylene)-2-methyl-6-(9-julolidyl)ethenyl-4H-pyran (abbreviation: DCM2), {2-isopropyl-6-[2-(2,3,6,7-tetrahydro-1,1,7,7-tetramethyl-1H,5H-benzo[ij]quinolizin-9-yl)ethenyl]-4H-pyran-4-ylidene}propanedinitrile (abbreviation: DCJTI), or {2,6-bis[2-(2,3,6,7-tetrahydro-8-methoxy-1,1,7,7-tetramethyl-1H,5H-benzo[ij]quinolizin-9-yl)ethenyl]-4H-pyran-4-ylidene}propanedinitrile (abbreviation: BisDCJTM) is preferable because of its high efficiency. In particular, DCJTI and BisDCJTM are preferable, as they have a light emission peak at around 620 nm.

The light-emitting layer 1013 may have a structure in which the above substance having a light-emitting property (a guest material) is dispersed in another substance (a host material). As the substance in which the substance having a high light-emitting property is dispersed, various kinds of materials can be used, and it is preferable to use a substance whose lowest unoccupied molecular orbital (LUMO) level is higher than that of a substance having a high light-emitting property and whose highest occupied molecular orbital (HOMO) level is lower than that of the substance having a high light-emitting property.

As the substance in which the substance having a light-emitting property is dispersed, specifically, a metal complex such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ); a heterocyclic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2''-(1,3,5-benzenetriyl)tris(1-phenyl-1H-benzimidazole) (abbreviation: TPBI), bathophenanthroline (abbreviation: BPhen), or bathocuproine (BCP); a condensed aromatic compound such as 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3''-(benzene-1,3,5-triyl)tripyrene (abbreviation: TPB3), 9,10-diphenylanthracene (abbreviation: DPAnth), or 6,12-dimethoxy-5,11-diphenylchrysene; an aromatic amine compound such as N,N-diphenyl-9-[4-(10-phenyl-9-anthryl) phenyl]-9H-carbazol-3-amine (abbreviation: CzA1PA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), NPB (or α-NPD), TPD, DFLDPBi, or BSPB; or the like can be used.

As the substance in which the substance having a light-emitting property is dispersed, a plurality of kinds of substances can be used. For example, in order to suppress crystallization, a substance such as rubrene which suppresses crystallization, may be further added. In addition, NPB, Alq, or the like may be further added in order to efficiently transfer energy to the substance having a light-emitting property.

When a structure in which the substance having a light-emitting property is dispersed in another substance is employed, crystallization of the light-emitting layer 1013 can be suppressed. In addition, concentration quenching which results from high concentration of the substance having a light-emitting property can be suppressed.

An electron-transporting layer 1014 is a layer including a substance having a high electron-transporting property. As the substance having a high electron-transporting property, for example, a layer containing a metal complex having a quinoline skeleton or a benzoquinoline skeleton, such as tris (8-quinolinolato)aluminum (abbreviation: Alq), tris(4-methyl-8-quinolinolato)aluminum (abbreviation: Almq$_3$), bis (10-hydroxybenzo[h]-quinolinato)beryllium (abbreviation: BeBq$_2$), or bis(2-methyl-8-quinolinolato)(4-phenylphenolate)aluminum (abbreviation: BAlq) can be used. Alternatively, a metal complex or the like including an oxazole-based or thiazole-based ligand, such as bis[2-(2-hydroxyphenyl) benzoxazolato]zinc (abbreviation: Zn(BOX)$_2$) or bis[2-(2-hydroxyphenyl)benzothiazolato]zinc (abbreviation: Zn(BTZ)$_2$) can be used. Besides the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazole-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), bis[3-(1H-benzimidazol-2-yl)fluoren-2-olato]zinc(II), bis[3-(1H-benzimidazol-2-yl)fluoren-2-olato]beryllium(II), bis[2-(1H-benzimidazol-2-yl)dibenzo[b,d]furan-3-olato](phenolato) aluminum(III), bis[2-(benzoxazol-2-yl)-7,8-methylenedioxydibenzo[b,d]furan-3-olato](2-naphtholato) aluminum(III), or the like can also be used. The substances mentioned here are mainly ones having an electron mobility of $10^{-6}$ cm$^2$/Vs or higher. Note that the electron-transporting layer 1014 may be formed of substances other than those described above as long as their electron-transporting properties are higher than their hole-transporting properties. The electron-transporting layer 1014 is not limited to a single layer and may be a stacked layer which includes two or more layers each containing the aforementioned substance.

The electron-injecting layer 1015 is a layer including a substance having a high electron-injecting property. As the material having a high electron-injecting property, the following can be given: an alkali metal, an alkaline earth metal, or a compound thereof such as lithium fluoride (LiF), cesium fluoride (CsF), and calcium fluoride (CaF$_2$). Alternatively, a composite material of an organic compound having an electron-transporting property and an inorganic compound (e.g., an alkali metal, an alkaline earth metal, a rare earth metal, or a compound thereof), such as Alq including magnesium (Mg), can also be used. Such a structure makes it possible to increase the efficiency of electron injection from the second electrode 1002.

In the case of using the composite material of an organic compound and an inorganic compound for the electron-injecting layer 1015, various conductive materials such as Al, Ag, ITO, or ITO containing silicon or silicon oxide can be used for the material of the second electrode 1002 regardless of work function.

Note that such layers are stacked in appropriate combination, whereby the EL layer 1003 can be formed. The light-emitting layer 1013 may have a stacked-layer structure including two or more layers. The light-emitting layer 1013 has a stacked-layer structure including two or more layers and a different light-emitting substance is used for each light-emitting layer, whereby a variety of emission colors can be obtained. In addition, a plurality of light-emitting substances of different emission colors makes it possible to obtain light emission having a broad spectrum or white light emission. In particular, for a lighting device in which high luminance is required, a structure in which light-emitting layers are stacked is preferable.

Further, as a formation method of the EL layer 1003, a variety of methods (e.g., a dry process and a wet process) can be selected as appropriate depending on a material to be used. For example, a vacuum evaporation method, a sputtering method, an ink-jet method, a spin coating method, or the like can be used. Note that a different formation method may be employed for each layer.

Further, the light-emitting element described in Embodiment 10 can be formed by any of a variety of methods regardless of whether it is a dry process (e.g., a vacuum evaporation method, or a sputtering method) or a wet process (e.g., an ink-jet method, or a spin coating method).

Each layer included in the light-emitting element having the structure described in Embodiment 10 can be formed using the manufacturing apparatus illustrated in FIG. 1, which is one embodiment of the present invention. With the use of the manufacturing apparatus of one embodiment of the present invention, since layers included in the light-emitting element can be successively formed in one vacuum chamber, a light-emitting element and a lighting device including the light-emitting element can be manufactured with high throughput. Note that the number of deposition chambers provided with the manufacturing apparatus can be set as appropriate in accordance with the number of stacked layers of functional layers forming an element.

Figure 23B:
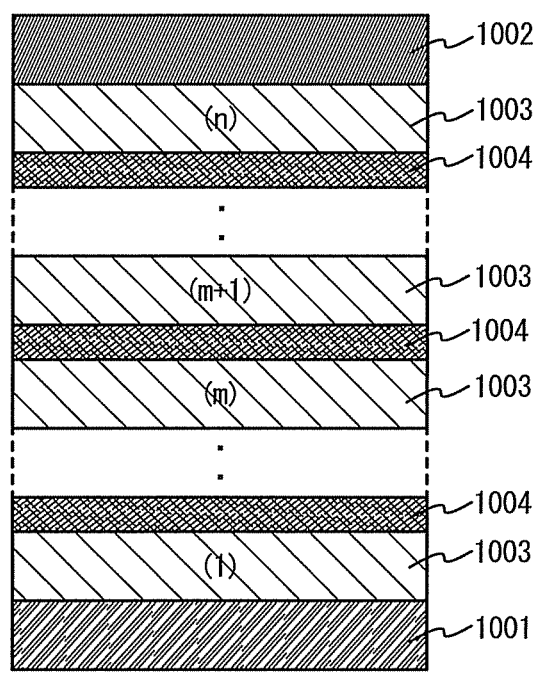

A light-emitting element illustrated in each of FIGS. 23A and 23B emits light when current flows because of the potential difference generated between the first electrode 1001 and the second electrode 1002, and holes and electrons are recombined in the light-emitting layer 1013 including a substance having a high light-emitting property. That is, a light-emitting region is formed in the light-emitting layer 1013.

The light-emitting element described in Embodiment 10 may have a so-called stacked element structure in which, as illustrated in FIG. 23B, a plurality of EL layers 1003 is stacked between a pair of electrodes. Note that in the case of a structure in which n (n is a natural number of 2 or more) EL layers 1003 are stacked, an intermediate layer 1004 is provided between an m-th (m is a natural number, $1 \le m \le n-1$) EL layer and an (m+1)-th EL layer.

Note that the intermediate layer 1004 has a function of injecting holes to one EL layer 1003 which is formed in contact with the intermediate layer 1004 and a function of injecting electrons to the other EL layer 1003 when voltage is applied to the first electrode 1001 and the second electrode 1002.

The intermediate layer 1004 may be formed of a composite material of an organic compound and a metal oxide, a metal oxide, or a composite material of an organic compound and an alkali metal, an alkaline earth metal, or a compound thereof; alternatively, these materials may be combined as appropriate. The composite material of an organic compound and a metal oxide includes, for example, an organic compound and a metal oxide such as $V_2O_5$, $MoO_3$, or $WO_3$. As the organic compound, various compounds such as an aromatic amine compound, a carbazole derivative, aromatic hydrocarbon, and a high molecular compound (oligomer, dendrimer, polymer, or the like) can be used. As the organic compound, it is preferable to use the organic compound which has a hole-transporting property and has a hole mobility of $10^{-6}$ cm$^2$/Vs or higher. However, substances other than the above-described materials may also be used as long as the substances have a hole-transporting property higher than an electron-transporting property. These materials used for the intermediate layer 1004 are excellent in carrier-injecting property and carrier-transporting property, and thus, a light-emitting element can achieve low-voltage driving and low-current driving.

In a structure of the stacked layer element, in the case where the EL layer has a structure in which two layers are stacked, light emission color of a first EL layer and light emission color of a second EL layer are complementary colors to each other, white color light can be extracted outside. White light emission can also be obtained with a structure including a plurality of light-emitting layers in which light emission color of the first EL layer and light emission color of the second EL layer are complementary colors to each other. As a complementary relation, blue and yellow, blue green and red, and the like can be given. A substance which emits light of blue, yellow, blue-green, or red may be selected as appropriate from, for example, the light-emitting substances given above.

The following describes an example of a structure in which white light emission can be obtained by including a plurality of light-emitting layers in which light emission color of the first EL layer and light emission color of the second EL layer are complementary colors to each other.

For example, the first EL layer includes a first light-emitting layer which exhibits a light emission spectrum whose peak is in the wavelength range of blue to blue-green, and a second light-emitting layer which exhibits a light emission spectrum whose peak is in the wavelength range of yellow to orange. The second EL layer includes a third light-emitting layer which exhibits a light emission spectrum whose peak is in the wavelength range of blue-green to green, and a fourth light-emitting layer which exhibits a light emission spectrum whose peak is in the wavelength range of orange to red.

In this case, light emission from the first EL layer is a combination of light emission from both the first light-emitting layer and the second light-emitting layer and thus exhibits a light emission spectrum whose peaks are both in the wavelength range of blue to blue-green and in the wavelength range of yellow to orange. That is, the first EL layer exhibits light emission which has a 2-wavelength white color or a 2-wavelength color similar to white.

In addition, light emission from the second EL layer is a combination of light emission from both the third light-emitting layer and the fourth light-emitting layer and thus exhibits a light emission spectrum whose peaks are both in the wavelength range of blue-green to green and in the wavelength range of orange to red. That is, the second EL layer exhibits light emission which has a 2-wavelength white color or a 2-wavelength color similar to white, which is different from the first EL layer.

Accordingly, by combining the light-emission from the first EL layer and the light emission from the second EL layer, white light emission with good color rendering properties, which covers the wavelength range of blue to blue-green, the wavelength range of blue-green to green, the wavelength range of yellow to orange, and the wavelength range of orange to red, can be obtained.

Note that in the structure of the above-mentioned stacked layer element, by provision of the intermediate layer between the stacked EL layers, the element can have long lifetime in a high-luminance region while the current density is kept low. In addition, the voltage drop due to resistance of the electrode material can be reduced, whereby uniform light emission in a large area is possible.

Figure 24:
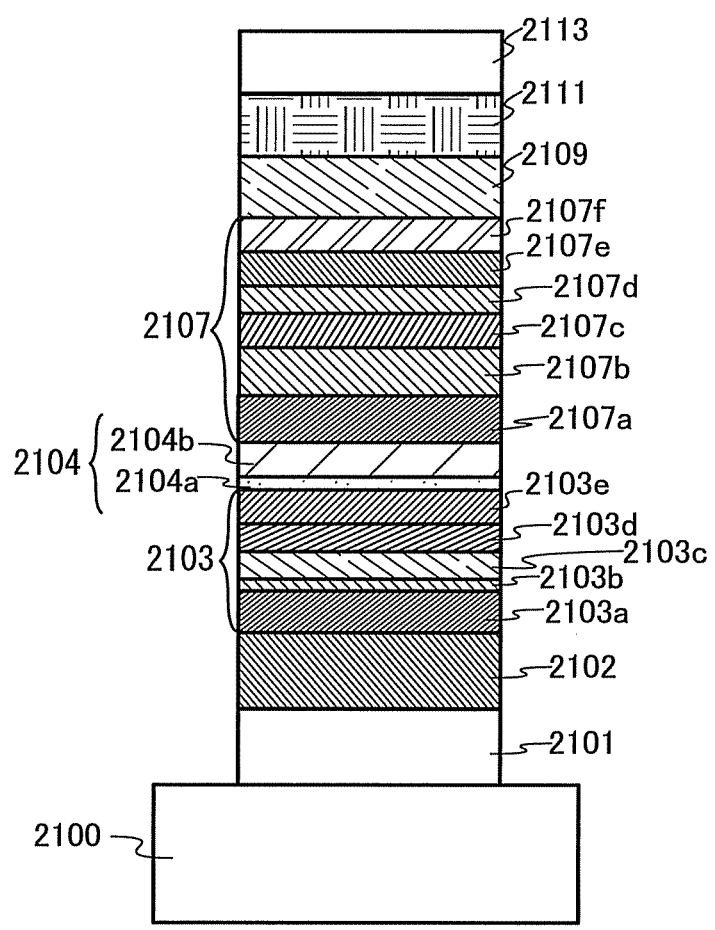
FIG. 24 is an example of a cross-section of a lighting device.

FIG. 24 is an example of a cross-sectional view of a lighting device having a light-emitting element of a tandem structure illustrated in FIG. 23B. As illustrated in FIG. 24, the lighting device includes a first EL layer 2103, an intermediate layer 2104, and a second EL layer 2107 between a first electrode 2102 and a second electrode 2109.

The light-emitting element illustrated in FIG. 24 is a so-called tandem light-emitting element having a first EL layer, a second EL layer, and an intermediate layer, and each of the first and second EL layers includes two light-emitting layers. As illustrated in FIG. 24, a lighting device in which each light-emitting layer has a stacked structure of two or more layers can be obtained, which exhibits a variety of emission colors by changing the type of the light-emitting substances for each light-emitting layers. In addition, a plurality of light-emitting substances of different colors is used as the light-emitting substance, whereby light emission having a broad spectrum or white light emission can also be obtained. In particular, for a lighting device in which high luminance is required, a structure in which light-emitting layers are stacked is preferable.

A base protective film 2101 is formed over a substrate 2100. The base protective film 2101 can be formed by a sputtering method in the deposition chamber 115 of the manufacturing apparatus described in Embodiment 1, for example. In Embodiment 10, the base protective film is formed using silicon nitride with a thickness of 100 nm.

The first electrode 2102 is formed over the base protective film 2101. The first electrode 2102 can be formed by a sputtering method in the deposition chamber 117 of the manufacturing apparatus described in Embodiment 1, for example. In Embodiment 10, the first electrode 2102 is used as an anode.

The first EL layer 2103 is formed over the first electrode 2102. The first EL layer 2103 can be formed by an evaporation method in the deposition chamber 119A, 119B, and 119C of the manufacturing apparatus described in Embodiment 1, for example. Note that the first EL layer 2103 may include at least a light-emitting layer, and the number of the deposition chambers can be set as appropriate in accordance with the number of the stacked layers. In Embodiment 10, five layers of a first hole-injecting layer 2103a, a first hole-transporting layer 2103b, a first light-emitting layer 2103c including a light-emitting substance emitting blue light, a second light-emitting layer 2103d including a light-emitting substance emitting blue light, and a first electron-transporting layer 2103e are stacked to Rum the first EL layer 2103. Materials for each functional layer may be selected from the above-mentioned substances, as appropriate, for example. In Embodiment 10, the first hole-injecting layer 2103a and the first hole-transporting layer 2103b may be formed in the same deposition chamber.

The intermediate layer 2104 is formed over the first EL layer 2103. The intermediate layer 2104 can be formed by an evaporation method in the deposition chambers 121A and 121B of the manufacturing apparatus described in Embodiment 1, for example. The intermediate layer 2104 includes a composite material of an organic compound and a metal oxide. This composite material of the organic compound and the metal oxide includes an organic compound and a metal oxide such as $V_2O_5$, $MoO_3$, or $WO_3$. As the organic compound, the materials mentioned above can be used. The composite material of the organic compound and the metal oxide can achieve low-voltage driving and low-current driving because of its superior carrier-injecting property and carrier-transporting property. The intermediate layer 2104 of Embodiment 10 is formed in a combination of a first intermediate layer 2104a including the composite material of an organic compound and a metal oxide and a second intermediate layer 2104b including a compound selected from electron donating substances and a compound having a high electron-transporting property. Note that in Embodiment 10, the first intermediate layer 2104a and the second intermediate layer 2104b may be formed in the same deposition chamber.

The second EL layer 2107 is formed over the intermediate layer 2104. The second EL layer 2107 can be formed by an evaporation method in the deposition chambers 123A, 123B, 123C, and 123D of the manufacturing apparatus described in Embodiment 1, for example. The second EL layer 2107 may include at least a light-emitting layer, and the number of the deposition chambers can be set as appropriate in accordance with the number of the staked layers. In Embodiment 10, six layers of a second hole-injecting layer 2107a, a second hole-transporting layer 2107b, a third light-emitting layer 2107c including a light-emitting substance emitting red light, a fourth light-emitting layer 2107d including a light-emitting substance emitting green light, a second electron-transporting layer 2107e, and an electron-injecting layer 2107f are stacked to form the second EL layer 2107. Materials for each functional layer may be selected from the above-mentioned substances, as appropriate, for example. In Embodiment 10, the second hole-injecting layer 2107a and the second hole-transporting layer 2107b may be formed in the same deposition chamber.

The second electrode 2109 is formed over the second EL layer 2107. The second electrode 2109 can be formed by a sputtering method in the deposition chamber 125 of the manufacturing apparatus described in Embodiment 1, for example. In Embodiment 10, the second electrode 2109 is used as a cathode.

A drying agent layer 2111 is formed over the second electrode 2109. The drying agent layer 2111 can be formed by a sputtering method in the deposition chamber 125 of the manufacturing apparatus described in Embodiment 1, for example. Note that the drying agent layer 2111 is not necessarily provided. Alternatively, the drying agent layer 2111 may be provided between the substrate 2100 and the base protective film 2101. Further alternatively, the drying agent layers 2111 may be provided between the substrate 2100 and the base protective film 2101 and over the second electrode 2109.

A sealing film 2113 is formed over the drying agent layer 2111. The sealing film 2113 can be formed by a sputtering method in the deposition chamber 127 of the manufacturing apparatus described in Embodiment 1, for example. Note that a light-emitting element can be sealed with a sealing member instead of the sealing film 2113. Alternatively, the sealing film and the sealing member can be used together.

White light emission which covers the blue wavelength range, the red wavelength range, and the green wavelength range can be obtained as a result of combining the light emission from the first EL layer 2103 and the light emission from the second EL layer 2107 by the lighting device illustrated in FIG. 24.

Note that Embodiment 10 can be freely combined with the other embodiments, as appropriate.

Embodiment 11

Embodiment 11 shows application examples of a lighting device.

Figure 25:
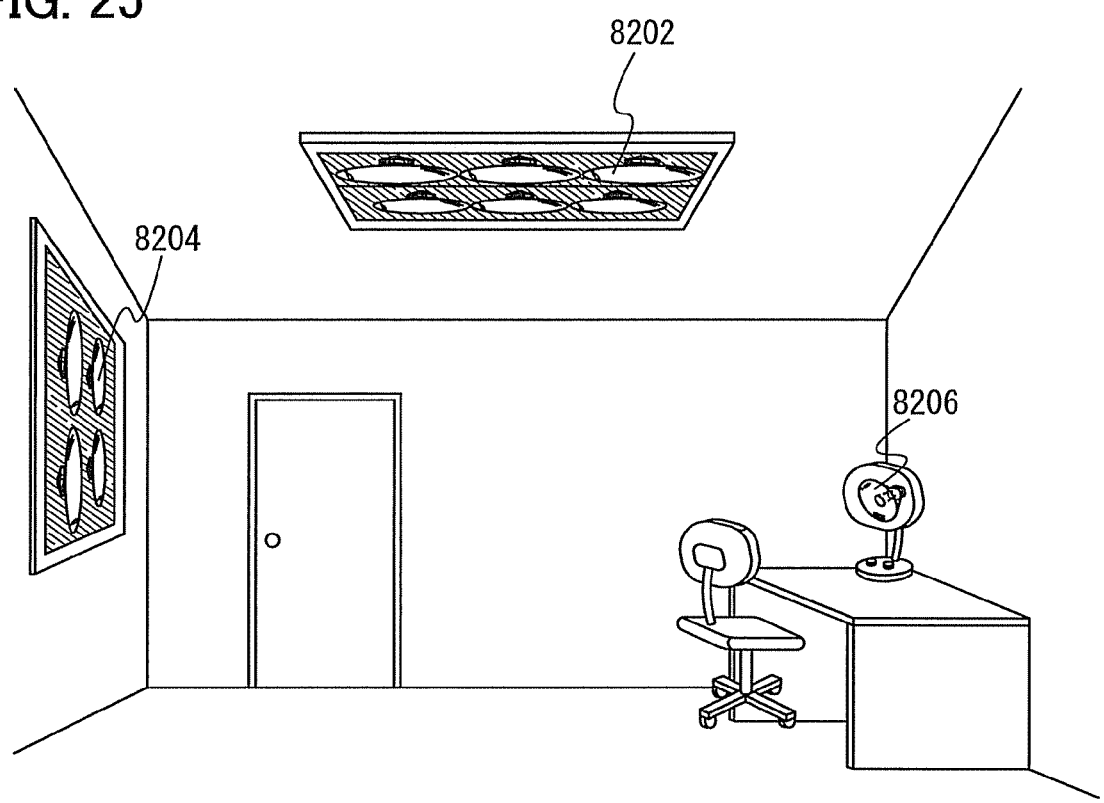
FIG. 25 is an application example of a lighting device.

FIG. 25 illustrates an example in which lighting devices manufactured using the manufacturing apparatus of one embodiment of the present invention are used as indoor lighting devices. The lighting device manufactured using the manufacturing apparatus of one embodiment of the present invention can be used as a wall lighting device 8204 as well as a ceiling lighting device 8202. In addition, the lighting device can be used as a desk lamp 8206. The lighting device manufactured using the manufacturing apparatus of one embodiment of the present invention has a planar light source, so that the number of members such as a light reflecting plate can be reduced as compared to the case of using a point light source, and it generates less heat than an incandescent lamp; therefore, the lighting device is preferable for an indoor lighting device.

Figure 26A:
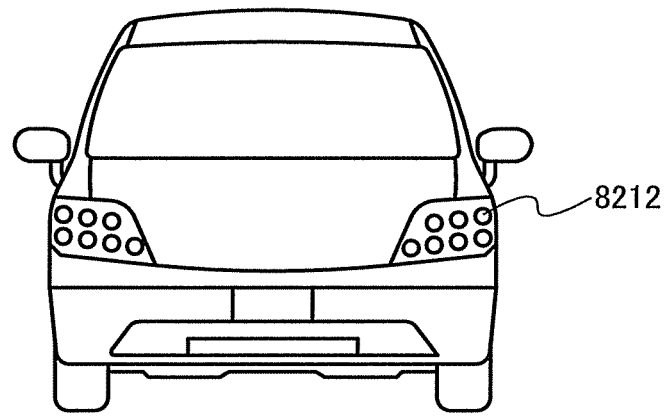
FIGS. 26A to 26C are application examples of a lighting device.
Figure 26B:
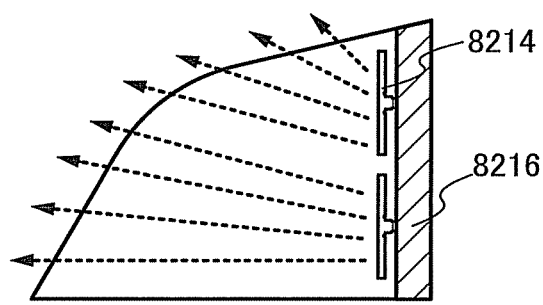
Figure 26C:
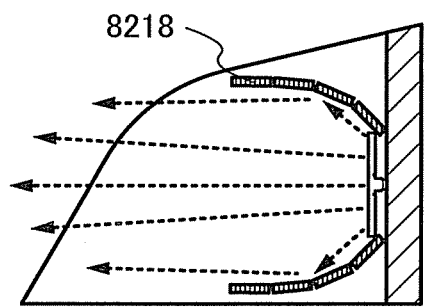

Further, the lighting device manufactured using the manufacturing apparatus of one embodiment of the present invention can be used as a headlight of an automobile, a bicycle, or the like. FIGS. 26A to 26C are examples in which the lighting device manufactured using the manufacturing apparatus of one embodiment of the present invention is used as a headlight of an automobile. FIG. 26A is an external view of an automobile in which the lighting device manufactured using the manufacturing apparatus of one embodiment of the present invention is used as a headlight 8212. FIGS. 26B and 26C are cross-sectional views of the headlight 8212 in FIG. 26A. In FIGS. 26B and 26C, the lighting device 8214 which is connected to a connector 8216 for electric power source is used as a light source. In FIG. 26B, since a plurality of lighting devices 8214 is used, light with high luminance can be extracted outside. On the other hand, in FIG. 26C, light from the lighting device is converged by a reflector 8218, so that light with directivity and high luminance can be extracted outside.

Next, examples in which the lighting device manufactured using the manufacturing apparatus of one embodiment of the present invention is applied to a lighting device such as a traffic light or an evacuation light are illustrated in FIGS. 27A to 27E.

Figure 27A:
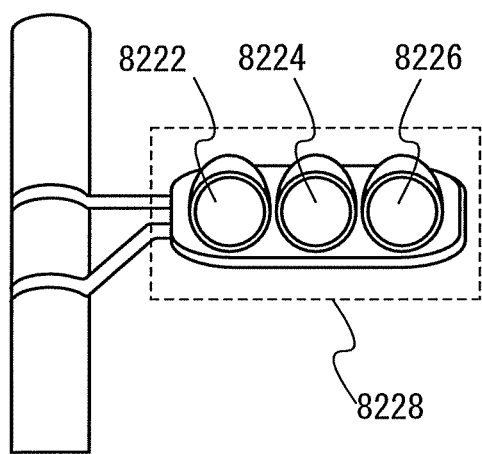
FIGS. 27A to 27E are each an application example of a lighting device.

FIG. 27A illustrates an external view of a traffic light as an example. A traffic light 8228 includes a lighting portion 8222 of blue color, a lighting portion 8224 of yellow color, and a lighting portion 8226 of red color. The traffic light 8228 includes the lighting devices manufactured using the manufacturing apparatus of one embodiment of the present invention, which correspond to the lighting devices emitting blue light, yellow light, or red light, in the lighting portion.

Figure 27B:
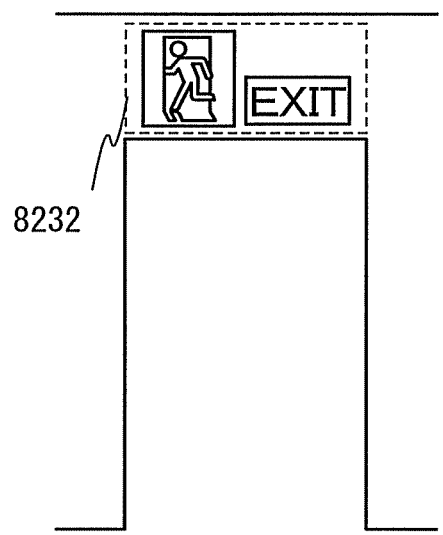

FIG. 27B illustrates an example in which the lighting device manufactured using the manufacturing apparatus of one embodiment of the present invention is applied to an evacuation light.

FIG. 27B is an external view of the evacuation light as an example. An evacuation light 8232 has a structure of a combination of the lighting device and a fluorescent plate provided with a fluorescent portion. Alternatively, the evacuation light 8232 may have a structure of a combination of a lighting device which emits a specific color and a light-shielding plate provided with a light-transmitting portion having a shape as illustrated. The lighting device manufactured using the manufacturing apparatus of one embodiment of the present invention is preferable for an evacuation light which is required to be on at all times since it can be turned on up at a constant luminance.

Figure 27C:
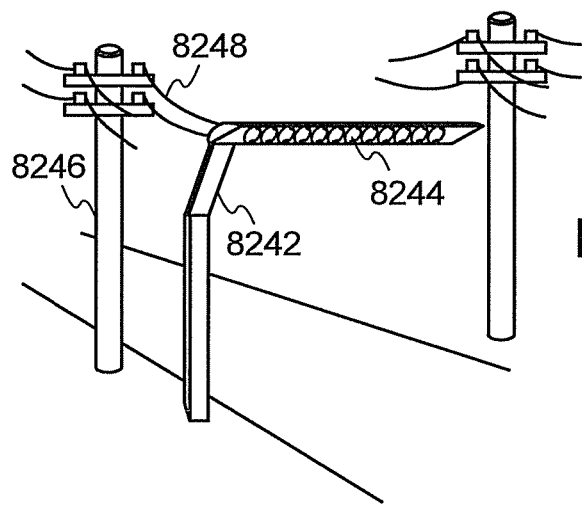

FIG. 27C illustrates an example in which the lighting device manufactured using the manufacturing apparatus of one embodiment of the present invention is applied to an outdoor lighting device.

As an example of an outdoor light device, a street lamp can be given. A street lamp may include a housing 8242 and a lighting portion 8244 as illustrated in FIG. 27C. A plurality of the lighting devices manufactured using the manufacturing apparatus of one embodiment of the present invention can be placed in the lighting portion 8244. As illustrated in FIG. 27C, for example, a street lamp is provided along the street and the lighting portion 8244 can light up a space around it, so that visibility of the space around it including a street can be improved.

When power source voltage is supplied to the street lamp, as illustrated in FIG. 27C, power source voltage can be supplied through a power line 8248 of a utility shaft 8246, for example; however, it is not limited thereto. The housing 8242 is provided with A photoelectric conversion device and voltage obtained by the photoelectric conversion device can be used as power source voltage, for example.

Figure 27D:
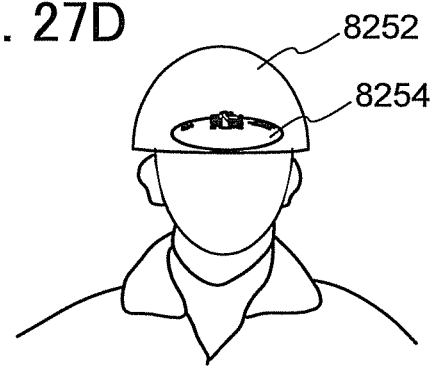
Figure 27E:
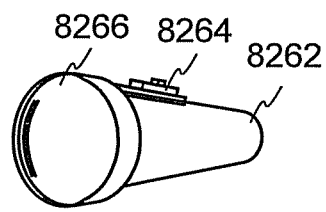

FIGS. 27D and 27E each illustrate an example in which the lighting device manufactured using the manufacturing apparatus of one embodiment of the present invention is applied to a portable light. FIG. 27D illustrates a structure of a head-mounted and FIG. 27E illustrates a structure of an electric torch.

The wearable light illustrated in FIG. 27D includes an applied portion 8252 and a lighting portion 8254, and the lighting portion 8254 is fixed to the applied portion 8252. The lighting device manufactured using the manufacturing apparatus of one embodiment of the present invention can be used for the lighting portion 8254. The lighting portion 8254 of the wearable light illustrated in FIG. 27D can emit light while the wearing portion 8252 is mounted on head. Further, with the use of a planar light source as the lighting portion 8254, visibility of a space around it can be improved. Furthermore, since the lighting portion 8254 is lightweight, burden when the head-mounted light 8252 is mounted on head can be reduced.

Note that a structure of the wearable light is not limited to that illustrated in FIG. 27D. For example, the wearing portion 8252 may be a belt of flat string or rubber band, the lighting portion 8254 may be fixed to the belt, and the belt may be wrapped around the head.

The electric torch illustrated in FIG. 27E includes a housing 8262, a lighting portion 8266, and a switch 8264. The lighting device manufactured using the manufacturing apparatus of one embodiment of the present invention can be used for the lighting portion 8266. The lighting device manufactured using the manufacturing apparatus of one embodiment of the present invention is used for the lighting portion 8266, whereby the thickness of the lighting portion 8266 can be reduced and the size of the electric torch can be reduce, which makes it easy to carry.

The switch 8264 has a function of controlling light emission and non-light emission of the lighting portion 8266. In addition, the switch 8264 can have a function of adjusting luminance of the lighting portion 8266 in light emission, for example.

The electric torch illustrated in FIG. 27E can light up a space around it by emitting light from the lighting portion 8266 with the switch 8264, whereby visibility of the space around it can be improved. The lighting device manufactured using the manufacturing apparatus of one embodiment of the present invention has a planar light source, so that the number of members such as a light reflecting plate can be reduced as compared to the case of using a point light source.

Note that what is illustrated in the drawings in Embodiment 11 can be freely combined with or replaced with what is described in other embodiments, as appropriate.

This application is based on Japanese Patent Application serial no. 2009-067048 filed with Japan Patent Office on Mar. 18, 2009, the entire contents of which are hereby incorporated by reference.

What is claimed is:

1. A method for manufacturing a lighting device, comprising the steps of:

transferring a substrate to a vacuum chamber having a deposition chamber comprising a container and a plate, the plate being provided inside an inner wall of the deposition chamber, the substrate being circular and having an opening portion in a central portion;

heating the container by a first heater provided in the deposition chamber;

heating the plate by a second heater provided along a periphery of the plate;

providing a mixed gas to the container;

transferring the substrate to the deposition chamber; and forming at least one of layers included in a light-emitting element over the substrate, wherein the step of transferring the substrate is performed by a substrate transfer means comprising a plurality of substrate holders, wherein each of the plurality of substrate holders has a pawl to hold the substrate from an inner side of the opening portion, wherein a temperature of the plate heated by the second heater is set to be higher by 10° C. or higher than a temperature of the substrate heated by the first heater, and wherein the light-emitting element comprises a hole-injecting layer, a hole-transporting layer, a light-emitting layer, an electron-transporting layer and an electron injecting layer.

2. The method for manufacturing a lighting device according to claim 1, wherein the mixed gas comprises an organic material and a carrier gas.

3. The method for manufacturing a lighting device according to claim 1, wherein the pawl is used as a mask when the light-emitting element is formed.

4. A method for manufacturing a lighting device, comprising the steps of:

transferring a substrate to a vacuum chamber having a deposition chamber comprising a container, a nozzle and a plate, the plate being provided inside an inner wall of the deposition chamber, and the substrate being circular and having an opening portion in a central portion;

heating the container by a first heater provided in the deposition chamber;

heating the plate by a second heater provided along a periphery of the plate;

providing a mixed gas to the container from the nozzle through a supply tube;
transferring the substrate to the deposition chamber;
forming at least one of layers included in a light-emitting element over the substrate;
transferring the substrate with the light-emitting element to a sealing chamber in the vacuum chamber; and
sealing the substrate with at least one of sealing members in the sealing chamber,
wherein the step of transferring the substrate is performed by a substrate transfer means comprising a plurality of substrate holders,
wherein each of the plurality of substrate holders has a pawl to hold the substrate from an inner side of the opening portion,
wherein a temperature of the plate heated by the second heater is set to be higher by 10° C. or higher than a temperature of the substrate heated by the first heater,
wherein the deposition chamber is placed along a circumference of a circle inside the vacuum chamber, and
wherein the light-emitting element comprises a hole-injecting layer, a hole-transporting layer, a light-emitting layer, an electron-transporting layer and an electron injecting layer.

5. The method for manufacturing a lighting device according to claim 4, wherein the mixed gas comprises an organic material and a carrier gas.

6. The method for manufacturing a lighting device according to claim 4, wherein the pawl is used as a mask when the light-emitting element is formed.

7. A method for manufacturing a lighting device, comprising the steps of:
transferring substrates to a vacuum chamber having a plurality of deposition chambers each comprising a container and a plate, the plate being provided inside each inner wall of the plurality of deposition chambers, and each of the substrates being circular and having an opening portion in a central portion;
heating the container by a first heater provided in each of the plurality of deposition chambers;
heating the plate by a second heater provided along a periphery of the plate in each of the plurality of deposition chambers;
providing a mixed gas to the container in each of the plurality of deposition chambers;
transferring the substrates to the plurality of deposition chambers;
forming at least one of layers included in a light-emitting element over each of the substrates;
transferring each of the substrates to a next deposition chamber concurrently;
transferring the substrates with the light-emitting element to a sealing chamber in the vacuum chamber; and
sealing each of the substrates with at least one of sealing members in the sealing chamber,
wherein the steps of transferring the substrates are performed by a substrate transfer means comprising a plurality of substrate holders,
wherein each of the plurality of substrate holders has a pawl to hold each of the substrates from an inner side of the opening portion,
wherein a temperature of the plate heated by the second heater is set to be higher by 10° C. or higher than a temperature of the substrates heated by the first heater,
wherein the plurality of deposition chambers is placed along a circumference of a circle inside the vacuum chamber, and
wherein the light-emitting element comprises a hole-injecting layer, a hole-transporting layer, a light-emitting layer, an electron-transporting layer and an electron injecting layer.

8. The method for manufacturing a lighting device according to claim 7, wherein the mixed gas comprises an organic material and a carrier gas.

9. The method for manufacturing a lighting device according to claim 7,
wherein one of the plurality of substrate holders is lowered to place one of the substrates on a deposition mask before the deposition treatment, and
wherein the one of the plurality of substrate holders lifts the one of the substrates from the deposition mask after the deposition treatment.

10. The method for manufacturing a lighting device according to claim 7, wherein the pawl is used as a mask when the light-emitting element is formed.

* * * * *